United States Patent
Rom et al.

(10) Patent No.: US 10,236,909 B2
(45) Date of Patent: Mar. 19, 2019

(54) BIT-ORDER MODIFICATION FOR DIFFERENT MEMORY AREAS OF A STORAGE DEVICE

(71) Applicant: SanDisk Technologies LLC, Plano, TX (US)

(72) Inventors: Rami Rom, Zichron-Yaacov (IL); Idan Goldenberg, Ramat Hasharon (IL); Alexander Bazarsky, Holon (IL); Eran Sharon, Rishon Lezion (IL); Ran Zamir, Ramat Gan (IL); Idan Alrod, Herzeliya (IL); Stella Achtenberg, Netanya (IL)

(73) Assignee: SanDisk Technologies LLC, Plano, TX (US)

( * ) Notice: Subject to any disclaimer, the term of this patent is extended or adjusted under 35 U.S.C. 154(b) by 68 days.

(21) Appl. No.: 15/475,666

(22) Filed: Mar. 31, 2017

(65) Prior Publication Data
US 2018/0287632 A1 Oct. 4, 2018

(51) Int. Cl.
| | |
|---|---|
| *H03M 13/11* | (2006.01) |
| *H03M 13/00* | (2006.01) |
| *G06F 3/06* | (2006.01) |

(52) U.S. Cl.
CPC .......... *H03M 13/11* (2013.01); *G06F 3/0619* (2013.01); *G06F 3/0655* (2013.01); *G06F 3/0688* (2013.01); *H03M 13/1125* (2013.01); *H03M 13/6566* (2013.01)

(58) Field of Classification Search
CPC ............. H03M 13/11; H03M 13/6566; H03M 13/1125; G06F 3/0619; G06F 3/0655; G06F 3/0688

USPC ....... 714/763, 718, 768, 770, 773, 786, 799, 714/6.22, 6.24, 25; 365/200, 201, 185.09
See application file for complete search history.

(56) References Cited

U.S. PATENT DOCUMENTS

| | | | | |
|---|---|---|---|---|
| 5,966,471 A | * | 10/1999 | Fisher | G06T 9/008 382/253 |
| 6,484,142 B1 | * | 11/2002 | Miyasaka | H03M 7/42 341/65 |
| 7,562,021 B2 | * | 7/2009 | Mehrotra | G10L 19/038 375/246 |
| 8,671,327 B2 | | 3/2014 | Litsyn et al. | |
| 8,677,225 B1 | * | 3/2014 | Weiner | G06F 11/1012 714/800 |
| 9,003,224 B2 | | 4/2015 | Booth et al. | |
| 9,594,627 B2 | * | 3/2017 | Kanno | G06F 11/1008 |

(Continued)

OTHER PUBLICATIONS

Cheng, W., "Memory Bus Encoding for Low Power: A Tutorial", Quality Electronic Design, IEEE, International Symposium on Mar. 26-28, 2001, pp. 199-204. (Year: 2001).*

(Continued)

*Primary Examiner* — John J Tabone, Jr.
(74) *Attorney, Agent, or Firm* — Dickinson Wright PLLC

(57) ABSTRACT

A storage device may program data differently for different memory areas of a memory. In some embodiments, the storage device may use different codebooks for different memory areas. In other embodiments, the storage device may modify bit orders differently for different memory areas. What codebook the storage device uses or what bit order modification the storage device performs for a particular memory area may depend on the bad storage locations specific to that memory area. Where different codebooks are used, optimal codebooks may be selected from a library, or codebooks may be modified based on the bad storage locations of the memory areas.

20 Claims, 27 Drawing Sheets

(56) References Cited

U.S. PATENT DOCUMENTS

| | | | |
|---|---|---|---|
| 2009/0240491 A1* | 9/2009 | Reznik | G10L 19/24 |
| | | | 704/219 |
| 2010/0277989 A1* | 11/2010 | Elfadel | G11C 29/08 |
| | | | 365/189.011 |
| 2016/0321000 A1 | 11/2016 | Tuers et al. | |
| 2016/0350177 A1* | 12/2016 | Kanno | G06F 11/1008 |
| 2017/0111061 A1* | 4/2017 | Ish-Shalom | H03M 13/098 |
| 2017/0255512 A1* | 9/2017 | Zamir | H03M 13/353 |
| 2017/0257121 A1* | 9/2017 | Kwok | G06F 11/1076 |
| 2018/0129564 A1* | 5/2018 | Ilani | G06F 3/0619 |
| 2018/0246783 A1* | 8/2018 | Avraham | G06F 11/1068 |
| 2018/0262215 A1* | 9/2018 | Sharon | H03M 13/458 |
| 2018/0287632 A1* | 10/2018 | Rom | H03M 13/11 |
| 2018/0287634 A1* | 10/2018 | Rom | H03M 13/118 |

OTHER PUBLICATIONS

Hong Kook Kim, "Adaptive Encoding of Fixed Codebook in CELP Coders," Proceedings of the 1998 IEEE International Conference on Acoustics, Speech and Signal Processing, vol. 1, pp. 149-152, May 1998. (Year: 1998).*

Bhagat et al., Vector Quantization with Codebook and Index Compression, 2014, 3rd International Conference on System Modeling & Advancement in Research Trends (SMART) College of Computing Sciences and Information Technology (CCSIT), pp. 253-258. (Year: 2014).*

Eran Sharon et al., "Constructing LDPC Codes by Error Minimization Progressive Edge Growth", IEE Transactions on Communications, vol. 56., No. 3, Mar. 2008.

* cited by examiner

BIT-ORDER MODIFICATION FOR DIFFERENT MEMORY AREAS OF A STORAGE DEVICE

BACKGROUND

Memory systems may encode and decode data with parity bits that provide redundancy and error correction capability for the data when read from the memory. Encoding schemes to encode the data may be based on the presumption that errors in the data bits when reading the data are evenly distributed across the memory. However, in actuality, the errors not usually evenly distributed, which may be due to error-prone or unreliable storage locations not being evenly distributed across the memory. Incorporating information about the unreliable storage locations into encoding and decoding schemes in order to improve decoding performance may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
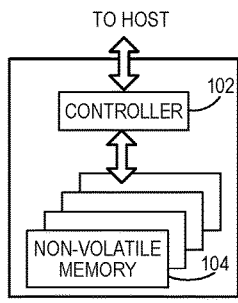
FIG. 1A is a block diagram of an example non-volatile memory system.

By way of introduction, the below embodiments relate to memory systems and methods for encoding and decoding data that includes bits stored in memory elements identified as unreliable. In one embodiment, a bit-order modification method is performed. The method includes: encoding, with at least one controller, information bits using a codebook to generate an original codeword, wherein the codeword is to be programmed into a memory area of memory of a storage device, the memory area having an associated set of bad storage locations; modifying, with the at least one controller, the original codeword to generate a modified codeword by switching a bad bit of the original codeword with a good bit of the original codeword; and programming, with the at least one controller, the modified codeword into the memory area.

In some embodiments, the bad bit of the original codeword corresponds to a check node that is one of a predetermined number of check nodes of the codebook connected to the most bad variable nodes of the codebook.

In some embodiments, the bad bit of the original codeword corresponds to a check node of the codebook that is connected to a number of bad variable nodes exceeding a threshold or within a predetermined range.

In some embodiments, the bad bit of the original codeword corresponds to a variable node participating in a minimal cycle of the codebook that is one of a predetermined number of minimal cycles having the most participating bad variable nodes.

In some embodiments, the bad bit of the original codeword corresponds to a variable node participating in a minimal cycle of the codebook that is one of a predetermined number of minimal cycles having either the smallest difference between cycle length and number of participating bad variable nodes or the largest ratio of number of participating bad variable nodes to cycle length.

In some embodiments, the bad bit of the original codeword corresponds to a variable node participating in a minimal cycle of the codebook that is one of a predetermined number of minimal cycles having either the smallest difference between number of participating bad variable nodes and total number of participating variable nodes or largest ratio of number of participating bad variable nodes to total number of participating variable nodes.

In some embodiments, modifying the original codeword includes switching good bits and bad bits across sub-codeword portions of the original codeword to generate the modified codeword. The modified codeword comprises an equalized distribution of bad bits across sub-codeword portions of the modified codeword in response to the switching of good bits and bad bits.

In some embodiments, the plurality of different memory areas includes different dies, different planes, different blocks, different pages, or different segments of the memory.

In another embodiment, a bit re-ordering configuration method is performed. The method includes: identifying, with at least one controller, bad storage location information of a memory area of a plurality of different memory areas of a memory of a storage device; identifying, with at least one controller, a codebook that the storage device is configured to use to encode data to be stored in the memory area; generating, with the at least one controller, a bit-order modification configuration for the storage device to use when programming data into the memory area based on the bad storage location information of the memory area and the codebook; and configuring a bit order modification module of the storage device with the bit-order modification configuration. The bit order modification module, upon being configured with the bit-order modification configuration, is configured to modify bit orders of codewords to be stored in the memory area according to the bit-order modification configuration.

In some embodiments, the method includes: identifying, with the at least one controller, a check node of the codebook based on numbers of bad variable nodes connected to check nodes of the codebook; identifying, with the at least one controller, at least one bit of a codeword to be stored in the memory area to switch with at least one good bit of the codeword for the bit-order modification configuration based on the identified check node.

In some embodiments, selecting the check node is based on identifying, with the at least one controller, that the number of bad variable nodes connected to the check node exceeds a threshold number.

In some embodiments, selecting the check node is based on identifying, with the at least one controller, that the check node is one of a predetermined number of check nodes connected to the most bad variable nodes.

In some embodiments, the method includes: identifying, with the at least one controller, a bad variable node of the codebook based on numbers of bad variable nodes participating in minimal cycles of the codebook, where the bad bit corresponds to the bad variable node.

In some embodiments, the method includes: identifying, with the at least one controller, a minimal cycle in which the bad variable node is participating, the identifying being based on a criterion associated with at least one of: a number of bad variable nodes participating in the minimal cycle, a length of the minimal cycle, or a total number of variable nodes participating in the minimal cycle.

In some embodiments, generating the bit-order modification configuration comprises identifying bad bits to switch with good bits across sub-codeword portions of a codeword, wherein a result of the switching of the bad bits with the good bits provides an equalized distribution of bad bits across the sub-codeword portions.

In some embodiments, the plurality of different memory areas includes different dies, different planes, different blocks, different pages, or different segments of the memory.

In another embodiment, a storage device includes a memory including a plurality of different memory areas, and a controller. The controller is configured to: generate a first codeword using a codebook, the first codeword to be stored in a first memory area of the plurality of different memory areas; change a bit order of the first codeword to generate a modified first codeword, wherein the bit order of the first codeword is changed according to a first bit modification configuration associated with the first memory area; generate a second codeword using the codebook, the second codeword to be stored in a second memory area of the plurality of different memory areas; change a bit order of the second codeword to generate a modified second codeword, wherein the bit order of the second codeword is changed according to a second bit modification configuration associated with the second memory area, and wherein the second bit modification configuration is different than the first bit modification configuration; and program the first modified codeword in the first memory area and the second modified codeword in the second memory area.

In some embodiments, the first bit modification configuration corresponds to bad storage locations of the first memory area and the second bit modification configuration corresponds to bad storage locations of the second memory area, where the bad storage locations of the first memory area are different from the bad storage locations of the second memory area.

In some embodiments, the controller is configured to maintain a respective bit modification configuration for each memory area of the plurality of different memory areas of the memory.

In some embodiments, the plurality of different memory areas includes different dies, different planes, different blocks, different pages, or different segments of the memory.

In another embodiment, a storage device includes a memory including a plurality of different memory areas; means for generating a first codeword using a codebook, the first codeword to be stored in a first memory area of the plurality of different memory areas; means for changing a bit order of the first codeword to generate a modified first codeword, wherein the bit order of the first codeword is changed according to a first bit modification configuration associated with the first memory area; means for generating a second codeword using the codebook, the second codeword to be stored in a second memory area of the plurality of different memory areas; means for changing a bit order of the second codeword to generate a modified second codeword, wherein the bit order of the second codeword is changed according to a second bit modification configuration associated with the second memory area, and wherein the second bit modification configuration is different than the first bit modification configuration; and means for programming the first modified codeword in the first memory area and the second modified codeword in the second memory area.

Other embodiments are possible, and each of the embodiments can be used alone or together in combination. Accordingly, various embodiments will now be described with reference to the attached drawings.

Embodiments

The following embodiments describe non-volatile memory systems and related methods for encoding and decoding data that includes bits stored or to be stored in memory elements identified as unreliable. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be and/or referred to as a flash memory controller) can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

The controller 102 may be configured to manage data stored in the memory 104 and communicate with a host, such as a computer or electronic device. The controller 102 may have various functionality in addition to the specific functionality described herein. For example, the controller 102 can format the memory 104 to ensure that the memory 104 is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory 104, it will communicate with the controller 102. If the host provides a logical address to which data is to be read/written, the controller 102 can convert the logical address received from the host to a physical address in the memory 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800 as non-limiting examples. In one embodiment, the memory system 100 may be a card based system, such as a secure digital (SD) or a micro secure digital (micro-SD) card. In an alternate embodiment, the system 100 may be part of an embedded memory system.

The non-volatile memory system 100 may include a single channel between the controller 102 and the non-volatile memory die(s) 104, or multiple (e.g., 2, 4, 8 or more) channels between the controller 102 and the NAND memory die(s) 104. How many channels exist may depend on various factors, such as the capabilities of the controller 102, the number of memory dies 104, and/or layout or organization of the memory elements in the memory dies 104, as non-limiting examples. In any of the embodiments described herein, more than a single channel may exist between the controller and the memory die(s)s 104, even if a single channel is shown in the drawings.

Figure 1B:
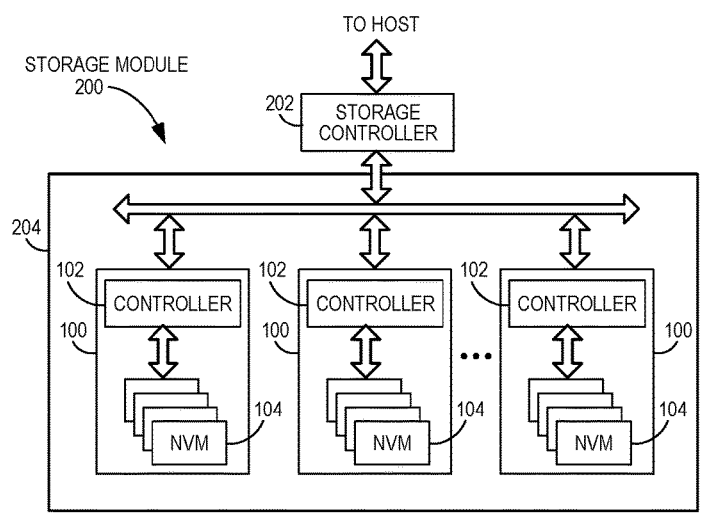
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
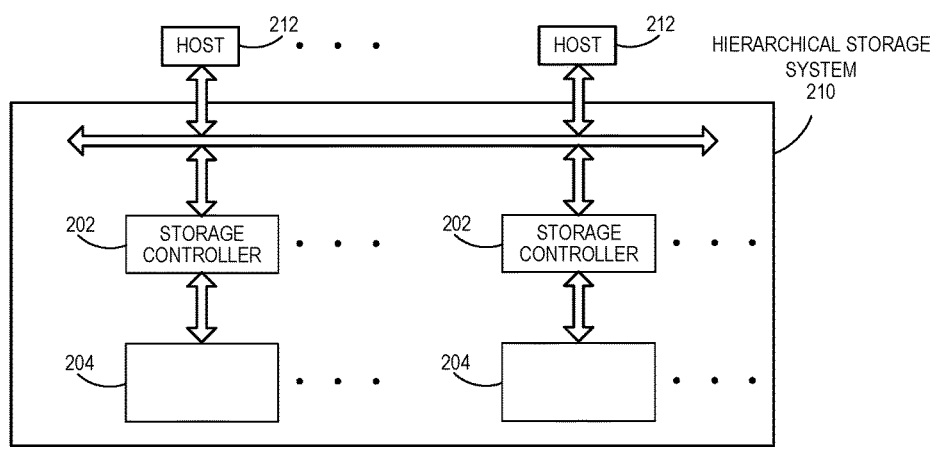
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
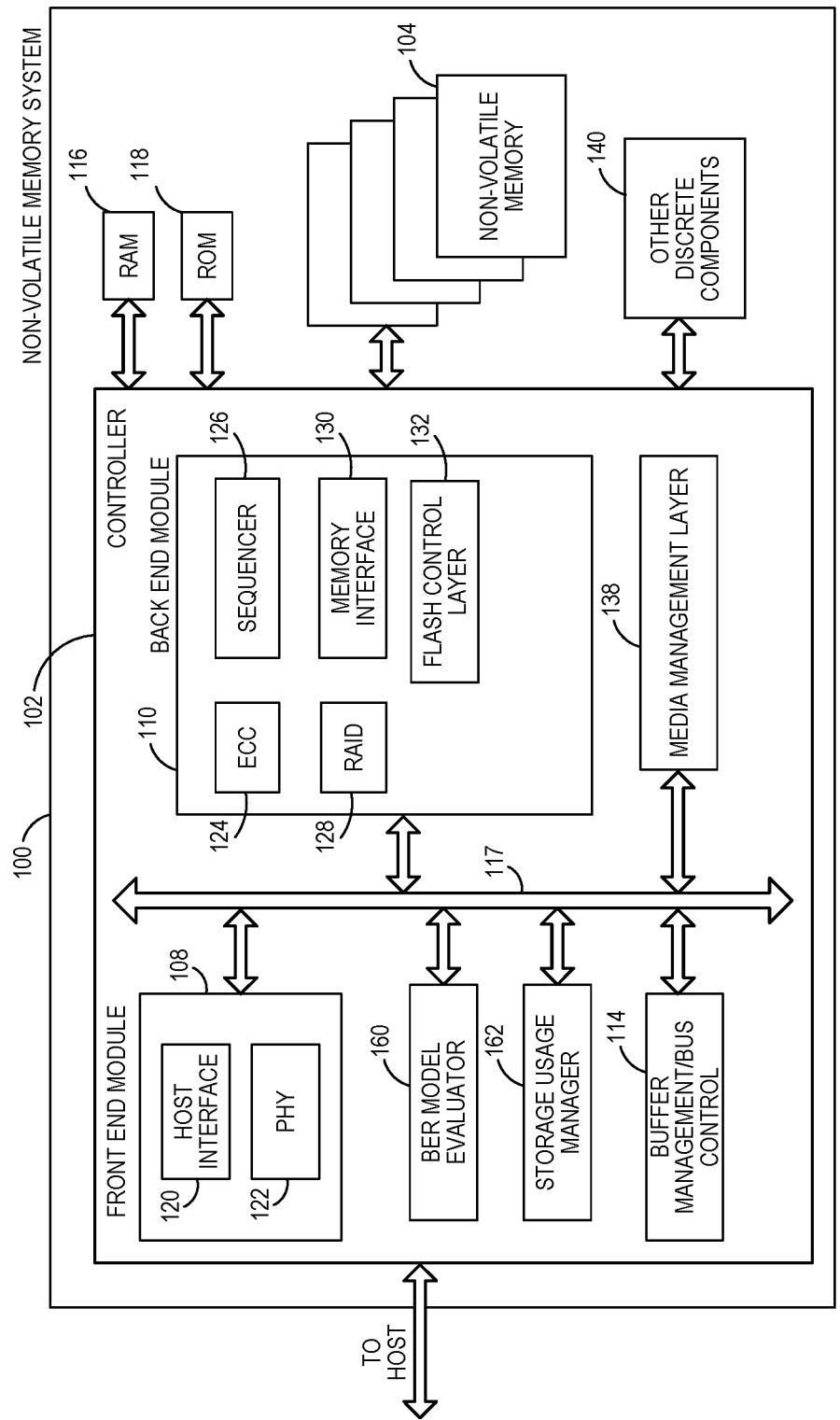
FIG. 2A is a block diagram of example components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100.

In general, as used herein, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which perform is wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
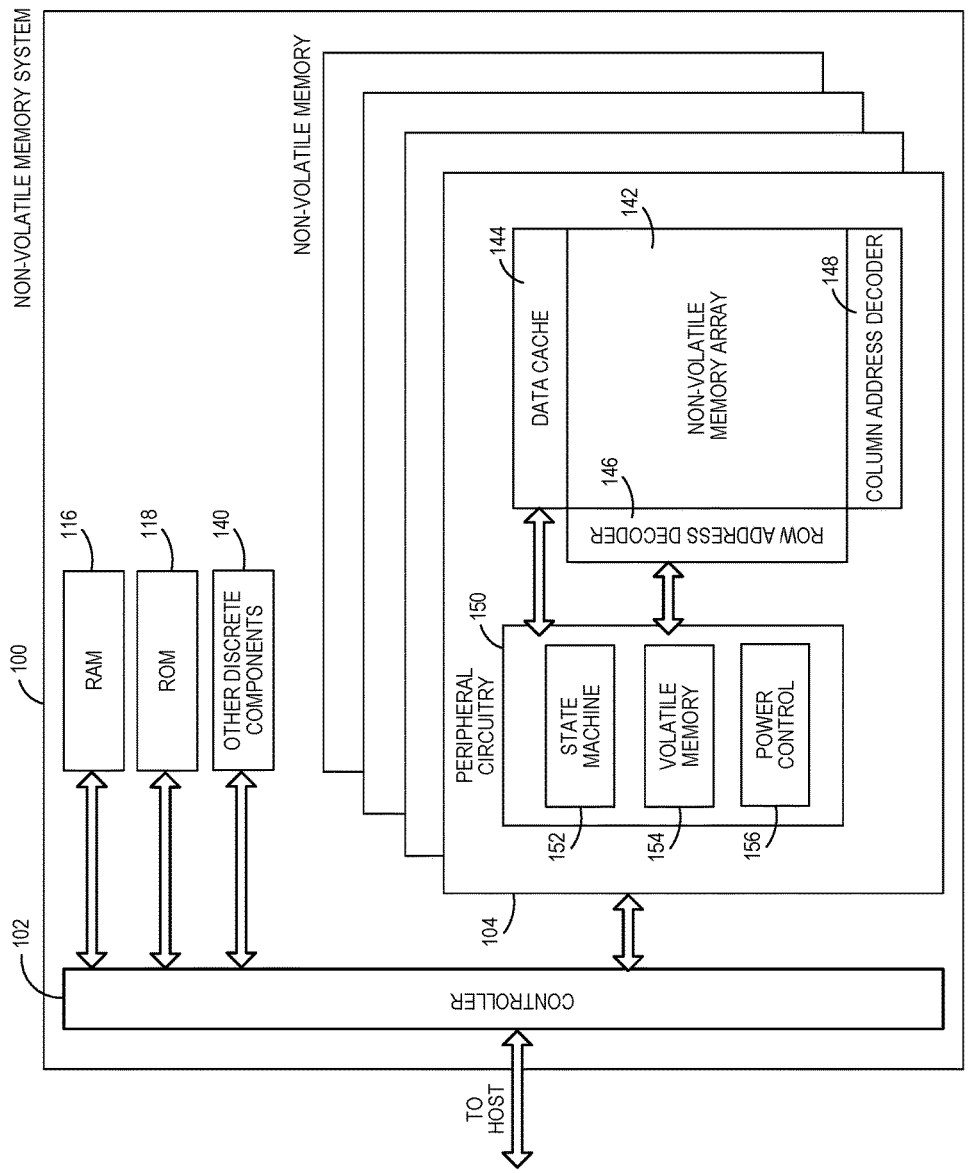
FIG. 2B is a block diagram of example components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, for some example configurations, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a memory cell. A column of memory cells may be referred to as a string. Memory cells in a string or column may be electrically connected in series. A row of memory cells may be referred to as a page. Control gates of FGTs in a page or row may be electrically connected together.

The memory array 142 may also include wordlines and bitlines connected to the memory cells. Each page of memory cells may be coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
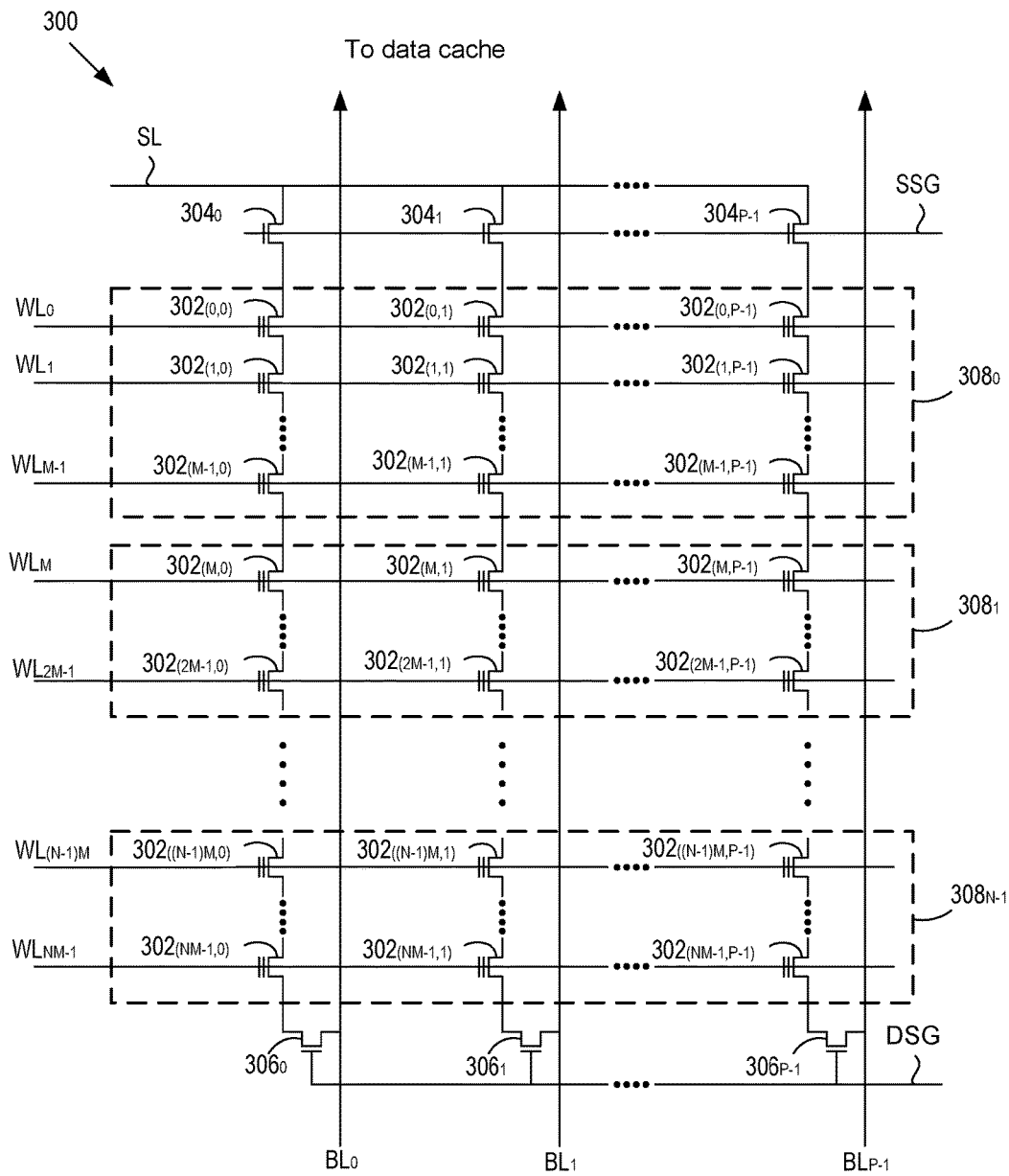
FIG. 3 is a circuit schematic diagram of an example NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1$, ..., $304_{P-1}$ may be controlled using a source select gate bias line SSG that supplies a source select gate bias voltage $V_{SSG}$ to turn on an off the source select transistors $304_0$, $304_1$, ..., $304_m$. Additionally, switching of drain select transistors $306_0$, $306_1$, ..., $306_{P-1}$ may be controlled using a drain select gate bias line DSG that supplies a drain select gate bias voltage $V_{DSG}$ to turn on and off the drain select transistors $306_0$, $306_1$, ..., $306_{P-1}$.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that may be configured to control memory operations performed on the die 104 and provide status information to the controller 102. The peripheral circuitry 150 may also include volatile memory 154. An example configuration of the volatile memory 154 may include latches, although other configurations are possible.

Figure 4:
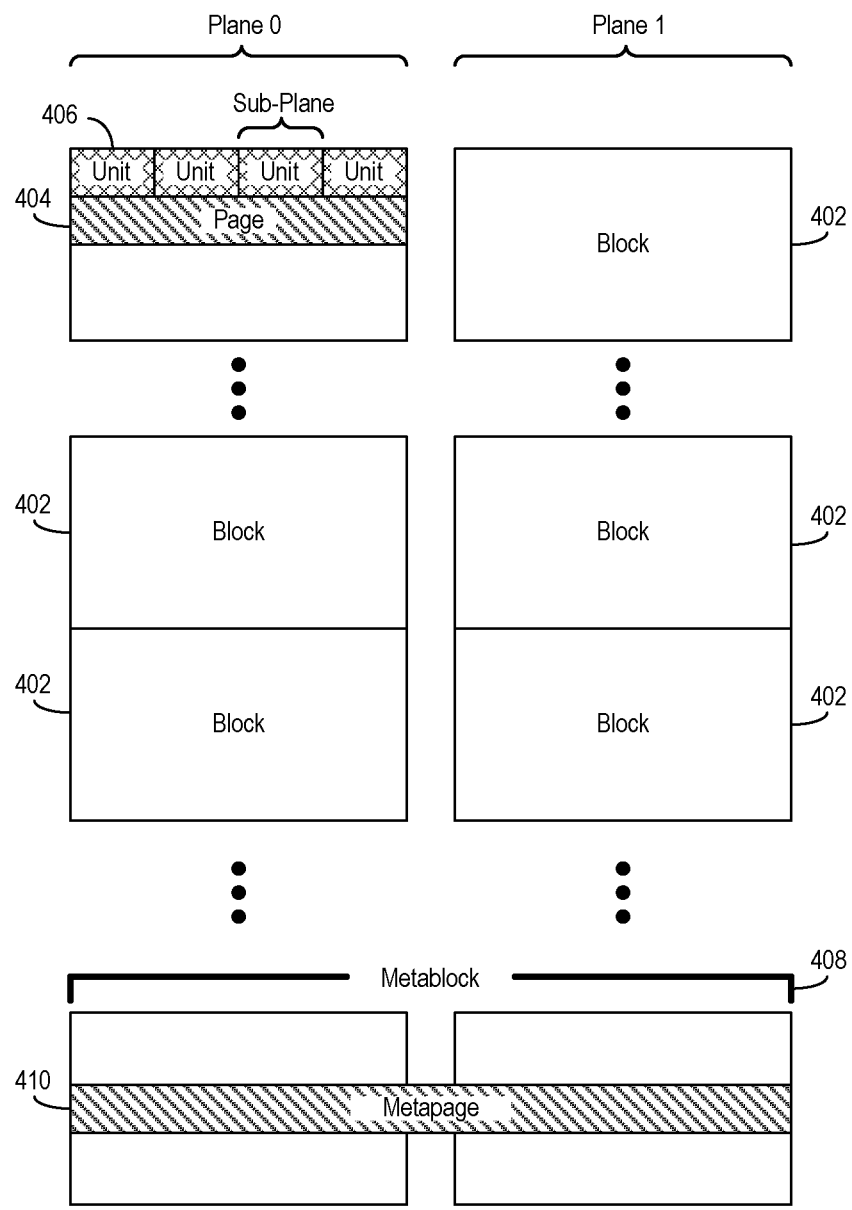
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 404 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402 or pages 404, although other configurations may be possible. A single memory array 142 may include a single plane or multiple planes. The example arrangement shown in FIG. 4 includes two planes, Plane 0 and Plane 1. Data stored in different planes may be sensed simultaneously or independently. Also, some organizational arrangements or hierarchies may include sub-planes. For example, each plane may include multiple sub-planes. In general, a sub-plane may include a "column" of units 406. The number of sub-planes within a single plane may depend on the number of units 406 within a single page 404. For example, as shown in FIG. 4, for configurations where a page 404 includes four units 406, then there may be four sub-planes within a single plane, such as four sub-planes within Plane 0 and/or four sub-planes within Plane 1.

Additionally, the organizational arrangement or hierarchy may include metablocks 408 and metapages 410. A metablock address or number identifying a metablock may be mapped to and/or correspond to a logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104.

Referring back to FIG. 3, the organizational arrangement or hierarchy may also group the bitlines (BL) into groups (otherwise referred to as columns) of bitlines (BL). Grouping the bitlines may reduce the complexity of addressing the storage locations of the array in that a column address over a page may be identified on the basis of groups (or columns) of bitlines, rather than on a bitline-by-bitline basis. In one example, a block 308 may include 16,000 bitlines (i.e., P=16,000), and every sixteen bitlines BL may be grouped together in a group (or column). Grouping the 16,000 bitlines BLs into groups or columns of sixteen may yield only 1,000 column addresses over a page, rather than 16,000 column addresses.

At some point during the lifetime of the non-volatile memory system 100, some of the memory elements of an array may store data unreliably (e.g., be determined to store data more unreliably than reliably). The memory elements may store data unreliably from the beginning of its life, such as upon being manufactured, or may initially store data reliably, but may then store data unreliably after a period of operation. There may be various reasons why these memory elements store data unreliably, such as due to open circuits, closed circuits, short circuits, endurance or retention issues (e.g., a memory element has exceeded a certain threshold number of program/erase cycles), or as a result of program disturb (when a bit is programmed into a memory element and then later, a neighboring memory element (from the same wordline or an adjacent wordline) is programmed at a higher state, causing the first memory element to be programmed at a slightly higher state). Whatever the reason, memory elements may be or become unreliable, and as a result may not reliably return data at the values at which the data was programmed.

For purposes of the present description, the term "bad" or "weak" may be used interchangeably with "unreliable." Accordingly, the term "bad" or "weak" may be used in conjunction with various storage locations or components of an array (e.g., memory elements, bit lines, bitline groups, or other groupings or zones of memory elements) to indicate those storage locations or components as unreliable and/or that are at least identified in the non-volatile memory system 100 as being unreliable or "weak". Similarly, the term "good" or "strong" may be used to refer to reliable storage locations or components and/or that are identified in the non-volatile memory system 100 as being reliable. In addition, the terms "bad," "weak," "good" and "strong" may be used in conjunction with data (including bits of data) to indicate that the data is to be stored or is being stored in reliable and unreliable storage locations, respectively.

In some situations, memory elements coupled to the same bitline may be similarly unreliable. That is, if one memory element coupled to a particular bitline is unreliable, the other memory elements that are coupled to that bitline may also be unreliable. Accordingly, the controller 102 may be configured to identify unreliable memory elements on a bitline basis. If the controller 102 identifies a bitline as unreliable, it may presume that all of the memory elements coupled to that bitline are bad, less reliable, weak, or unreliable. In addition, if the controller 102 identifies a particular memory element as unreliable, it may presume that the other memory elements coupled to the same bitline are also unreliable and identify that bitline as an unreliable or bad bitline. Also, if the controller 102 does not identify any memory elements in a bitline as being unreliable, it may identify that bitline as a reliable or good bitline.

In addition, the controller 102 may be configured to identify reliable/good and unreliable/bad columns of bitlines. For example, if the controller 102 identifies at least one bitline in a column as unreliable, it may identify all of the bitlines in that column as bad, or generally that the column is unreliable or bad. Alternatively, if the controller 102 does not identify any bitlines in a column as unreliable, it may identify that as good or reliable.

Bad storage locations may be identified and stored in one or more bad storage databases, which are represented below in the Figures by the bad storage database 1110 in FIG. 11, the bad storage database 1506 in FIGS. 15 and 18, the bad storage database 2108 in FIG. 21, and the bad storage database 2206 in FIG. 22. The controller 102 may be configured to access the bad storage location database(s) in order to identify the bad storage locations. The bad storage database(s) may identify the bad storage locations as bad columns, bad bitlines, or a combination thereof. Other ways that the bad storage database(s) may identify the bad storage locations may be possible. Additionally, the bad storage database(s) may be organized and/or managed in various ways. For example, upon manufacture of the memory system 100, storage locations that are initially identified as being bad may be identified and stored in one database, while storage locations initially identified as good but then later identified as bad after operation of the memory system 100 may be stored in another database. Alternatively, the bad storage locations that are initially bad and bad storage locations that later become bad may be combined into a single database. For example, the bad storage database may be initially populated with storage locations that are initially identified as bad upon manufacture. The controller 102 may then update the database as it identified bad storage locations upon manufacture. Various ways of organizing and managing a bad storage database are possible.

In addition, the bad storage database may be stored in any or a plurality of storage locations within the non-volatile memory system 100 and/or external to the non-volatile memory system 100. For example, a bad storage database may be stored in the array having the storage locations that the database identifies. Accordingly, for multi-die systems 100, each die 104 may store an associated bad storage database. Alternatively, one of the dies 104 may store all of the databases for all of the dies 104. Various other configurations for storing the bad storage database(s) for multi-die systems 100 may be possible. Additionally, for some example configurations, the controller 102 may be configured to load a copy of the databases(s) into RAM 116 to manage the database(s), such as during initialization and/or when reading and/or writing data to a particular die 104, and may update the versions of the database(s) stored in the non-volatile memory dies 104 as appropriate.

Some example memory systems encode and decode data without consideration for the bad storage locations of the memory dies. Such memory systems may generally consider the errors that result from reading data to be random and that such random errors are evenly distributed across the memory dies within a memory system. However, due to the existence of bad storage locations, and that the bad storage locations may be different for different memory systems, or different for different dies and/or different planes within a single memory system, the errors are generally not evenly distributed. Consequently, the same encoding and decoding schemes for different memory areas with different bad bit locations may result in different decoding outcomes, with the ECC engine 124 having to take or longer or needing more decoding iterations in order to successfully decode read data for certain store locations compared to other storage locations within the memory dies 104.

In contrast to those memory systems, the non-volatile memory system 100 of the present description may encode and decode data according to encoding and decoding schemes that take into consideration the bad storage locations of the memory dies 104. In doing so, the non-volatile memory system 100 may optimize the encoding and decoding for particular memory areas within the memory dies 104, resulting in improved decoding performance across the memory dies 104 compared to other memory systems that ignore the bad storage locations and use the same encoding and decoding schemes across all of the memory dies 104.

The non-volatile memory system 100 may take into consideration the bad storage locations of the memory dies 104 in two ways: (1) the memory system 100 may use different codebooks to encode and decode data for different memory areas having different bad storage locations, where the codebooks are optimal for the particular memory areas for which they are used (at least compared to the other codebooks used in the memory system 100); or (2) the order of the bit sequence of a given codeword is modified based on the bad storage locations where the codeword is to be stored in the memory dies 104.

Figure 5:
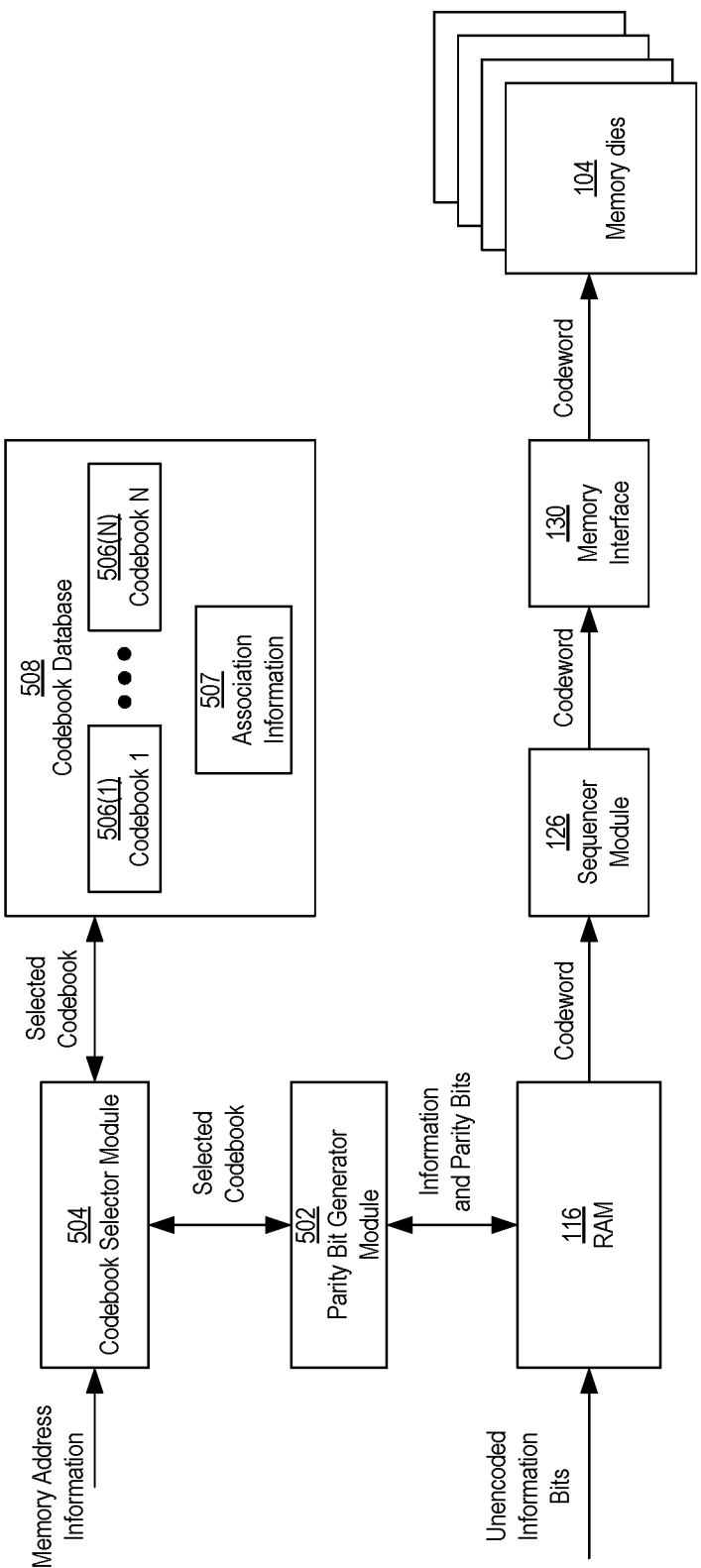
FIG. 5 is a block diagram of example modules of the controller of FIG. 2A used to perform an encoding process.

FIG. 5 shows a block diagram of components a first example embodiment of the controller 102 that may be involved in an encoding process of a write operation to write data into a non-volatile memory die 104. For some example configurations, the components other than the RAM 116 may be components of the ECC engine 124, although in other example configurations, some or all of these components may be considered components separate from the ECC engine 124. In addition to the RAM 116, the components involved in the encoding process may include a parity bit generator module 502, a codebook selector module 504, and a codebook database 508.

In general, the non-volatile memory system 100 may store data in the memory dies 104 as codewords. Each codeword may include information data (bits) and parity data (bits). The information bits may include payload data (bits), which includes the data that the host wants written to and read from the non-volatile memory dies 104. The information bits may also include header data (bits), which may include various information about the payload data, such as logical address information, the write source, when the data is written (timestamp), flag fields, reversion numbers, and scrambler seeds as non-limiting examples. The parity bits may be generated during encoding in order to detect and correct errors of the header and payload portions of the data during a decoding phase of a read operation to read the data from the non-volatile memory die 104.

Prior to the encoding process, the information bits to be written into the non-volatile memory 104 may be loaded in the RAM 116 in an unencoded (e.g., raw) format. After the information bits are loaded into the RAM 116, the parity bit generator module 502 may retrieve the information bits and generate the parity bits associated with the information bits.

The parity bit generator module 502 may be configured to generate the parity bits using a codebook or code. In a particular example configuration, the codebook may be a low-density parity-check (LDPC) codebook. For LDPC encoding, an LDPC codebook may correspond to and/or have associated with it a parity-check matrix H. The parity bit generator module 502 may be configured to generate the parity bits such that following matrix equation is satisfied:

$$H\omega = 0, \quad (1)$$

where H is the parity-check matrix and $\omega$ is the codeword including the information bits and the parity bits. The codeword $\omega$ may be formatted such the first K bits of the codeword $\omega$ are equal to an information bit sequence $\beta$ of the information bits, and the last M bits of the codeword $\omega$ are equal to the parity bit sequence $\delta$ of the parity bits. The parity bit generator module 502 may then generate the parity bits such that the following equation is satisfied:

$$H \cdot \begin{bmatrix} \beta \\ \delta \end{bmatrix} = 0. \quad (2)$$

In some LDPC encoding schemes, the parity bit generator module 502 may generate the parity bit sequence $\delta$ may be taking advantage of the sparse nature of the parity-check matrix H in accordance with LDPC.

Figure 6:
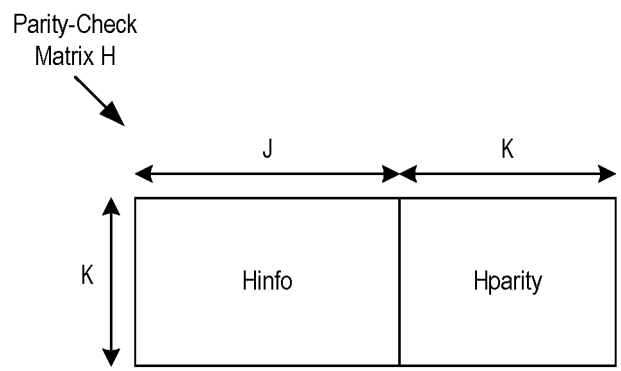
FIG. 6 is a schematic diagram of a generic layout of a parity-check matrix.

FIG. 6 shows a schematic diagram of a generic layout of a parity-check matrix H. The parity-check matrix H may include a first submatrix $H_{info}$ and a second submatrix $H_{parity}$. The first submatrix $H_{info}$ may include a J-number of columns equal to a J-number of bits in the information bit sequence $\beta$. The second submatrix $H_{parity}$ may include an K-number of columns that is equal to the K-number of bits in the parity bit sequence $\delta$. Also, as shown in FIG. 6, each of the first submatrix $H_{info}$ and the second submatrix $H_{parity}$ have an K-number of rows equal to the K-number of bits in the parity bit sequence $\delta$.

Additionally, the first submatrix $H_{info}$ and the second submatrix $H_{parity}$ are positioned relative to each other such that the last column of the first submatrix $H_{info}$ is adjacent to the first column of the second submatrix $H_{parity}$. Also, the order of the rows are common amongst the first and second submatrices $H_{info}$, $H_{parity}$. In other words, the first row of the first submatrix $H_{info}$ forms a common row with the first row of the second submatrix $H_{parity}$, and so on. Further, the elements of the first and second submatrices $H_{info}$, $H_{parity}$ (K by J elements for the first submatrix $H_{info}$ and K by K elements for the second submatrix $H_{parity}$) may each include binary "0" and "1" values. The makeup of the 0 and 1 values may be in accordance with various encoding schemes, such as LDPC or Quasi-Cyclic (QC)-LDPC codes, as examples.

Figure 7:
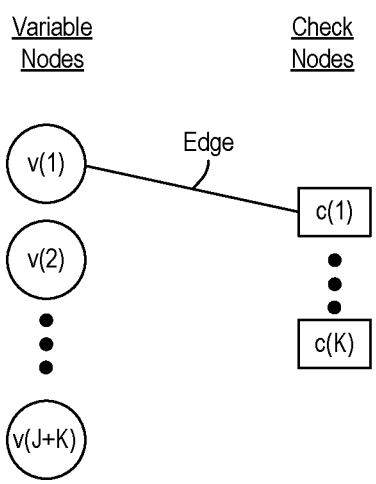
FIG. 7 is a schematic diagram of a partially completed Tanner graph corresponding to the parity-check matrix of FIG. 6.

The parity-check matrix H may have a corresponding Tanner graph. FIG. 7 shows a schematic diagram of a partially completed Tanner graph corresponding to the parity-check matrix H of FIG. 6. In general, a Tanner graph may include variable nodes (or just variables), check nodes (or just checks), and edges connecting the check nodes and the variables nodes. The number of variable nodes may be equal to the number of columns in the parity-check matrix H and the number of bits in a codeword co. Accordingly, there may be a J+K number of variable nodes v(1) to v(J+K) corresponding to the J-number of bits in the information bit sequence $\beta$ and the K-number of parity bits of the parity bit sequence $\delta$. The number of check nodes may be equal to the number of rows in the parity-check matrix H and the number of parity bits in the parity bit sequence $\delta$. Accordingly, there may be an K-number of check nodes c(1) to c(K) corresponding to the K-number of parity bits in the parity bit sequence $\delta$. A particular variable node may be connected to a particular check node via an edge or connection if the element in the parity-check matrix H corresponding to that variable node and that check node has a 1 value instead of a 0 value. For example, FIG. 7 shows an edge connecting the first variable node v(1) and the first check node c(1).

Referring back to FIG. 5, the parity bit generator module 502 may utilize a plurality or an N-number of codebooks 506(1)-506(N) to encode information bits to be stored in the memory dies 104. The codebooks 506(1)-506(N) may be different from one another. For example, the parity-check matrices corresponding to the codebooks 506(1)-506(N) may be different from each other. Two parity-check matrices may be different from each other by having at least one corresponding element with a different value. In addition or alternatively, two parity-check matrices may be different from each other by having different sizes (i.e., a different number of rows and/or a different number of columns).

Each of the codebooks 506(1)-506(N) may be associated with one or more memory areas of the memory dies 104. A memory area may be an identifiable portion with a definable size or boundary, such as one identified by the organizational arrangement or hierarchy described with reference to FIG. 4. Examples of a memory area may be a memory die, a plane of a die, sub-plane of a die, a block of a die, a page of a block (e.g., page 404 in FIG. 4), or a unit or segment of a page (e.g., 406 in FIG. 4). Otherwise stated, the N-number of codebooks 506(1)-506(N) may be assigned or associated with the storage locations of the memory dies 104 on a per-die basis, a per-plane basis, a per-block basis, a per-page basis, or a per-segment basis.

In order to encode a received information bit sequence $\beta$, the parity bit generator module 502 may communicate with the codebook selector module 504 to receive and/or identify a selected one of the codebooks 506(1)-506(N). As shown in FIG. 5, the codebook selector module 504 may receive memory address information that identifies where in the memory dies 104 codeword $\omega$, encoded from the information bit sequence $\beta$, is to be stored. In some example configurations, the memory management layer module 138 (FIG. 2A) may manage and maintain a list of available storage areas (e.g., a free block list). Using the list, the memory management layer 138 may be configured to determine where in the memory dies 104 the information bit sequence $\beta$ is to be stored. The memory management layer 138 may provide the memory address information to the codebook selector module 504.

In response to receipt of the memory address information, the codebook selector module 504 may be configured to identify a memory area corresponding to the memory address information. In addition, the codebook selector module 504 may be configured to determine which of the codebooks 506(1)-506(N) the identified memory area is associated. The codebooks 506(1)-506(N) may be stored and organized in a codebook database 508, and the codebook selector module 504 may be configured to access the codebook database 508 to obtain a selected one of the codebooks 506(1)-506(N) that is associated with the identified memory area. In some example configurations, information 507 that associates the codebooks 506(1)-506(N) with the various memory areas of the memory dies 104 may also be included and maintained in the codebook database 508. The codebook selector module 504 may use and/or access the association information 507 to select one of the codebooks 506(1)-506(N).

Upon selecting one of the codebooks 506(1)-506(N), the codebook selector module 504 may provide the selected codebook to the parity bit generator module 502. The parity bit generator module 502 may then use the selected codebook to generate the parity bits $\delta$ for the unencoded information bit sequence $\beta$ stored in the RAM 116, such as in accordance with equations (1) or (2) above. The information bits 13 and the associated parity bits $\delta$ may be combined to form the codeword $\omega$. The codeword $\omega$ stored in the RAM 116 may then be provided to the sequencer module 126, which may send the codeword $\omega$ to the memory dies 104 via the memory interface 130. The codeword $\omega$ may be stored in a storage location in the memory dies 104 identified by and/or corresponding to the memory address information that was provided to the codebook selector module 504. Although not shown in FIG. 5, the selected codebook from the database 508 used to encode the information bits $\beta$ may also be used to decode the codeword $\omega$ during a decode phase, such as when the codeword $\omega$ is read from the memory dies 104.

As previously mentioned, the different memory areas within the memory dies 104 may have different bad storage locations (e.g., the bad bitlines or bad columns may be different in number and/or located in different places amongst the different memory areas). Different codebooks may provide different decoding performance for the different memory areas due to the differing bad storage locations. As examples, encoding/decoding situations where a check node is connected to too many bad variable nodes or where too many bad variable nodes are participating in minimal or short cycles may lead to decoding performance degradation, as described in further detail below. As such, if a single codebook is used to encode and decode data written and read from all of the memory areas, the decoding performance may be better for some memory areas than others. Conversely, by utilizing multiple codebooks optimally chosen for the different memory areas, overall decoding from the memory dies 104 as a whole may be improved.

Figure 8:
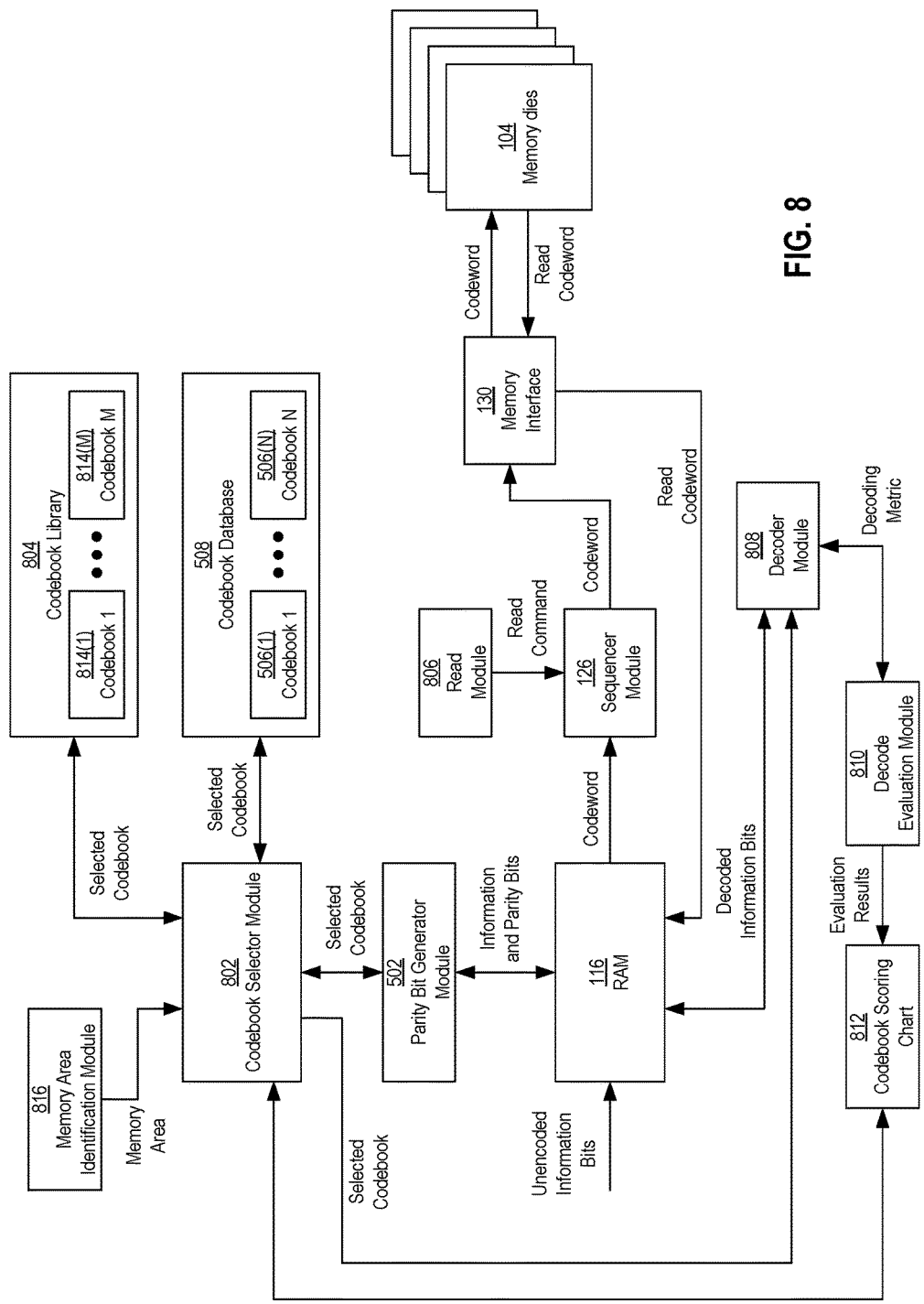
FIG. 8 is a block diagram of an example embodiment of components that may be used to evaluate and select codebooks based on decoding metrics.
Figure 9:
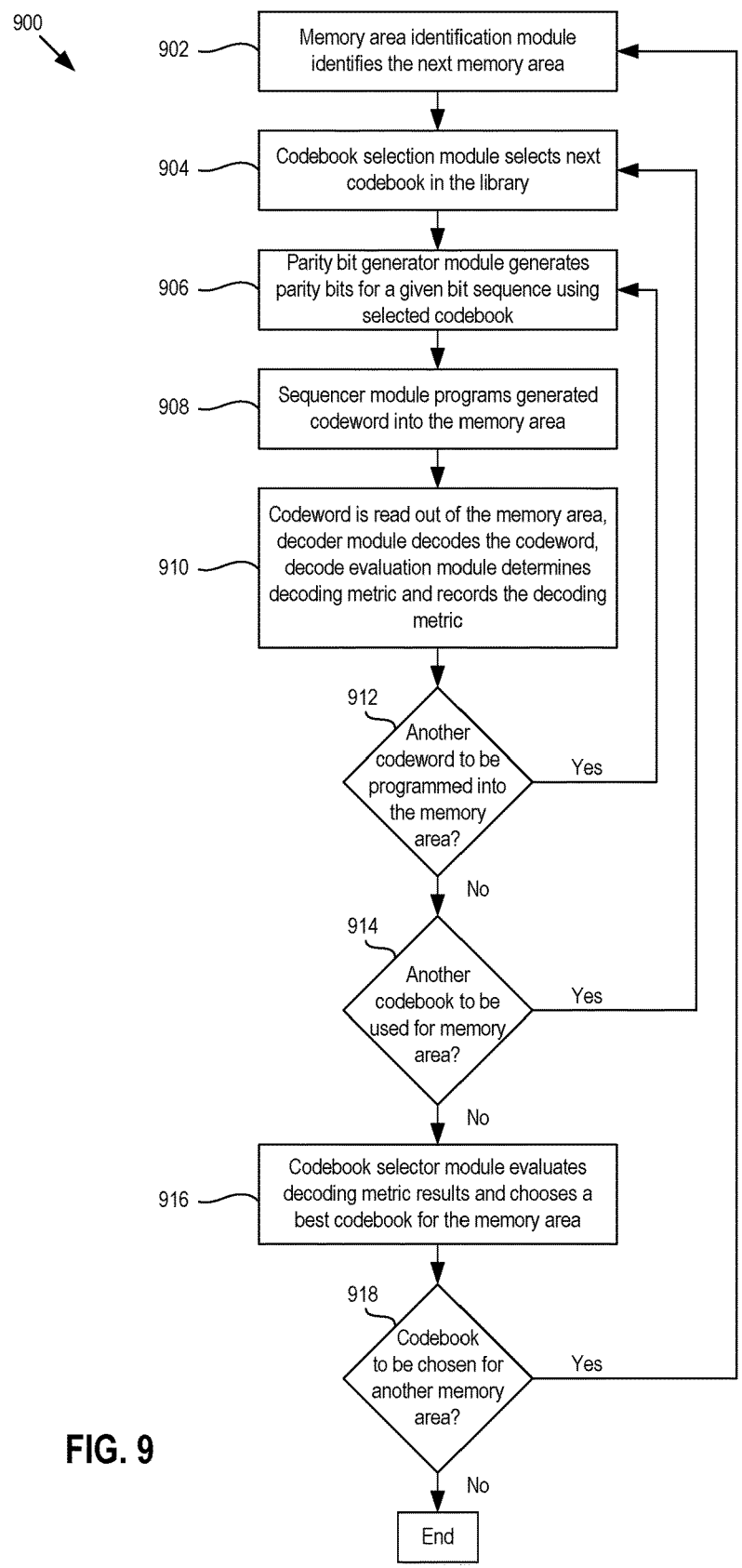
FIG. 9 is a flow chart of an example method of selecting codebooks based on decoding metrics.
Figure 10:
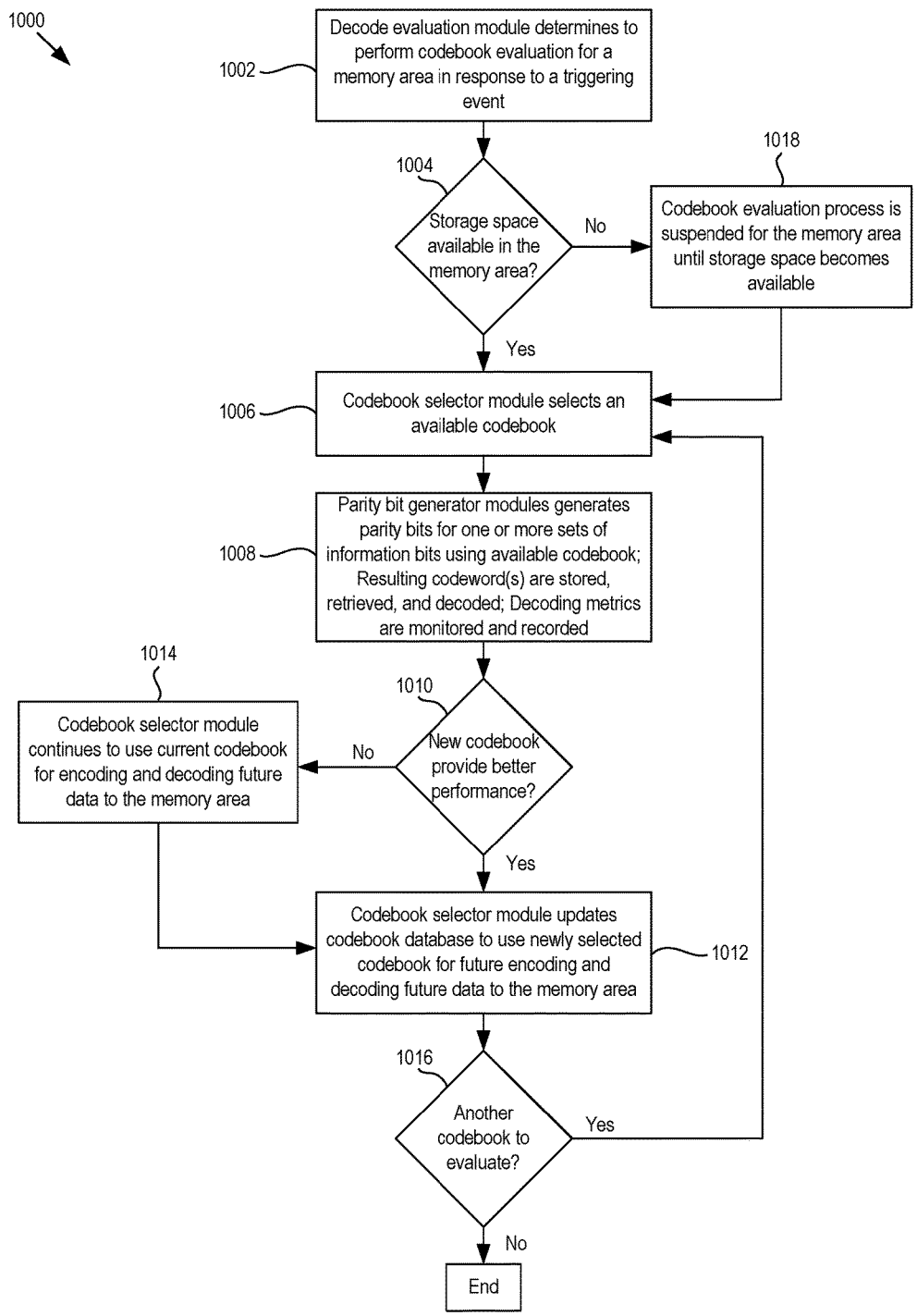
FIG. 10 is a flow chart of an example method of performing a codebook evaluation process for a particular memory area during normal operation of the memory system of FIGS. 1A-2B.

FIG. 8 below shows an example embodiment of components of the controller 102, and FIGS. 9 and 10 show flow charts of codebook identification and evaluation processes that may be used by the components of FIG. 8, to evaluate and select the N codebooks 506(1)-506(N) based on decoding metrics for the different memory areas. By analyzing decoding metrics to evaluate and select the N codebooks 506(1)-506(N), optimal codebooks may be selected for the different memory areas with different bad storage locations.

In further detail, FIG. 8 shows a block diagram of components of an example embodiment of the controller 102 that may be involved in codebook evaluation and identification processes based on decoding metrics to identify the N-number of codebooks 506(1)-506(N). For some example configurations, the components other than the RAM 116 may be components of the ECC engine 124, although in other example configurations, some or all of these components may be considered components separate from the ECC engine 124. In addition to the RAM 116, the components involved in the codebook identification process may include the parity bit generator module 502, a codebook selector module 802 (which may be the same as or different than the codebook selector module 504 of FIG. 5), a codebook library 804, a read module 806, a decoder module 808, a decode evaluation module 810, a codebook scoring chart 812, and a memory area identification module 816.

In further detail, the codebook library 804 may store and/or include an M-number of codebooks 814(1)-814(M). The number M may be the same as or larger than the number N. The M-number of codebooks 814(1)-814(M) may represent the possible or available codebooks that the memory system 100 may use for the N-number of codebooks 506(1)-506(N). In some example configurations, the codebook library 804 may be stored in memory internal to the memory system 100, although in other example configurations, the codebook library 804 may be stored external to the memory system 100, such as in an external device that may be connected to memory system 100.

In some example configurations, one or more of the M codebooks 814(1)-814(M) may be selected as one or more of the N codebooks 506(1)-506(N) for the predetermined memory areas of the memory dies 104 during a production phase. The memory area identification module 816 may identify a particular memory area for which a codebook from the codebook library 804 is to be selected. For each memory area, each of the M codebooks 814(1)-814(M) may be evaluated and a best codebook of the M codebooks 814(1)-814(M) may be chosen for that memory area. In particular, for a given memory area identified by the memory area identification module 816, the codebook selection module 802 may cycle through the M codebooks 814(1)-814(M), and for each of the codebooks 814(1)-814(M) it selects, the parity bit generator module 502 may use the selected codebook to encode at least one information bit sequence to generate an associated codeword. After the codeword is generated and programmed into the memory area, the read module 806 may issue a read command to the sequencer module 126, which in turn may issue one or more read context commands to the memory dies 104 via the memory interface 130 to have the codeword read out of the memory dies 104. In turn, the decode module 808 may decode the read codeword using the selected codebook, and the decoded information bits may be loaded into the RAM 116.

During the decoding process, the decode evaluation module 810 may determine a decoding metric for the decode process. An example decode metric may include an amount of time that the decoder module 808 took to successfully decode the data. Another decoding metric may be a number of decoding iterations that the decoder module 808 took to successfully decode the data. Other decoding metrics may be possible. The decode evaluation module 810 may record the evaluation results (e.g., the decoding metric) in the codebook scoring chart 812. After all of the M codebooks 814(1)-814(M) have been cycled through, the codebook selector module 802 may evaluate the codebook scoring results to determine the best codebook for that memory area. The best codebook may then be stored or otherwise identified in the codebook database 508 as one of the N codebooks 506(1)-506(N) to be used for encoding and decoding during operation of the memory system. The codebook identification process may be performed for all of the memory areas within the memory dies 104.

Additionally, for some example codebook identification processes, multiple program and read operations may be performed on a given memory area using the same one of the M codebooks 814(1)-814(M) in order to obtain an average decoding metric for a given codebook for that memory area. For example, where the memory is a plane of a particular die, data may be programmed into a certain percentage of the blocks in the plane using the same codebook, and an average decoding metric may be obtained by decoding the data stored in the certain percentage of the blocks. In addition or alternatively, multiple read and decoding operations may be performed on the same data to generate an average decoding metric. Various configurations may be possible.

FIG. 9 shows a flow chart of an example method 900 of selecting the N codebooks 506(1)-506(N) from the M-number of codebooks 814(1)-814(M) in the codebook library 804. At block 902, the memory area identification module 816 identifies the next memory area in the dies 104. If the example method 900 is just starting, then the next memory area may be an initial memory area that the memory area identification module 816 is configured to identify. At block 904, the codebook selection module 802 may select a next one of the M codebooks 814(1)-814(M) from the library 804. At block 906, the parity bit generator module 502 may encode a given bit sequence by generating parity bits for the given bit sequence. In some example methods, the given bit sequence may be a predetermined sequence of bits generated for a production or testing phase. At block 908, the sequencer module 126 programs a codeword including the given bit sequence and the parity bits generated at block 906 into the memory area identified at block 902.

At block 910, the codeword may be read out of the memory area and the decoder module 808 may decode the codeword using the codebook selected at block 904. Additionally, at block 910, the decode evaluation module 810 may determine a decoding metric (e.g., decoding time or number of decoding iterations) for the decoding process performed by the decoder module 808. In some example methods, the codeword may be read several times and/or the decoder module 808 may decode the codeword several times to generate an average decoding metric for decoding that particular codeword with the codebook selected at block 904. Also, at block 910, the decode evaluation module 810 may record the decoding metric in the codebook scoring chart 812.

At block 912, if another codeword is to be programmed into the memory area, then the method 900 may proceed back to block 906, where another bit sequence may be encoded with the parity bits, the resulting codeword may be programmed into the memory area at block 908, and decoding of that codeword with the codebook selected at block 904 may be evaluated at block 910. Alternatively, at block 912, if another codeword is not to be programmed into the memory area, then the method 900 may proceed to block 914, where the codebook selector module 802 may determine whether there is another or next codebook in the codebook library 804 to be evaluated. If so, then the method 900 may proceed back to block 904, and the codebook selector module 802 may select the next codebook from the codebook library 804. If not, then at block 916, the codebook selector module 802 may evaluate the decoding metric results for the codebooks selected from the library 804 to encode and decode data programmed into and read from memory area and select a best or optimal codebook for that memory area. For example, the codebook selector module 802 may select the codebook that yielded the shorted decoding or the fewest number of iterations to successfully decode the data.

At block 918, the memory area identification module 816 may determine whether there is another memory area of the memory dies 104 for which a codebook is to be identified or chosen. If so, then the method 900 may proceed back to block 902, where the memory area identification module 902 may identify a next memory area and the method 900 may repeat. Alternatively, if there are no more memory areas for which a codebook is to be identified, then the method 900 may end.

Referring back to FIG. 8, for some example configurations, the codebook selector module 802 may be configured to select a different codebook to encode a decode data for a particular memory area from the one it is currently using based on its normal operation of the memory system 100 (e.g., after the production phase when it is reading and writing data in response to host commands). To illustrate, as part of read and write operations during normal operation, the ECC engine 124 may encode and decode data for a particular memory area using one of the N codebooks 506(1)-506(N), which may have been identified during a codebook identification process of a production phase, as previously described. During a read operation, the read module 806 may request one or more codewords to be read from the particular memory area, such as in response to a host read request. Prior to sending the requested data back to the host, the encoded data that is read may be decoded by the decoder module 808. The decode evaluation module 810 may be configured to monitor the decoding operations and determine decoding metrics for the decoding operations. If the decode evaluation module 810 identifies that a decoding metric for a decoding operation has exceeded a threshold (e.g., a decoding time has exceeded a time threshold or a number of decoding iterations has exceeded an iteration threshold), the decode evaluation module 810 may trigger the codebook selector module 802 to determine if there is a better codebook available to use for the memory area for future read and write operations. In response, the components in FIG. 8 may perform a codebook identification process to determine if there is an available codebook that provides better decoding performance than the one currently being used. The codebooks analyzed may be the N codebooks 506(1)-506(N) in the codebook database 508, the M codebooks 814(1)-814(M) in the codebook library 804, or some combination thereof.

FIG. 10 is a flow chart of an example method 1000 of performing a codebook evaluation process for a particular memory area based on normal operation of the memory system 100. At block 1002, the decode evaluation module 810 may determine to perform the codebook evaluation process in response to detection of a triggering event. The triggering event may be that a threshold number of decode operations has exceeded a threshold amount of decoding time, a threshold number of decode operations has exceeded a threshold number of decoding iterations, or that an average decoding time or an average amount of decoding iterations to decode data from that memory area has exceeded a threshold. Other triggering events associated with a decoding metric may be possible.

At block 1004, the codebook selector module 802 may determine if there is storage space available within the memory area to read and write data for evaluation of a new codebook for the memory area. To illustrate, suppose the memory area is a plane of one of the memory dies 104. The codebook selector module 802 may check if there are any free blocks within that plane that it can use to perform the codebook evaluation process. If there is, then at block 1006, the codebook selector module 802 may select an available codebook different from the one presently used to encode and decode data for the particular memory area. The available codebook may be one of the N codebooks 506(1)-506 (N) in the codebook database 508 or one of the M codebooks 814(1)-814(M) in the codebook library 804. At block 1008, the parity bit generator module 502 may generate one or more sets of parity bits for one or more sets of information bits to be encoded and stored in the available storage space within the memory area, the resulting one or more codewords may be stored in the available storage space, the one or more codewords may be decoded by the decoder module 808, and the decode evaluation module 810 may monitor and record the decoding metrics of the decoding processes.

At block 1010, the codebook selector module 802 may determine if the codebook selected at block 1006 provides better decoding metrics than the codebook currently used for the memory area, such as by comparing the decoding metrics obtained at block 1008 with decoding metrics previously obtained when writing and reading host data to the memory area. If so, then at block 1012, the codebook selector module 802 may update the codebook database 508 to indicate that the new codebook is to be used for future encoding and decoding for that memory area. If not, then at block 1014, the codebook selector module 802 may determine to continue to use the codebook that it was previously using for that memory area.

At block 1016, the codebook selector module 802 may determine if there is another available codebook to evaluate. If so, then the method 1000 may proceed back to block 1006, and the codebook selector module 802 may select a next codebook. The parity bit generator module 502 may then generate parity bits for additional information bits using the next codebook, and the decode evaluation module 810 may monitor and record the decoding metrics as the resulting codebooks are decoded by the decoder module 808. Alternatively, at block 1016, if there is not another available codebook, then the method may end.

Referring back to block 1004, if there is not currently any available storage space within the memory area to evaluate a new codebook for the memory area, then at block 1018 the codebook evaluation process may be suspended until storage space becomes available, such as if one or more blocks are erased and become free. When that time happens and storage space becomes available, then the method 1000 may proceed from block 1018 to block 1006, and the codebook selector module 802 may select an available codebook for the codebook evaluation process for the memory area.

Instead of analyzing decoding metrics provided by different codebooks, other example embodiments of the memory system 100 may directly use the bad storage locations of the memory dies 104 to evaluate and score and/or rank the different codebooks for each of the memory areas. FIG. 11 shows a block diagram of components of an example embodiment of the controller 102 that may be involved in codebook evaluation and identification processes that may directly use bad storage locations of a given memory area in order to score various codebooks for the given memory area. For some example configurations, the components may be components of the ECC engine 124, although in other example configurations, some or all of these components may be considered components separate from the ECC engine 124. The components may include a codebook scoring module 1102, a memory area identification module 1104, a codebook library 1106 storing an M-number of codebooks 1108(1)-1108(M) (which may be the same as or similar to the codebook library 804 storing the M-number of codebooks 814(1)-814(M) of FIG. 8), and a bad storage database 1110, which may identify bad storage locations for the various memory areas of the memory dies 104, as previously described.

Figure 12A:
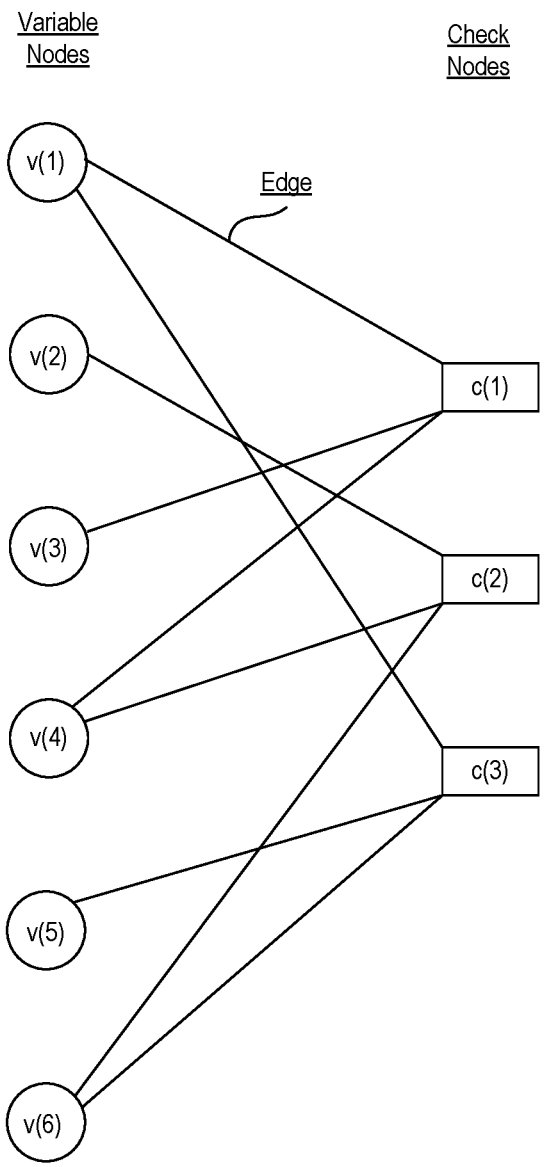
FIG. 12A is a schematic diagram of a bipartite graph of a low density parity check code.
Figure 12B:
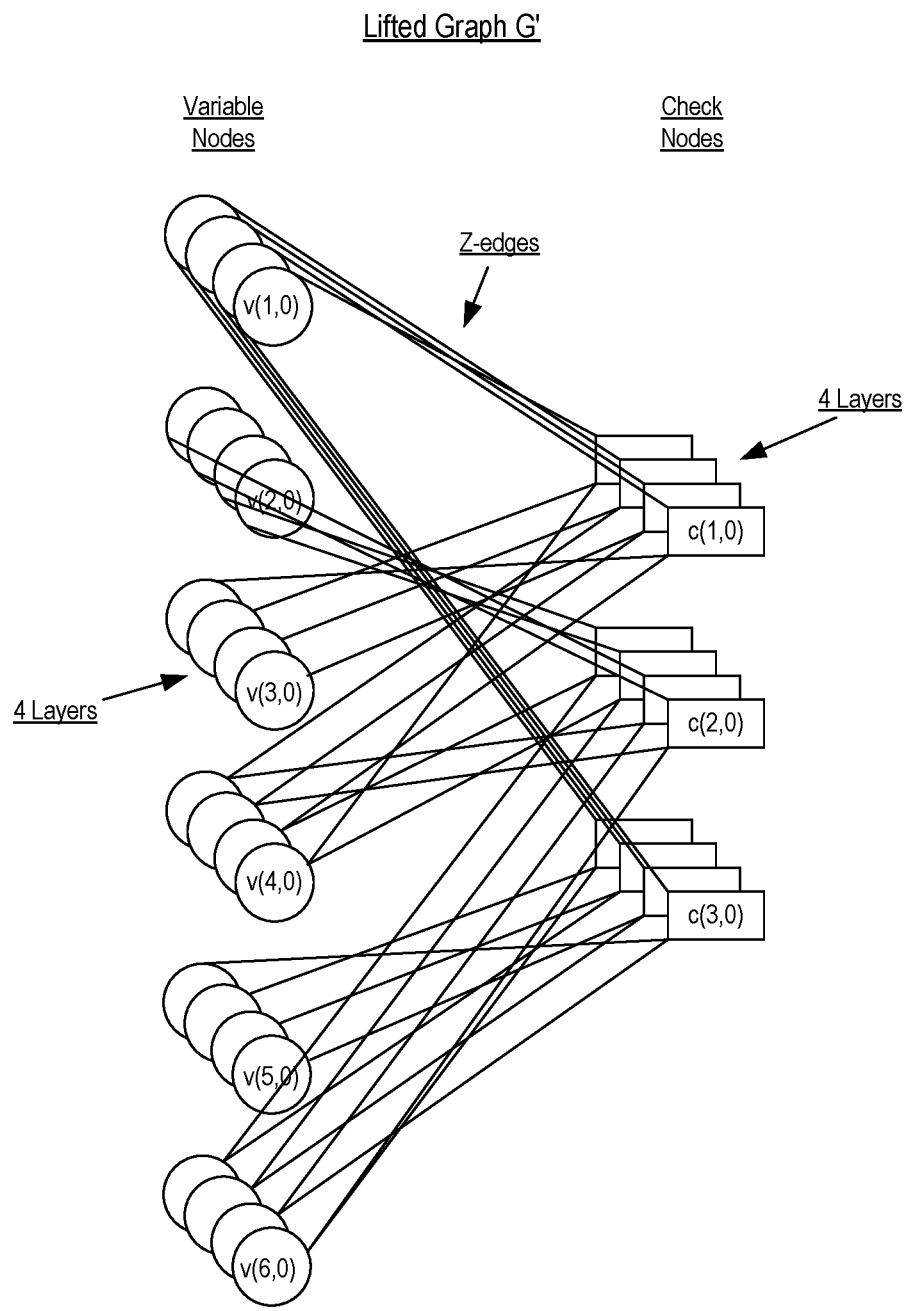
FIG. 12B is a schematic diagram of a lifted graph corresponding to the bipartite graph of FIG. 12A.

In further detail, for a given memory area, the codebook scoring module 1102 may be configured to assign a score to each of the M codebooks 1108(1)-1108(M) in the library 1106. A score assigned to a particular codebook may be based on a lifted graph structure associated with the codebook. Reference is made to FIGS. 12A and 12B to describe lifted graph structures in detail. FIG. 12A shows a schematic diagram of a bipartite graph G of a LDPC code and FIG. 12B shows a schematic diagram of a corresponding lifted graph G' of the LDPC code.

Referring to FIG. 12A, the bipartite graph G has set of six variable nodes v(1)-v(6) and a set of three check nodes v(1)-v(3). As shown, various edges connect the six variable nodes v(1)-v(6) with the three check nodes c(1)-c(3) in a particular configuration. Referring to FIG. 12B, the corresponding lifted graph G' has the same number of variable nodes (six) and the same number of check nodes (three). However, each of the variable nodes and each of the check nodes has a Z-number of layers. The lifted graph G' shown in FIG. 12B has four layers (i.e., Z=4). Each layer of each variable node may be indicated by the term v(i,k), where i is an index from 1 to L that identifies the ith variable node (L being the number of variable nodes associated with the codebook), and k is an index from 0 to Z−1 that identifies the kth layer of the ith variable node. Similarly, each layer of each check node may be indicated by the term c(n,q), where n is an index from 1 to K that identifies the nth check node (K being the number of check nodes associated with the codebook), and q is an index from 0 to Z−1 that identifies the qth layer of the nth check node. FIG. 12B shows the first layers of the six variable nodes indicated by v(1,0), v(2,0), v(3,0), v(4,0), v(5,0), and v(6,0), and the first layers of each of the three check nodes indicated by c(1,0), c(2,0), and c(3,0).

Layers of the variable nodes may be connected to the layers of the check nodes. An edge connecting a particular layer of a particular variable node with a particular layer of a particular check node may be referred to as a Z-edge. Which of the variable node layers and check node layers that each Z-edge is connected to may depend on the edge connections of the corresponding bipartite graph G and a shift value p. In particular, for a given edge in the bipartite graph G that connects a given ith variable node v(i) with a given nth check node c(n), a corresponding set of Z-edges in the corresponding lifted graph G' connects the ith variable node layers v(i,0) to v(i,Z−1) with the nth check node layers c(n,0) to c(n,Z−1). For example, referring to FIG. 12A, an edge connects the first variable v(1) with the first check node c(1). Correspondingly, a set of four Z-edges connects the four layers of the first variable node v(1,0) to v(1,3) with the four layers of the first check node c(1,0) to c(1,3). Which variable node layer and which check node layer are connected together by a Z-edge may depend on the shift value p associated with the given set of Z-edges. The shift value p, which may range from 0 to Z−1, may indicate a number of check node layers a given Z-edge is shifted relative to a variable node layer to which the given Z-edge is connected. The shift is circular and may be a right-shift or a left-shift. In the example lifted graph G' of FIG. 12B, the shift is a right-shift and the shift value is 1 (i.e., p=1). As such, a set of four Z-edges connecting the four layers of the first variable node v(1,0) to v(1,Z−1) with the four layers of the first check node c(1,0) to c(1;Z−1) may include a first edge connecting the first layer of the first variable node v(1,0) to the fourth layer of the first check node c(1,3), a second edge connecting the second layer of the first variable node v(1,1) to the first layer of the first check node c(1,0), a third edge connecting the third layer of the first variable node v(1,2) to the second layer of the first check node c(1,1), and a fourth edge connecting the fourth layer of the first variable node v(1,3) to the third layer of the first check node c(1,2). Other sets of Z-edges may connect various layers of the various variable nodes with various layers of the various check nodes accordingly. Additionally, each set of Z-edges may have an associated shift value p, and the shift values may be the same or different from one another.

Referring back to FIG. 11, the lifted attributes of a given codebook may be used to determine a score for the codebook. In particular, each of the M codebooks 1108(1)-1108(M) may be in their lifted form or may include associated lifted information. For example, each codebook 1108 may include with it an associated number of layers Z and a shift value p for each of the edges. The codebook scoring module 1102 may be configured to access each of the codebooks 1108(1)-1108(M) and calculate a corresponding score $R_{CB(m)}$ for each mth codebook it accesses using the following mathematical equation:

$$R_{CB(m)} = \sum_{i=1}^{L} \sum_{\substack{j \, s.t. \, v(i) \, is \\ connected \, to \, c(j)}} \sum_{q=0}^{Z-1} \sum_{(d,\tau)} \hat{W}_{(d,\tau)}^{v(i,0) \to c(j,q)} \quad (3)$$

-continued $$P_{CS}^{\varepsilon_i}\left(\frac{(d+1)Z}{2GCD(q-p,Z)}, \frac{(\tau-2)Z}{GCD(q-p,Z)}\right).$$

For simplicity, the $\hat{W}$ term is referred to as the first scoring term, and the $P_{CS}^{\varepsilon_i}$ term is referred to as the second scoring term. Additionally, the four summations are referenced from right to left, or inner-most to outer-most, including a first summation $\Sigma_{(d,\tau)}$, a second summation $$\sum_{q=0}^{Z-1},$$

a third summation $$\sum_{\substack{j \, s.t. \, v(i) \, is \\ connected \, to \, c(j)}},$$

and a fourth summation $$\sum_{i=1}^{L}.$$

Calculation of the score $R_{CB(m)}$ with reference to the summations is described in further detail below. The following terms and definitions are provided in order to describe in detail the scoring equation (3) and how the first and second scoring terms may be calculated.

An extrinsic check node to a set of variable nodes is a check node that is singly connected to the set of variable nodes.

An intrinsic check node to a set of variable nodes is a check node that is connected to the set of variable nodes at least twice.

An extrinsic message degree (EMD) of a set of variable nodes is the number of extrinsic check nodes connected to the set of variable nodes.

A set of variable nodes forms or participates in a cycle if there exists a path passing through all of the variable nodes in the set to itself without traversing an edge twice.

A set of variable nodes forms a minimal cycle if: (1) it forms a cycle, and (2) no subset of the variable nodes forms a cycle.

A cycle set with the parameters (d,ω,τ) (otherwise referred to as a (d,ω,τ) cycle set), is a set of d variable nodes that form a minimal cycle and has ω intrinsic check nodes and τ extrinsic check nodes.

For a given (d,ω,τ) cycle set, the number of intrinsic check nodes ω is equal to d (ω=d). Accordingly, a (d,ω,τ) cycle set is the same as a (d,d,τ) cycle set, which is denoted as a (d,τ) cycle set.

A stopping set S is a subset of the set of variable nodes V making up the bipartite graph such that no extrinsic check nodes are connected to the stopping set S.

A set of variable nodes forms a minimal cycle with respect to an edge e if: (1) it forms a cycle that contains the edge e, and (2) no subset of the variable nodes forms a cycle that contains the edge e.

A $(d,\omega,\tau)$ e-cycle set is a set of d variable nodes that forms a minimal cycle with respect to an edge e and has $\omega$ intrinsic check nodes and t extrinsic check nodes.

Calculation of the first and second scoring terms is now described with reference to these defined terms.

The first scoring term, $\hat{W}_{(d,\tau)}^{v(i,0) \to c(j,q)}$, is the number of minimal paths from the first layer of the ith variable node v(i,0) to the qth layer of the jth check node of length d and extrinsic message degree (EMD) $\tau$.

The second scoring term, $P_{CS}^{\varepsilon_i}(d, \tau)$, denotes an upper bound on an expected contribution to a decoding error probability (alternatively referred to as a block error probability or decoding failure probability) of a given $(d,\tau)$ cycle set, and the term $P_{CS}^{\varepsilon_i}(d,\omega,\tau)$ denotes an upper bound on an expected contribution to a decoding errory probability of a given $(d,\omega,\tau)$ e-cycle set over binary erasure channels with bit erasure probability $\varepsilon_i$.

Accordingly, for a given ith variable node v(i) that is connected to a given jth check node c(j), and for a particular qth layer of the jth check node, a first value may be calculated, the first value being the expected contribution to a decoding error probability of a given $(d,\tau)$ cycle set, $P_{CS}^{\varepsilon_i}(d,\tau)$ (i.e., the second scoring term), multiplied by the number of minimal paths from the first layer of the ith variable node v(i,0) to the qth layer of the jth check node of length d and extrinsic message degree (EMD) $\tau$, $\hat{W}_{(d,\tau)}^{v(i,0) \to c(j,q)}$ (i.e., the first scoring term). As indicated by the first summation, the first scoring term, first values may determined for all possible minimal cycles of length d and extrinsic message degree $\tau$, and the first values may be summed together to determine a second value. In addition, as indicated by the second summation, a second value may be calculated for each qth layer, from q=0 to Z−1, and the second values may be summed together to generate a third value for the given ith variable node v(i) connected to the given jth check node c(j). In addition, as indicated by the third summation, a third value may be generated for each jth check node c(j) that is connected to the given ith variable node v(i), and the plurality of third values may be summed together to generate a fourth value. Further, as indicated by the fourth summation, a fourth value may be generated for each ith variable node v(i) for a given mth codebook, and the fourth values are summed together to generate the codebook scoring $R_{CB(m)}$ for the given mth codebook.

Calculation of the first scoring term, $\hat{W}_{(d,\tau)}^{v(i,0) \to c(j,q)}$, and the second scoring term, $P_{CS}^{\varepsilon}(d,\tau)$, are now described in detail.

The first scoring term, $\hat{W}_{(d,\tau)}^{v(i,0) \to c(j,q)}$, is calculated using an enumeration algorithm according to the following terms:

The inputs to the enumeration algorithm are: (1) the lifted graph G' for which the first scoring term is being calculated, (2) the index i for the ith variable node $v_i$ for which the first scoring term is being calculated, (3) a vector of variable node degrees $\underline{d}_v$ corresponding to a degrees spectrum $\Lambda(x)$, which is defined as:

$$\Lambda(x) = \Sigma_{g=2}^{d_v} \Lambda_g x^g, \quad (4)$$

where $\Lambda_g$ is the number of degree-g variable nodes, and $d_v$ is the maximal variable degree.

The output of the enumeration algorithm is a data structure W containing for every possible check node $c_j$, the spectrum of minimal paths from the ith variable node $v_i$ to the jth check node $c_j$, denoted as $W(c_j)$.

D is a data structure that stores the depth of the graph G' spanned from the ith variable node $v_i$.

$T_v$ and $T_c$ store the tiers of active variable nodes and check nodes, respectively, at depth D. An active node n is a node for which the path from the ith variable node $v_i$ to node n may lead to a minimal e-cycle set. $T_v^{aprx}$ is a temporary storage in the process of generating $T_v$.

Emd(n) and $Emd^{D-2}$(n) store the minimal EMD of a path from the ith variable node $v_i$ to node n among all paths from $v_i$ to node n up to tiers D and D−2, respectively.

Mult($v_{i'}$) and Mult($v_{i'}$)$^{D-2}$ store the multiplicity of the minimal paths from the ith variable node $v_i$ to the i'th variable node $v_{i'}$, at tiers D and D−2, respectively.

Parent(n) stores the parents of a node n in tier D along the minimal paths from the ith variable node $v_i$ to the node n. For a set of nodes P, Parent(P) denotes the union set of all the parents of nodes in P.

$W(c_j)$ stores a set of triplets of the form $(d,\tau,m)$ for logging the depth, EMD and multiplicity of minimal paths from the ith variable node $v_i$ to the jth check node $c_j$, i.e., paths that may lead to a minimal e-cycle set of the edge e connecting the ith variable node $v_i$ to the jth check node $c_j$. The triplet $(d,\tau,m)$ means that there are m paths from the ith variable node $v_i$ to the jth check node $c_j$ with depth d and EMD $\tau$.

Given these defined terms, the enumeration algorithm for calculating the first scoring term is calculated according to the following pseudocoele:

```
W = CycleSetEnumerator(G',i,d_v)
% span a tree from v until there are no active variable nodes
% and span for each visited check log the depth, EMD and
% multiplicity of all paths leading to a minimal e-cycle set
% initialization
Emd(v_i) ← d_{v_i};          Mult(v_i) ← 1;        Parent(v_i) ← ∅;
∀_{i' ≠ i} ∈ {1,..., N}      Emd(v_{i'}) ← ∞;
∀_{j'} ∈ {1,..., M}          Emd(v_{j'}) ← ∞;      W(c_{j'}) ← ∅ ;
D ← 0;  T_v ← {v_i}
While (|T_v| ≠ 0)
    D ← D + 1
    % Expand tier D of check nodes:
    T_c ← ∅
    for all v_{i'} ∈ T_v
        for all c_{j'} ∈ Neighbor(v_{i'},G') \ Parent(v_{i'})
            if Emd(v_{i'}) < Emd(c_{j'})
                % First length D minimal path from v_i to c_{j'} found
                Emd(c_{j'}) ← Emd(v_{i'});
                Parent(c_{j'}) ← {v_{i'}};
                W(c_{j'}) ← W(c_{j'}) ⊎ (D, Emd(c_{j'}), Mult(v_{i'}));
                T_c ← T_c ∪ {c_{j'}};
            else if (Emd(v_{i'}) = Emd(c_{j'})) & (c_{j'} ∈ T_c)
                % Another length D minimal path from v_i to c_{j'} found
                Parent (c_{j'} ← Parent(c_{j'}) ∪ {v_{i'}};
                (D,τ,m) ← {(d,τ,m) ∈ W (c_{j'}) | d = D};
                W(c_{j'}) ← W(c_{j'}) ⊎ (D,τ,m + Mult(v_{i'}));
            end
        end
    end
    D ← D + 1
    % Expand tier D of variable nodes:
    T_v^{Aprx} ← ∅  T_v ← ∅;
    ∀_{i'} ∈ {1,..., N}:
        Parent(v_{i'}) ← ∅                  Emd^{D-2}(v_{i'}) ← Emd(v_{i'});
        Mult^{D-2} (v_{i'}) ← Mult(v_{i'});  Mult(v_{i'}) ← 0;
    % Generate a list of possible active variable nodes in tier D:
    for all c_{j'} ∈ T_c
        for all v_{i'} ∈ Neighbor(c_{j'}, G') \ Parent(c_{j'})
            Parent(v_{i'}) ← Parent(v_{i'}) ∪ {c_{j'}};
            T_v^{Aprx} ← T_v^{Aprx} ∪ {v_{i'}};
        end
    end
    % Filter the list leaving only true active variable nodes:
    for all v_{i'} ∈ T_v^{Aprx}
        P ← Parent(v_{i'});
        for all v_{i''} ∈ Parent(P)
            S ← P ∩ Neighbor(v_{i''},G');
            if (Emd^{D-2}(v_{i''}) + d_{v_{i'}} − 2|S| < Emd(v_{i'}))
                % First length D minimal path from v_i to v_{i'} found
                Emd(v_{i'}) ← Emd^{D-2}(v_{i''}) + d_{v_{i'}} − 2|S|;
```

-continued

```
        Mult(v_i') ← Mult^{D-2}(v_i'');
        Parent(v_i') ← S;
        T_v ← T_v ∪ {v_i'};
      else if (Emd^{D-2}(v_i'') + d_{v_i'} − 2|S| = Emd(v_i')) & (v_i ∈ T_v)
        % Another length D minimal path from v_i to v_i' found
        Mult(v_i') ← Mult(v_i') + Mult^{D-2}(v_i'');
        Parent(v_i') ← Parent(v_i') ∪ S;
      end
    end
  end
end
```

As previously described, the enumeration algorithm may generate a data structure $W(c_j)$ for each jth check node connected to an ith variable node, where the data structure $W(c_j)$ includes and/or identifies m paths from the ith variable node $v_i$ to the jth check node $c_j$ with depth d and EMD τ. Accordingly, for an ith variable node connected to a jth check node, the codebook scoring module 1102 may identify the value of the m paths. Where the ith variable node is connected to more than one check node, the codebook scoring module 1102 may identify the value of m paths for each of the check nodes that are connected to the ith variable node, and sum the values together in order to determine the first scoring term $\hat{W}_{(d,\tau)}^{v(i,0) \to c(j,d)}$.

The second scoring term $P_{CS}^{\varepsilon_i}(d, \tau)$ can be calculated according to the following equations (5)-(13) as follows:

$$P_{CS}^{\varepsilon_i}(d, \tau) = \sum_{S=d}^{N} N_S(d, d, \tau) \varepsilon_i^S, \quad (5)$$

where N is the cardinality of variable nodes, $N_s(d,d,\tau)$ is the expected number of stopping sets of size S that contain the give (d,d,τ) cycle set, and $\epsilon_i$ is the bit erasure probability associated with a given ith variable node v(i). The term $N_s(d,d,\tau)$ is computed according to the following equation:

$$N_S(d, d, \tau) = \sum_{\rho=\tau}^{Md_c-2d-\tau} A(s-d, \rho) \cdot B(\rho, d, \tau), \quad (6)$$

where $d_c$ is the maximal check node degree, where $A(s-d,\rho)$ is the number of subsets of variable nodes of size s–d emanating p edges, and where $B(\rho,d,\tau)$ is the probability that p edges form a stopping set over the set of M check nodes from which d check nodes are the intrinsic check nodes of the given cycle set and τ check nodes are the extrinsic check nodes of the given cycle set. The term $A(s-d,\rho)$ is computed according to the following generator polynomial:

$$A(s-d, \rho) = \text{coeff}\left(\prod_i (1+yx^i), y^{s-d}x^\rho\right), \quad (7)$$

and the term $B(\rho,d,\tau)$ is computed according to the following equation:

$$B(\rho, d, \tau) = \frac{\sum_{i=\tau}^{\min\{\rho, \tau(d_c-1)\}} \sum_{j=0}^{\min\{\rho-i, d(d_c-2)\}} \alpha(i, \tau) \beta(j, d) \gamma(M-d-\tau, \rho-i-j)}{\binom{Md_c - 2d - \tau}{\rho}}. \quad (8)$$

The term $\alpha(i,\tau)$ is the number of possibilities for connecting i edges to the τ extrinsic check nodes such that each extrinsic check node is connected at least once, and is computed according to the following equation:

$$\alpha(i,\tau) = \text{coeff}(((1+x)^{d_c-1}-1)^\tau, x^i). \quad (9)$$

In addition, the term $\beta(j,d)$ provides the number of possibilities for connecting j edges to the d intrinsic check nodes, and is computed according to the following equation:

$$\beta(j, d) = \binom{(d_c - 2)d}{j}. \quad (10)$$

Further, the term $\gamma(M-d-\tau,\rho-i-j)$ provides the number of possibilities for connecting the remaining (ρ-i-j) edges to the remaining (M-d-τ) check nodes such that a check node is either unconnected, or connected at least twice, where M is the cardinality of the check nodes, and is computed according to the following equation:

$$\gamma(M,\rho) = \text{coeff}(((1+x)^{d_c} - d_c x)^M, x^\rho), \quad (11)$$

In addition or alternatively, the following recursions are used to generate pre-computed tables of $\alpha(i,\tau)$ and $\gamma(M,\rho)$ for all values of i,τ,M and ρ:

$$\alpha(i, \tau) = \sum_{j=1}^{\min\{i, d_c-1\}} \binom{d_c - 1}{j} \alpha(i-j, \tau-1), \quad (12)$$

where $$\begin{cases} \alpha(i, 0) = 1 & \text{if } i = 0 \\ \alpha(i, 0) = 0 & \text{otherwise} \end{cases}$$

and $$\gamma(M, \rho) = \gamma(M-1, \rho) + \sum_{j=2}^{\min\{d_c, \rho\}} \gamma(M-1, \rho-j) \binom{d_c}{j} \quad (13)$$

where $$\begin{cases} \gamma(0, \rho) = 1 & \text{if } \rho = 0 \\ \gamma(0, \rho) = 0 & \text{otherwise} \end{cases}$$

Referring back to equation (3), the terms $$\frac{(d+1)Z}{2GCD(q-p, Z)} \text{ and } \frac{(\tau-2)Z}{GCD(q-p, Z)}$$

can be substituted in for d and τ in equations (5)-(13) as appropriate, where GCD refers to "greatest common denominator."

Additionally, referring back to equation (5), the second scoring term $P_{CS}^{\varepsilon_i}(d,\tau)$ may be calculated based on an ith bit erasure probability $\epsilon_i$ associated with a given ith variable node v(i). In this context, a channel between the controller 102 and the memory dies 104 may be considered and/or modeled after a binary erasure channel (BEC), where a transmitter sends an ith bit (at a value of 0 or 1) over the channel to a receiver. The bit erasure probability $\epsilon_i$ is the probability that the ith bit is received with zero or no reliability (i.e., that the receiver has no reliability or confidence that the bit value of the ith bit is correct). Accordingly, the quantity $(1-\epsilon_i)$ is the probability that the ith bit is received with absolute reliability (i.e., that the receiver has absolute reliability or confidence that the bit value of the ith bit is correct).

As shown in equation (5), each ith bit erasure probability $\epsilon_i$ may be associated with corresponding ith variable node, as indicated by the subscript i. The value for the ith bit erasure probability $\epsilon_i$ may be depend on whether the variable node with which it is associated is associated with a good storage location or a bad storage location. As previously described, the number of variable nodes may be equal to the number of bits of a codeword to be stored in a segment of storage. Since each variable node corresponds to a particular bit of the codeword bit sequence, and each bit is stored in a particular memory cell of the segment of storage, then for a given codeword, each associated variable node is, in turn, associated with a particular memory cell of the segment of storage where that codeword is stored. Otherwise stated, a memory mapping may map a given variable node to a given memory cell, which may be either a good memory cell or a bad memory cell.

Accordingly, when the codebook scoring module 1102 is cycling through the variable nodes to calculate the second scoring term, the codebook scoring module 1102 may access the bad storage location database 1110 to determine whether a particular ith variable node is associated with a good memory cell or a bad memory cell. As used herein, a variable node associated with a good memory cell may be referred to as a good variable node, and a variable node associated with the bad memory cell may be referred to as a bad variable node. If the codebook scoring module 1102 determines that the ith variable node is associated with a good memory cell, then the codebook scoring module 1102 may assign a first value for the associated ith bit erasure probability $\epsilon_i$. Alternatively, if the codebook scoring module 1102 determines that the ith variable node is associated with a bad memory cell, then the codebook scoring module 1102 may assign a second value for the associated ith bit erasure probability $\epsilon_i$. In a particular example configuration, the second value when the associated memory cell is bad may be higher than the first value when the associated memory cell is good. For example, the first value may be 0.2 and the second value may be 0.5. These values are merely exemplary, and other values may be used. Also, more than two different values may be possible, particularly for configurations where more than two levels (good/bad) are used to assess the reliability of storage locations.

In sum, the codebook scoring module 1102 may use different erasure probability values to calculate the expected contributions to a decoding error probability of one or more cycle sets (i.e., the second scoring term) for different variable nodes, and which erasure probability values the codebook scoring module 1102 uses for each the expected contribution calculations may depend on whether the corresponding variable nodes are associated with good storage locations or bad storage locations. In a particular configuration, for an expected contribution calculation, the codebook scoring module 1102 uses a higher erasure probability value when the corresponding variable node is associated with a bad storage location, compared to when the corresponding variable node is associated with a good storage location.

Figure 13:
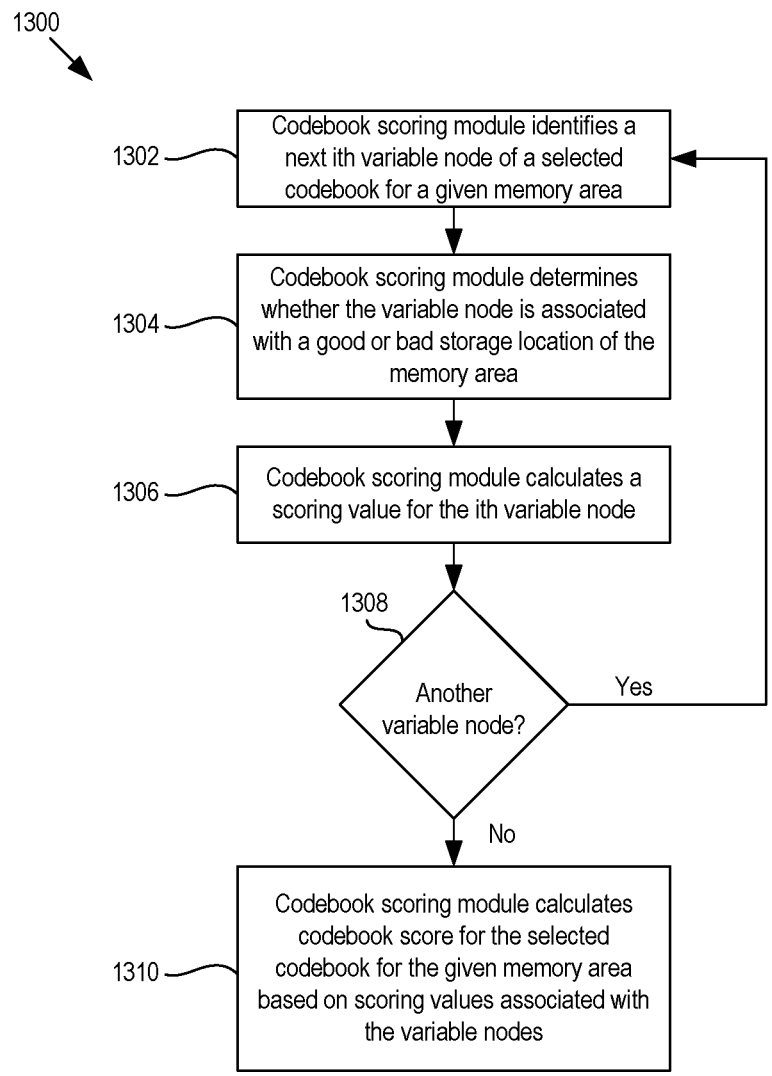
FIG. 13 is a flow chart of an example method of calculating a codebook score for a given codebook and a given memory area.

FIG. 13 shows a flow chart of an example method 1300 of a calculating a codebook score $R_{CB(m)}$ for an mth codebook from the codebook library 1106 for a given memory area. At block 1302, the codebook scoring module 1102 may identify a next ith variable node of the mth codebook for which to generate a scoring value. If the method 1300 is just starting, the next ith variable node may be the first variable node v(1). At block 1304, the codebook scoring module 1102 may determine whether the ith variable node is associated with a good storage location or a bad storage location of the memory area. At block 1306, the codebook scoring module 1102 may calculate a scoring value for the ith variable node, such as by calculating a first value for the first scoring term $\hat{W}_{(d,\tau)}^{v(i,0) \rightarrow c(j,4)}$ and a second value of the second scoring term $P_{CS}^{\epsilon_i}$ for the ith variable node, and multiplying the terms together. The codebook scoring module 1102 may calculate the first scoring term $\hat{W}_{(d,\tau)}^{v(i,0) \rightarrow c(j,4)}$ using the enumeration algorithm, and may calculate the second scoring term $P_{CS}^{\epsilon_i}$ using equations (5)-(13), as previously described. When calculating the second scoring term $P_{CS}^{\epsilon_i}$, the codebook scoring module 1102 may select or set a value for the bit erasure probability $\epsilon_i$ based on whether the ith variable node is associated with a bad memory cell or a good memory cell. As previously described, the erasure probability value may be higher if the ith variable node is associated with a bad memory cell compared to if it is associated with a good memory cell.

At block 1308, the codebook scoring module 1102 may determine whether there is another or next variable node for which to calculate a score (or scoring value). If so, then the method 1300 may proceed to the next ith variable node at block 1302. If not, then at block 1310, the codebook scoring module 1102 may determine a codebook score $R_{CB(m)}$ for the mth codebook based on the scores (or scoring values) determined for each of the ith variable nodes of the mth codebook. In a particular example, the codebook scoring module 1102 may sum the scoring values together to generate the codebook score $R_{CB(m)}$ for the given memory area.

Figure 14:
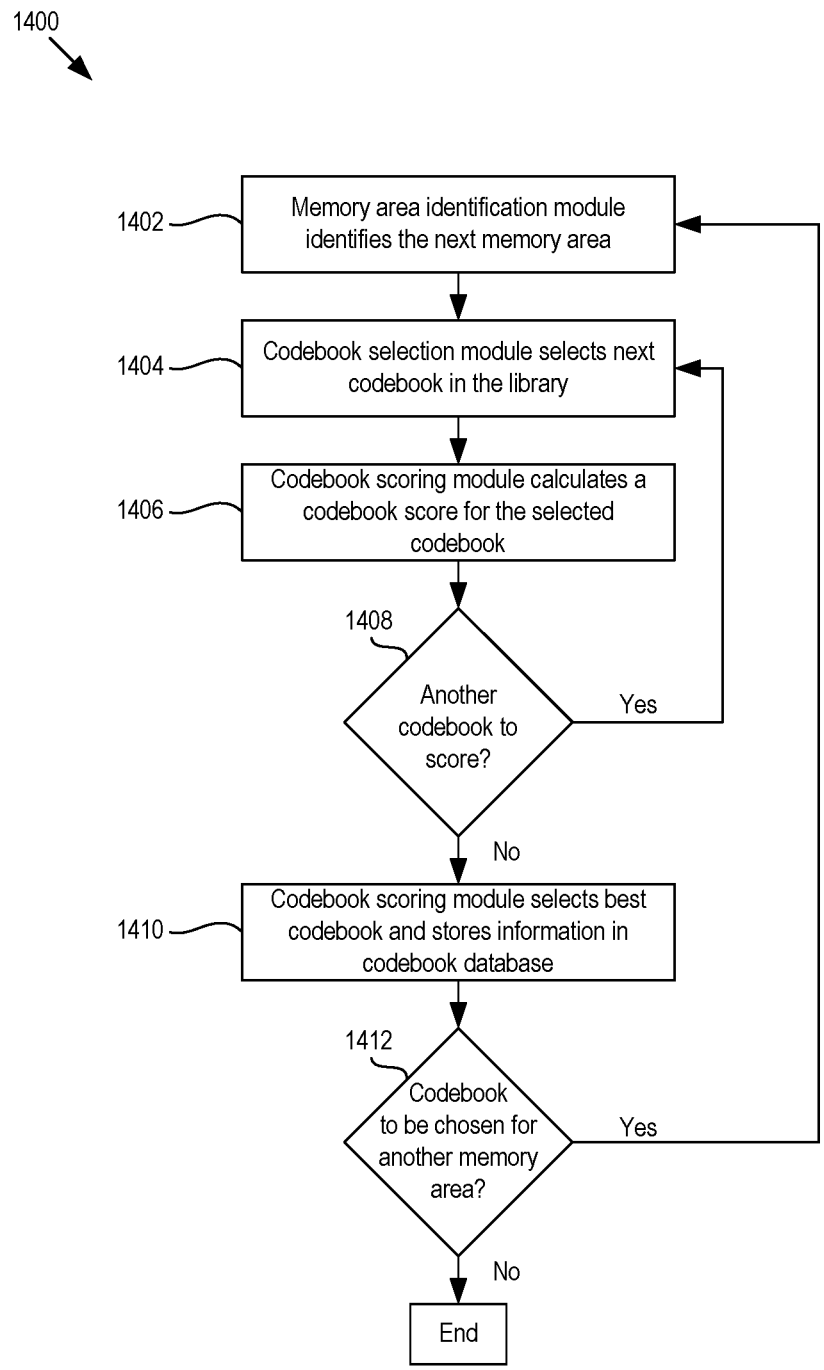
FIG. 14 is a flow chart of an example method of selecting a codebook from a plurality of codebooks for each of a plurality of memory areas of the memory system of FIGS. 1A-2B based on a scoring scheme.

FIG. 14 is a flow chart of an example method 1400 of selecting a codebook from a plurality of codebooks for each of a plurality of memory areas of the memory dies 104. At block 1402, the memory area identification module 1108 may identify a next memory area of the plurality of memory dies 104 for which to select a best codebook from the codebook library 1106. If the method 1400 is in its initial iteration, the next memory area may be an initial memory area that the memory area identification module 1108 is configured to select. At block 1404, the codebook scoring module 1102 may select a next mth codebook from the codebook library 1106. The next mth codebook may be an initial codebook where the codebook is the first codebook selected for the memory area.

At block 1406, the codebook scoring module 1102 may calculate a codebook score $R_{CB(m)}$ for the mth codebook that is selected at block 1404. The codebook score $R_{CB(m)}$ may be calculated in accordance with the method 1300 of FIG. 13, as previously described. At block 1408, the codebook scoring module 1102 may determine whether there is another codebook in the codebook library 1106 to score for the memory area identified at block 1402. If there is, then the method 1400 may proceed back to block 1404, where the codebook scoring module 1102 selects a next codebook to score from the library 1106. Alternatively, if there are no further codebooks to score for the memory area, then the method 1400 may proceed to block 1410, where the codebook scoring module 1102 selects a best codebook from the library 1106 to use for encoding and decoding for the memory area. The codebook scoring module 1102 may determine or select the best codebook based on which of the codebooks yielded the highest score, as calculated at block 1406. After making the selection, the codebook scoring module 1102 may identify the best codebook for the memory area as one of the N codebooks 506(1)-506(N) in the codebook database 508.

At block 1412, the memory area identification module 1108 may determine if there is another memory area of the memory dies 104 for which to select a best codebook from the codebook library 1106. If there is, then the method 1400 may proceed back to block 1402, where the memory area identification module 1102 identifies a next memory area. If not, then the method 1400 may end.

As previously described, the codebook scoring module 1102, the memory area identification module 1104, and the bad storage database 1110 may be components of the memory system 100, such as components of the ECC engine 124 or another components of the controller 102. In another example embodiment, the codebook scoring module 1102, the memory area identification module 1104, and the bad storage database 1110 may be components of a controller of an external computing device or system, such as a testing device or system, that is external to the memory system 100. The external computing device may have access to and/or have stored therein the codebook library 1106. Based on the bad storage locations of the memory areas, the codebook scoring module 1102 and the memory area identification module 1104, may operate to analyze the M codebooks 1108(1)-1108(M) stored in the codebook library 1106 to select the best codebooks for each of the memory areas of the memory dies 104, such as by performing the example methods of 1300 and 1400 of FIGS. 13 and 14 respectively. The external computing device may then load the selected best codebooks into the codebook database 508 of the memory system 100 as the N-number of codebooks 506(1)-506(N) that the ECC engine 124 uses to encode and decode data for the various memory areas of the memory dies 104.

Figure 11:
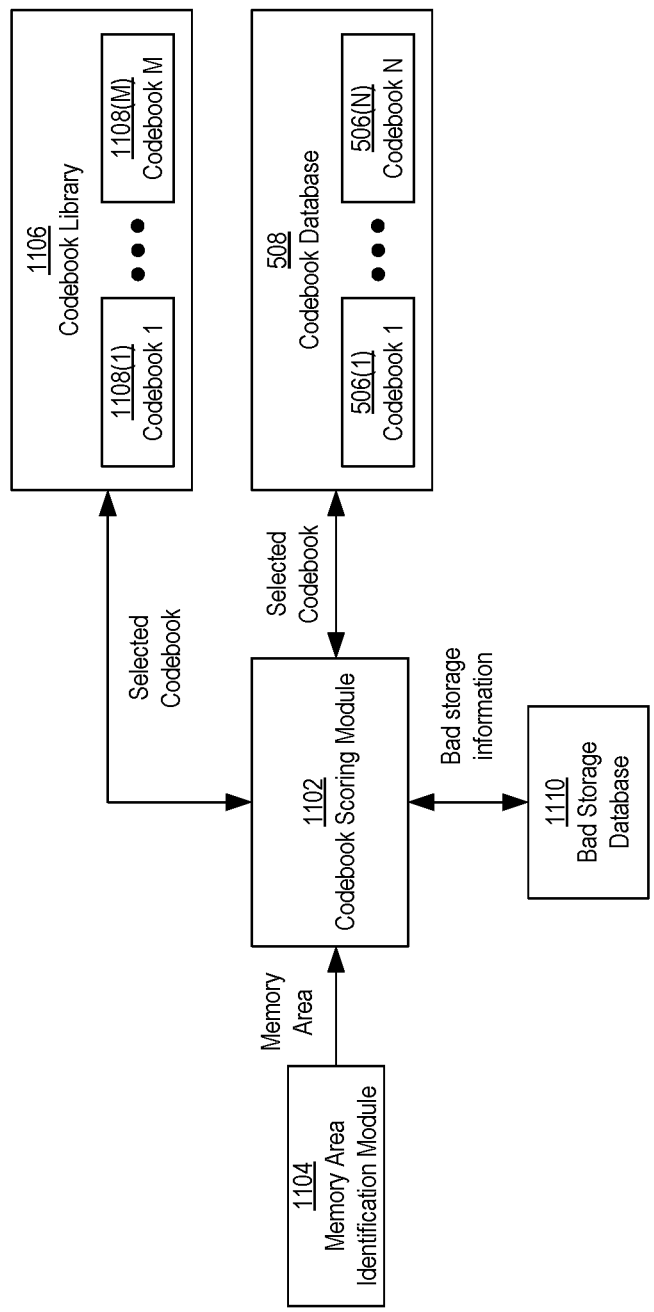
FIG. 11 is a block diagram of an example embodiment of components that may be used to evaluate and score different codebooks for various memory areas of the memory system of FIGS. 1A-2B.

In other example embodiments, some of the components shown in FIG. 11 may be components of the memory system 100 and the other of the components may be components of a controller of the external computing device or system. Which components are part of the memory system 100 and which are part of the external computing device or system may vary. For these embodiments, the components of the memory system 100 and the components of the external computing device or system may communicate with each other in order to ultimately have the selected best codebooks loaded into the codebook database 508 of the memory system 100. Various ways of integrating the components shown in FIG. 11 into the memory system 100, an external computing device or system, or a combination thereof, may be possible.

In other example embodiments, instead of evaluating a plurality of codebooks from a library based on decoding metrics (as described with reference to FIGS. 8-10), or using a scoring algorithm (as described with reference to FIGS. 11-14), the memory system 100 may be configured to determine a codebook for a particular memory area by modifying or permuting an existing codebook based on bad storage locations of the particular memory area. FIG. 15 shows a block diagram of components of an example embodiment of the controller 102 that may be involved in a codebook modification or permuting process to generate modified or permuted codebooks based on bad storage locations for memory areas of the memory dies 104. For some example configurations, the components may be components of the ECC engine 124, although in other example configurations, some or all of these components may be considered components separate from the ECC engine 124. The components involved may include a codebook modification module 1502, a memory area identification module 1504, a bad storage database 1506, which may identify bad storage locations for the various memory areas of the memory dies 104 as previously described, and the codebook database 508, which may store and/or include an initial or common codebook 1506 and an N-number of modified codebooks 1508(1) to 1508(N) to encode and decode data for the plurality of memory areas for the plurality of memory dies 104.

In some example embodiments, the initial codebook 1506 may be loaded into the codebook database 508 during the life of the memory system 100, such as during production of the memory system 100. Although FIG. 15 shows one initial codebook 1506, more than one initial codebook 1506 may be loaded into the codebook database 508 in other example configurations. In general, the initial codebook 1506 may be a codebook having a particular configuration that is not based on any bad storage locations of the memory dies 104. At least one of the modified codebooks 1508(1)-1508(N) may be a modification or permutation of the initial codebook 1506, and the other of the modified codebooks 1508(1)-1508(N) may each be a modification or permutation of the initial codebook 1506 or another modified or permuted codebook.

In one example configuration of codebook modification, the codebook modification module 1502 may be configured to modify one of the codebooks to generate a modified codebook based on numbers of variable nodes associated with bad storage locations connected to check nodes. In particular, the existing codebook may be modified by reducing the number of connections that certain check nodes have to variable nodes associated with bad storage locations. The notion is that decoding performance for a given memory area may be less than optimal if the codebook used to encode and decode data stored in the given memory area has one or more check nodes that are connected to too many variable nodes associated with bad storage locations. By identifying these check nodes and generating a modified codebook by reducing the number of connections these check nodes have to variable nodes associated with bad storage locations, decoding performance for the given memory area may be improved.

In further detail, when the codebook modification module 1502 is to determine a codebook for a particular memory area, the codebook modification module 1502 may select an existing codebook in the codebook database 508 (either the initial codebook 1506 or modified codebook 1508 that the codebook modification module 1502 generated for another memory area) and may determine the bad storage locations for the particular memory area, such as by accessing the bad storage database 1506. Based on identifying the bad storage locations, the codebook modification module 1502 may be configured to determine which of the variable nodes of the existing codebook are associated with the bad storage locations of the particular memory area.

As used herein, a connection (or edge) that connects a check node with a good variable node may be referred to as a good connection (or good edge), and a connection (or edge) that connects a check node with a bad variable node may be referred to as a bad connection (or bad edge). Upon determining which of the variable nodes are associated with the bad storage locations of the particular memory area, the codebook modification module 1502 may be configured to traverse the check nodes of the existing codebook, and for each check node, count the number of bad variable nodes or bad edges connected to that check node.

In the event that the codebook modification module 1502 determines to generate a modified codebook based on an existing codebook, the codebook modification module 1502 may use the count information to determine how to modify the existing codebook. In a particular example configuration, the codebook modification module 1502 may use the count information to identify one or more candidate check nodes that may be the subject of the codebook modification. The codebook modification module 1502 may then select one or more of the candidate check nodes to be the subject of the codebook modification. In turn, the codebook modification module 1502 may be configured to modify the existing codebook by reducing the number of bad edges connected to the candidate check nodes that it selects.

The codebook modification module 1502 may identify the candidate check nodes in various ways. In one example configuration, the codebook modification module 1502 may utilize a count threshold. If the number of bad variable nodes or bad edges connected to a given check node exceeds the count threshold, then the codebook modification module 1502 may be configured to identify the given check node as a candidate check node. In some example configurations, the count threshold may be one, although other numbers may be possible. In addition or alternatively to using a count threshold, the codebook modification module 1502 may utilize a count range to identify the check node as a candidate check node. That is, if the number of bad variable nodes or bad edges is within the count range, then the codebook modification module 1502 may be configured to identify the given check node as a candidate check node. For another example configuration, the codebook modification module 1502 may determine a predetermined number of check nodes that are connected to the highest number of bad variables. The codebook modification module 1502 may identify those check nodes as candidate check nodes. So, for example, if the predetermined number is 5, then the codebook modification module 1502 may be configured to identify the five check nodes that are connected to the most bad variable nodes, and identify those five check nodes as candidate check nodes. Other ways of identifying candidate check nodes for codebook modification based on the count information may be possible.

Upon identifying one or more candidate check nodes, the codebook modification module 1502 may be configured to modify or permute the existing codebook by reducing the number of bad connections to one or more of the candidate check nodes. The codebook modification module 1502 may modify the existing codebook by reducing the number of bad connections for only some of the candidate check nodes, or for all of the candidate check nodes.

The codebook modification module 1502 may be configured to modify an existing codebook through a reduction of the number of bad connections to selected candidate check nodes in various ways. For a given selected candidate check node, the codebook modification module 1502 may modify a codebook by removing one or more bad connections connected to the selected check node from the codebook; switching one or more bad connections connected to the selected check node to be connected to one or more non-candidate check nodes; swapping one or more bad connections with one or more good connections so that the total number of edges connected to the candidate and non-candidate check nodes remains the same, or some combination thereof. In addition or alternatively, the codebook modification module 1502 may modify a codebook by swapping two or more columns of an associated parity-check matrix with each other. One of the columns involved in the swapping may correspond to a bad variable node connected to the selected check node, and another of the columns involved in the swapping may correspond to a good variable node unconnected with the selected check node.

Figure 16B:
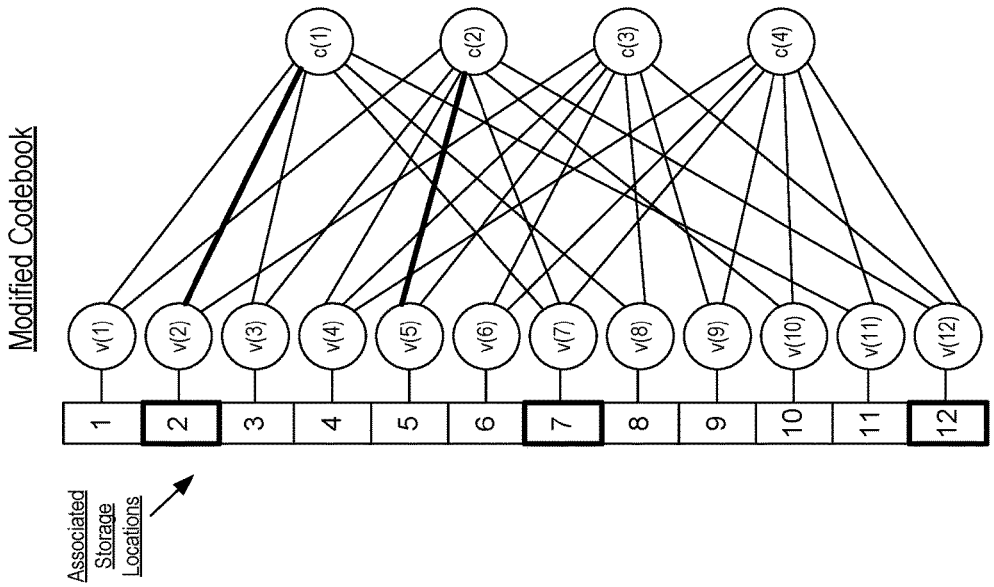
FIG. 16B shows a schematic diagram of an example Tanner graph of a modified version of the existing codebook of FIG. 16A, which was modified based on numbers of bad variable nodes connected to check nodes.
Figure 16A:
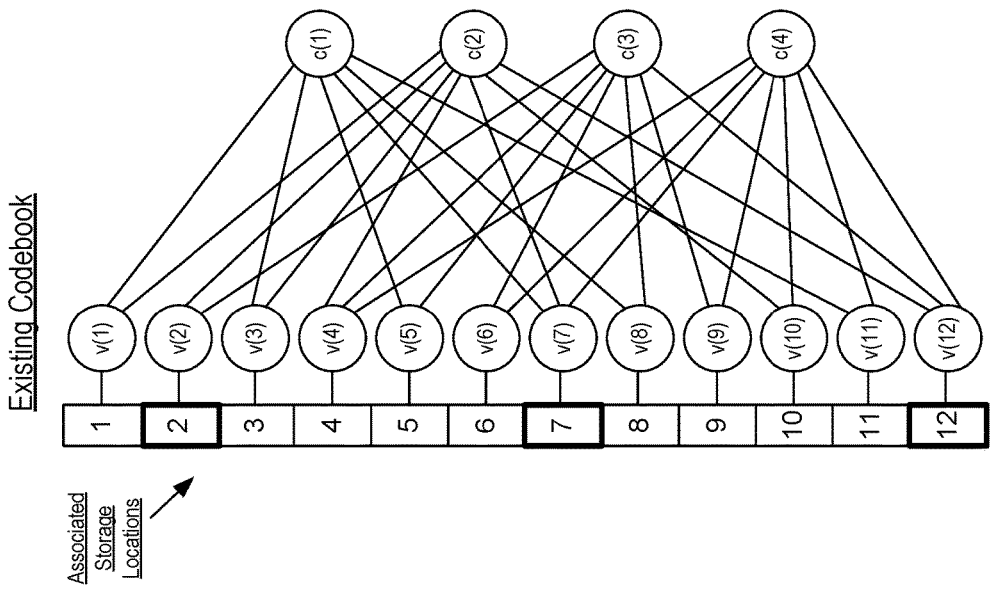
FIG. 16A shows a schematic diagram of an example Tanner graph of an existing codebook to be modified.

To illustrate an example codebook modification based on numbers of bad edges connected to check nodes, FIG. 16A shows a Tanner graph of an existing codebook that may be included in the codebook database 508. The Tanner graph in FIG. 16A indicates that the existing codebook includes twelve variable nodes $v(1)$ to $v(12)$ and four check nodes $c(1)$ to $c(4)$. As shown in FIG. 16A, an edge connects the first variable $v(1)$ with the first check node $c(1)$, an edge connects the first variable $v(1)$ with the second check node $c(2)$, and so on. Additionally, FIG. 16A shows storage locations of the memory area with which each variable node is associated. For example, the first variable node $v(1)$ is associated with the first storage location, the second variable node $v(2)$ is associated with the second storage location, and so on. For configurations where the memory area is a plane, the storage locations indicated in FIG. 16A may be bit lines. For configurations where the memory area is a segment of storage, the storage locations may be memory cells.

Suppose, for example, that of the twelve storage locations, the bad storage locations are the second, seventh, and twelfth storage locations, as indicated by the bolded boxes around those storage locations. Accordingly, the first check node $c(1)$ is connected to one bad variable, $v(7)$; the second check node $c(2)$ is connected to three bad variables, $v(2)$, $v(7)$, and $v(12)$; the third check node $c(3)$ is connected to two bad variables, $v(2)$ and $v(12)$; and the fourth check node $c(4)$ is connected to two bad variables, $v(7)$ and $v(12)$.

In the event that the codebook modification module 1502 wants to modify the existing codebook shown in FIG. 16A, the codebook modification module 1502 may identify the second check node $c(2)$ as a candidate check node. In one example, the bad connection or bad variable threshold used by the codebook modification module 1502 may be two, and the codebook modification module 1502 may identify the second check node $c(2)$ as a candidate check node since the number of bad connections connected to the second check node $c(2)$ (three) is greater than the bad connection threshold. As another example, the codebook modification module 1502 may identify the second check node $c(2)$ as a candidate check node because it has the highest number of bad connections connected to it among the four check nodes $c(1)$ to $c(4)$.

Upon identifying the second check node $c(2)$ as a candidate check node, the codebook modification module 1502 may modify the existing codebook by reducing the number of bad connections connected to the second check node $c(2)$. In one example, the codebook modification module 1502 may reduce the number of bad connections connected to the second check node $c(2)$ by removing one or more of the bad connections from the codebook. For example, one of the bad connections of the existing codebook connects the second variable $v(2)$ to the second check node $c(2)$. The codebook modification module 1502 may modify the existing codebook by removing that bad connection from the codebook.

As another example modification, the codebook modification module 1502 may modify the existing codebook by moving the bad connection connecting the second variable node v(2) to the second check node c(2) so that the bad connection connects the second variable node v(2) to a non-candidate check node, such as the first check node c(1). This moving of the bad connection is indicated in FIG. 16B by the bolded connection connecting the second variable node v(2) to the first check node c(1). In this example, the number of bad connections connected to the second check node c(2) is reduced by one, while the number of bad connections connected to the first check node c(1) is increased by one. For some example configurations, as illustrated in FIG. 16B, the bad connection is moved to a check node having the lowest or one of the lowest number of bad connections, which in this case is the first check node c(1). As previously described, both the third and fourth check nodes c(3), c(4) have two bad connections, and adding another bad connection to either of these check nodes c(3), c(4) may be undesirable since doing so would yield a codebook modification with a check node having three bad connections.

As another example modification, the codebook modification module 1502 may modify the existing codebook by swapping a bad connection connected to the second check node c(2) with a good connection connected to another check node. For example, as depicted in FIG. 16B, in addition to moving the bad connection connected to the second variable node v(2) from the second check node c(2) so that it is instead connected to the first check node c(1), a good connection connecting the first check node c(1) with a good variable node may be moved so that the good connection is connected to the second check node c(2). For example, as shown in FIGS. 16A and 16B, a good connection connected to the fifth variable node v(5) may be moved from being connected to the first check node c(1) to the second check node c(2). In this latter example, the number of bad connections connected to the second check node c(2) is reduced by one, while the overall number of connections connected to each of the check nodes has remained the same.

For simplicity, the example codebook modification illustrated in FIGS. 16A and 16B shows reducing the number of bad connections for only one check node and by reducing the number of bad connections by one. In other example configurations, the number of bad connections may be reduced for more than one check node and/or more than one bad connection may be removed from a given candidate check node. Also, in the example codebook modification illustrated in FIGS. 16A and 16B, the check node identified as a candidate check node (i.e., the second check node) was also the check node selected to be the subject of the codebook modification. In other example configurations, as mentioned, there may be more than one check node identified as a candidate, but less than all of the candidate nodes are selected for modification. Various configurations for selecting check nodes for codebook modification based on numbers of bad connections may be possible.

In another example configuration of codebook modification, the codebook modification module 1502 may be configured to modify one of the codebooks to generate a modified codebook based on numbers of bad variable nodes participating in minimal cycles. The notion is that decoding performance for a given memory area may be less than optimal if the codebook used to encode and decode data stored in the given memory area has too many bad variable nodes participating in minimal cycles. By identifying these bad variable nodes and generating a modified codebook that has reduced the number of bad variable nodes participating in one or more minimal cycles, decoding performance for the given memory area may be improved.

As previously described, a set of variable nodes forms or participates in a cycle if there exists a path passing through all of the variables in the set to itself without traversing an edge twice, and the set of variable nodes forms a minimal cycle if: (1) it forms a cycle, and (2) no subset of the variable nodes forms a cycle.

For a given codebook selected from the codebook database 508, the codebook modification module 1502 may be provided with or otherwise determine the various minimal cycles and particular variable nodes participating in the various minimal cycles for the given codebook. Additionally, the codebook modification module 1502 may be configured to determine which of the variable nodes participating in the minimal cycles are bad variable nodes, such as by accessing the bad storage database to determine the variable nodes associated with bad storage locations for a given memory area. Based on this information, the codebook modification module 1502 may be configured to determine the number of bad variable nodes that are participating in each of the minimal cycles of the selected codebook.

In the event that the codebook modification module 1502 determines to generate a modified codebook based on an existing codebook, the codebook modification module 1502 may use the information identifying the bad variables participating in the minimal cycles and/or the numbers of bad variables participating in the minimal cycles to determine how to modify the existing codebook. In a particular example configuration, the codebook modification module 1502 may use the information to identify one or more candidate minimal cycles that may be the subject of the codebook modification. The codebook modification module 1502 may then select one or more of the candidate minimal cycles to be the subject of the codebook modification. In turn, codebook modification module 102 may be configured to modify the existing codebook by reducing the number of bad variables participating in the minimal cycles that it selects.

The codebook modification module 1502 may identify the candidate minimal cycles in various ways. In one example configuration, the codebook modification module 1502 may utilize a count threshold. If the number of bad variable nodes participating in a given minimal cycle exceeds the count threshold, then the codebook modification module 1502 may be configured to identify the minimal cycle as a candidate minimal cycle.

For other example configurations, the codebook modification module 1502 may utilize a threshold based on a length of the minimal cycle and the number of bad variables participating in the minimal cycles. In a particular example configuration, the threshold may be a difference threshold corresponding to a difference between a length of the minimal cycle and the number of bad variables participating in the minimal cycle. In general, the length of a cycle may be equal to the number of edges of the cycle. Of the various minimal cycles of a codebook, any two minimal cycles may have the same length or differing lengths. For a given minimal cycle, the codebook modification module 1502 may be configured to determine a difference between the length of the minimal cycle and the number of bad variable nodes participating in the minimal cycle. If the difference is below the difference threshold, then the codebook modification module 1502 may be configured to identify the minimal cycle as a candidate minimal cycle. In another particular example configuration, the threshold may correspond to a ratio of the number of bad variables participating in the minimal cycle to the length of the minimal cycle. Other types of threshold values that consider both the length of the minimal cycle and the number of bad variable nodes participating in the minimal cycle may be possible.

For other example configurations, the codebook modification module 1502 may utilize a threshold based on the number of bad variables and the total number of variables participating in the minimal cycles. In a particular example configuration, the threshold may be a difference threshold corresponding to a difference between the total number of variables participating in the minimal cycle and the number of bad variables participating in the minimal cycle. If the difference is below the difference threshold, then the codebook modification module 1502 may be configured to identify the minimal cycle as a candidate minimal cycle. In another particular example configuration, the threshold may correspond to a ratio of the number of bad variables participating in the minimal cycle to the total number of variables participating in the minimal cycle. Other types of threshold values that consider both the number of bad variable nodes and the total number of variable nodes participating in the minimal cycle may be possible. For example, a threshold value may be based on the length of minimal cycle, the number of bad variable nodes participating in the variable cycle, and the total number of variable nodes participating in the variable cycle.

For still other example configurations, the codebook modification module 1502 may be configured to determine a predetermined number of minimal cycles with the largest number of participating bad variables, a predetermined number of minimal cycles with the smallest difference between the cycle length and the number of participating bad variables, a predetermine number of minimal cycles having the largest ratio of bad variables to minimal cycle length, a predetermined number of minimal cycles with the smallest difference between the number of participating bad variables and the total number of participating variables, or a predetermined number of minimal cycles having the largest ratio of participating bad variables to total participating variables.

Other ways of identifying candidate minimal cycles for codebook modification based on numbers of bad variables participating in the minimal cycles may be possible. For example, in addition or alternatively to utilizing a threshold, the codebook modification module 1502 may utilize a range, and may determine a minimal cycle to be a candidate minimal cycle based on a determined value relative to the range.

Upon identifying one or more candidate minimal cycles, the codebook modification module 1502 may be configured to modify or permute the existing codebook by reducing the number of bad variable nodes participating in one or more of the candidate minimal cycles. The codebook modification module 1502 may modify the existing codebook by reducing the number of bad variable nodes for only some of the candidate minimal cycles, or for all of the candidate minimal cycles. The effect of the modification is that minimal cycles that are selected for codebook modification may be removed or broken up and, in at least some situations, a new minimal cycle may be formed, where the newly formed minimal cycle has a fewer number of participating bad variable nodes, a larger difference between the length of the newly formed minimal cycle and the number of participating bad variable nodes, a smaller ratio of the number of participating bad variable nodes to the minimal cycle length, a larger difference between the total number of participating variable nodes and the number of participating bad variable nodes, a smaller ratio of the number of participating bad variable nodes to the total number of participating variable nodes, or some combination thereof.

The codebook modification module 1502 may be configured to modify an existing codebook through a reduction in the number of bad variables participating in a selected minimal cycle in various ways. For a given selected candidate minimal cycle, the codebook modification module 1502 may modify a codebook by removing one or more connections connected to one or more bad variable nodes participating in the selected minimal cycle from the codebook; switching one or more connections connected to one or more bad variable nodes of the selected minimal cycle to be connected to one or more different check nodes (i.e., for a given edge, keeping the bad variable node the same but changing the check node to which the edge is connected to a different check node); changing a bad connection to a good connection (i.e., for a given edge, keeping the check node the same but changing the variable node to which the edge is connected from the bad variable node participating in the minimal cycle to a good variable node); or some combination thereof. Additionally, for some modifications involving the switching or the changing, a corresponding connection change may be made so that the overall number of edges connected to each of the variable nodes and the overall number of edges connected to each of the check nodes remains the same. In addition or alternatively, the codebook modification module 1502 may modify a codebook by swapping two or more columns of an associated parity-check matrix with each other. One of the columns involved in the swapping may correspond to a bad variable node participating in a selected minimal cycle, and another of the columns involved in the swapping may correspond to a good variable node not participating in the selected minimal node.

Figure 17B:
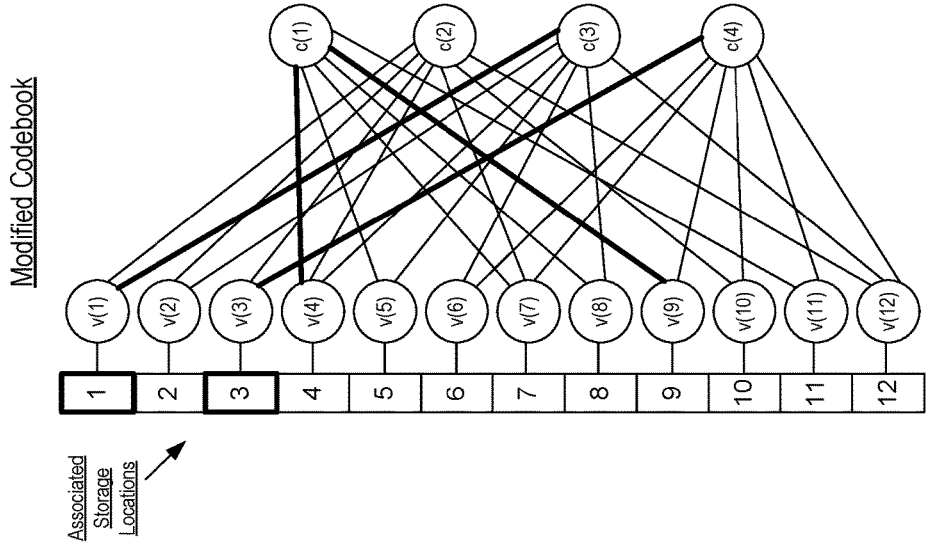
FIG. 17B shows a schematic diagram of an example Tanner graph of a modified version of the existing codebook of FIG. 17A, which was modified based on numbers of bad variables participating in minimal cycles.
Figure 17A:
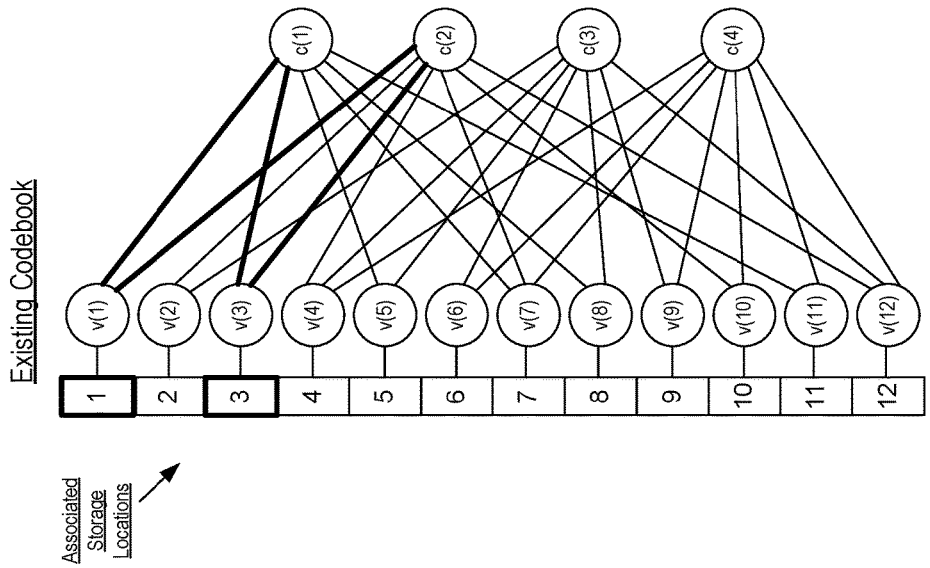
FIG. 17A shows a schematic diagram of another example Tanner graph of an existing codebook to be modified.

To illustrate an example codebook modification based on numbers of bad variables participating minimal cycles, FIG. 17A shows a Tanner graph of an existing codebook that may be included in the codebook database 508. The Tanner graph shown in FIG. 17A is the same as the Tanner graph shown in FIG. 16A. The Tanner graph includes a minimal cycle formed by the bolded edges shown in FIG. 17A, including an edge connecting the first variable node v(1) to the first check node c(1), an edge connecting the first check node c(1) to the third variable node v(3), an edge connecting the third variable node v(3) to the second check node c(2), and a final edge connecting the second check node c(2) to the first variable node v(1). A length of the minimal cycle is four, and a total number of variable nodes participating in the minimal cycle is two.

Suppose in the example that the bad storage locations of the particular memory area for which the existing codebook is being modified includes the first storage location and the third storage location, as indicated by the bolded boxes around those storage locations. As such, all of the variable nodes participating in the identified minimal cycle are associated with bad storage locations, yielding two participating bad variable nodes, a value of two for the difference between the length of the identified minimal cycle and the number of participating bad variable nodes, a value of 0.5 for the ratio of the number of participating bad variable nodes to the length of the minimal cycle, a value of zero for the difference between the total number of participating variable nodes and the number of number of participating bad variable nodes, and a value of one for the ratio of the number of participating bad variable nodes to the total number of participating variable nodes. The codebook modification module 1502 may be configured to calculate some or all of these values, and based on one or more of these values, identify this minimal cycle as a candidate minimal cycle. Also, as previously described, other values may be calculated based on the number of bad variable nodes participating in the minimal cycle, the length of the minimal cycle, and/or the total number of participating variable nodes, and the codebook modification module 1502 may use one or more of these other values to identify the minimal cycle as a candidate minimal cycle.

In turn, the codebook modification module 1502 may be configured to modify the codebook by removing or adjusting the connections to one or more of the variable nodes participating in the identified minimal cycle (i.e., the first variable node $v(1)$ and/or the third variable node $v(3)$). FIG. 17B shows a Tanner graph of the modified codebook. As shown in FIG. 17B, the modification is performed by changing the check nodes to which edges connected to the first and third variable nodes are connected. In particular, as denoted by the bolded edges, an edge connected to the first variable node $v(1)$ and was initially connected to the first check node $c(1)$ is changed to being connected to the third check node $c(3)$. In addition, an edge that connected to the third variable node $v(3)$ and was initially connected to the first check node $c(1)$ is changed to being connected to the fourth check node $c(4)$. Additionally, FIG. 17B shows further connection modifications made to keep the same the total number of connections to each of the four check nodes $c(1)$ to $c(4)$. In particular, and as indicated by the bolded edges in FIG. 17B, an edge connected to the fourth variable node $v(4)$ and initially connected to the fourth check node $c(4)$ is changed to being connected to the first check node $c(1)$, and an edge connected to the ninth variable node $v(9)$ and initially connected to the third check node $c(3)$ is changed to being connected to the first check node $c(1)$.

A result of the codebook modification shown in FIG. 17B is the originally identified short cycle is broken up or removed from the codebook, and newly formed short cycles have improved minimal cycle metrics. For example, a newly formed minimal cycle includes an edge connecting the first variable node $v(1)$ to the second check node $c(2)$, an edge connecting the second check node $c(2)$ to the second variable node $v(2)$, an edge connecting the second variable node $v(2)$ to the third check node $c(3)$, and an edge connecting the third check node $c(3)$ to the first variable node $v(1)$. While the length and total number of variable nodes for the newly formed minimal cycle has stayed the same at four and two, respectively, the number of participating bad variable nodes is reduced from two to one (i.e., it includes only the first variable node $v(1)$ instead of both the first and third variable nodes $v(1)$ and $v(3)$). Similarly, other newly minimal cycles may include both the first and third variable nodes $v(1)$ and $v(3)$, but may have respective lengths larger than 4 and/or include more than two participating variable nodes.

For simplicity, the example codebook modification illustrated in FIGS. 17A and 17B shows modifying the codebook by identifying and removing a single minimal cycle. In other example configurations, more than one minimal cycle be identified and/or removed for a given permutation. Also, in the example codebook modification illustrated in FIGS. 17A and 17B, the minimal cycle identified as a candidate minimal cycle was also the minimal selected to be the subject of the codebook modification. In other example configurations, as mentioned, there may be more than one minimal cycle identified as a candidate, but less than all of the minimal cycles are selected for modification. Various configurations for selecting minimal cycles for codebook modification based on number of participating bad variable nodes may be possible.

In addition, the codebook modification module 1502 may be configured to generate a single modification or permutation of an existing codebook or multiple modifications. For example, with reference to FIGS. 16A-17B, the codebook modification module 1502 may determine several possible different ways to modify the edges between the variable nodes and the check nodes in order to reduce the numbers of bad variables connected to given check nodes and/or the numbers of bad variables participating in minimal cycles. In the event that the codebook modification module 1502 generates multiple modifications or permutations, the controller 102, such as with the ECC engine 124, may be configured to identify a best modification. For example, the ECC engine 124 may be configured to determine which modification yields the best decoding metrics, such as was described with reference to FIG. 8, or may score each of the modifications or using the scoring scheme described with reference to FIGS. 11-14.

Additionally, the codebook modification module 1502 may be configured to modify one or more existing codebooks to generate one or more modified codebooks for one or more of the plurality of memory areas of the memory dies 104. Referring back to FIG. 15, the codebook modification module 1502 may communicate with the memory area identification module 1504 to identify a memory area for which to modify one or more codebooks. In some example configurations, during a production phase, the codebook modification module 1502 may communicate with the memory area identification module 1504 to cycle through the various memory areas of the memory dies 104 to determine whether and/or how to generate modified codebooks based on the bad storage location information particular to each of the memory areas. In addition or alternatively, during operation of the memory system 100, the codebook modification module 1502 may determine whether and/or how to modify one or more codebooks for a particular memory area in response to degradation of decoding metrics when decoding data from the memory area, such as based on an increased amount of decoding time or number of decoding iterations to decode the data.

In addition, as previously described, the codebook modification module 1502, the memory area identification module 1504, and the bad storage database 1506 may be components of the memory system 100, such as components of the ECC engine 124 or another components of the controller 102. In another example embodiment, the codebook modification module 1502, the memory area identification module 1504, and the bad storage database 1506 may be components of an external computing device or system, such as a testing device or system, that is external to the memory system 100. The external computing device may have access to and/or have stored therein a codebook library that contains existing codebooks to, at least initially, be used to encode and decode data to be stored in the various memory areas. Based on the bad storage locations of the memory areas, the codebook modification module 1502 and the memory area identification module 1504 may be configured to generate modified codebooks as described with reference to FIGS. 15-17B. The external computing device may then load the modified codebooks into the codebook database 508 of the memory system 100 as the N-number of codebooks 506(1)-506(N) that the ECC engine 124 uses to encode and decode data for the various memory areas of the memory dies 104.

Figure 15:
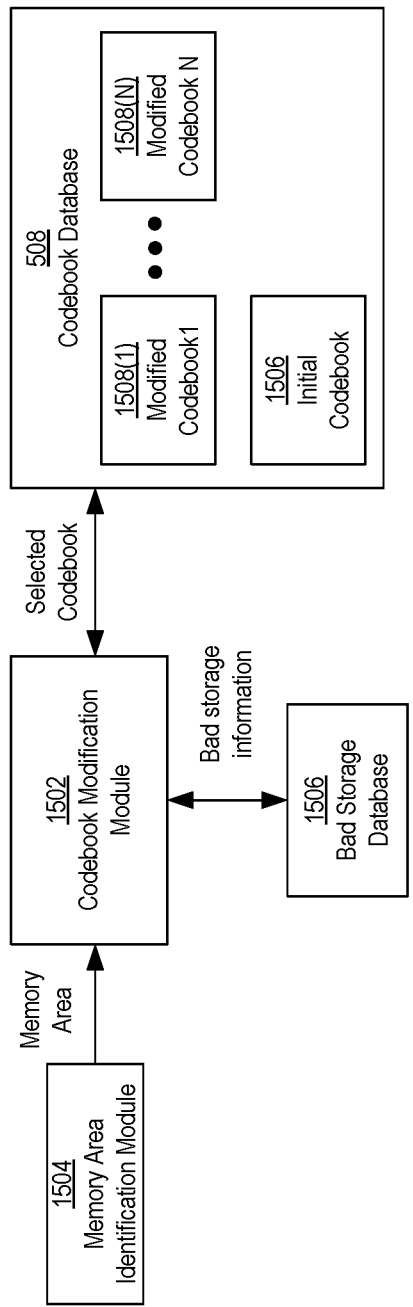
FIG. 15 is a block diagram of an example embodiment of components that may be involved in a codebook modification or permuting process based on bad storage locations.

In other example embodiments, some of the components shown in FIG. 15 may be components of the memory system 100 and the other of the components may be components of a controller of the external computing device. Which components are part of the memory system 100 and which are part of the external computing device or system may vary. For these embodiments, the components of the memory system 100 and the components of the external computing device or system may communicate with each other in order to ultimately have the modified codebooks loaded into the codebook database 508 of the memory system 100. Various ways of integrating the components shown in FIG. 15 into the memory system 100, an external computing device or system, or a combination thereof, may be possible.

Figure 18:
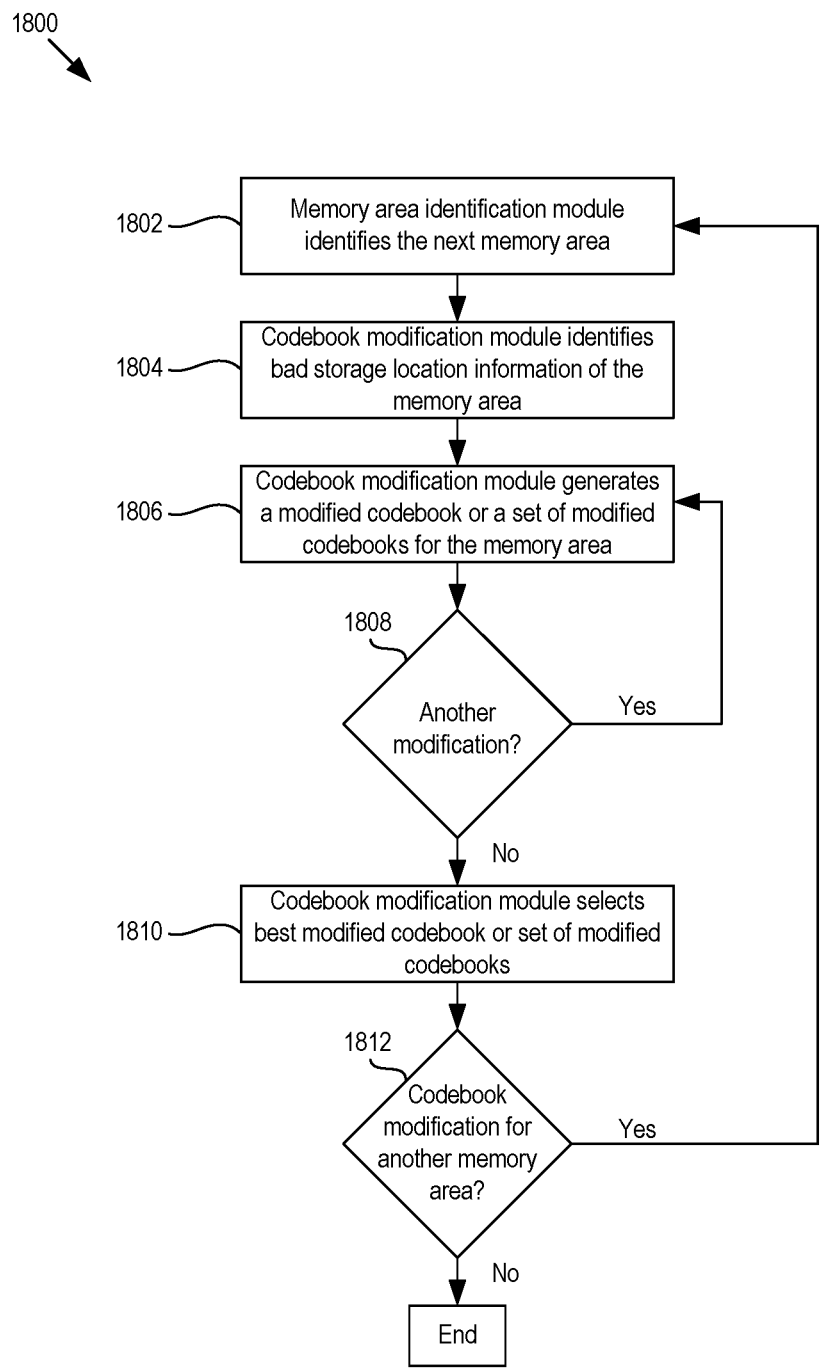
FIG. 18 is a flow chart of an example method of codebook modification.

FIG. 18 shows a flow chart of an example method 1800 of a codebook modification process that may generate one or more modified versions of one or more existing codebooks for a plurality of memory areas. At block 1802, the memory area identification module 1504 may identify a next memory area of the plurality of memory dies 104 for which to modify one or more existing codebooks used to encode and decode data stored in the memory area. If the method 1800 is in its initial iteration, the next memory area may be an initial memory area that the memory area identification module 1504 is configured to identify. At block 1804, the codebook modification module 1502 may determine the bad storage locations of the memory area, such as by accessing the bad storage database 1506.

At block 1806, the codebook modification module 1502 may generate a modified codebook for the memory area based on one or more existing codebooks using the bad storage location information the codebook modification module 1502 identified at block 2004. The codebook modification module 1502 may do so using one or more of the codebook modifications described with reference to FIGS. 15-17B, including modifying an codebook to reduce the number of bad variables connected to one or more check nodes or an existing codebook to reduce the number of bad variables participating in one or more minimal cycles.

At block 1808, the codebook modification module 1502 may determine whether there is another codebook modification to be made for the current memory area. For example, as previously described, there may be several permutations of an existing codebook or sub-codebook for a given set of bad storage locations. If so, then the method may proceed back to block 1806, where the codebook modification module 1502 may generate another modified codebook or another set of modified codebooks using the bad storage location information. Alternatively, if not, then the method may proceed to block 1810, where the codebook modification module may identify a best modified codebook or set of modified codebooks. For example, the codebook modification module 1502 may use the decode evaluation module 810 and the codebook scoring chart 812 shown in FIG. 8 to identify the modified codebook that yields the best decoding metrics. As another example, the codebook modification module 1502 may utilize the codebook scoring module 1102 shown in FIG. 11 to score the modified codebooks in order to choose the best one. In the event that the codebook modification module 1502 generated only one modified codebook or a set of modified codebooks, then block 1810 may be skipped.

At block 1812, the memory area identification module 1504 may determine whether there is another memory area for which to perform codebook modification, if so, then the method may proceed back to block 1802, where a next memory area is identified for codebook modification. If not, then the method may end.

In other example embodiments, the memory system 100 may be configured to use differently sized codebooks to generate differently sized codewords in a page of data, or use differently sized sub-codebooks to generate differently sized sub-codewords in a codeword. The sizes for the codebooks to generate differential sized codewords in a data page may be determined so that the ratio of the number of parity bits to the number of bad bits for a given codeword is the same or as close as possible for each of the codewords of a data page. Doing so may improve decoding by equalizing the error correction capability among the codewords in the data page.

In further detail, and as previously explained with reference to FIG. 4, each codeword comprising an information bit sequence and parity bits generated for the information bit sequence may be stored in a segment or unit of storage, and a plurality of units may make up a page of storage. Accordingly, the codewords stored or to be stored in a single storage page may be or make up a page of data, otherwise referred to as a data page.

The bad memory cells within a storage page of data may be unevenly distributed. Accordingly, among a plurality of storage units within a single storage page, the number of bad memory cells each storage unit may be different. As a result, where the number of parity bits used to encode the codewords stored in a storage page is the same, codewords stored in storage units having a higher number of bad memory cells may be harder to decode compared to codewords stored in storage units having a lower number of bad memory cells. This disparity in decoding performance may be offset by adjusting the number of parity bits used to encode each of the codewords to be stored in a storage page based on the number of bad memory cells in each of the storage units.

Figure 19:
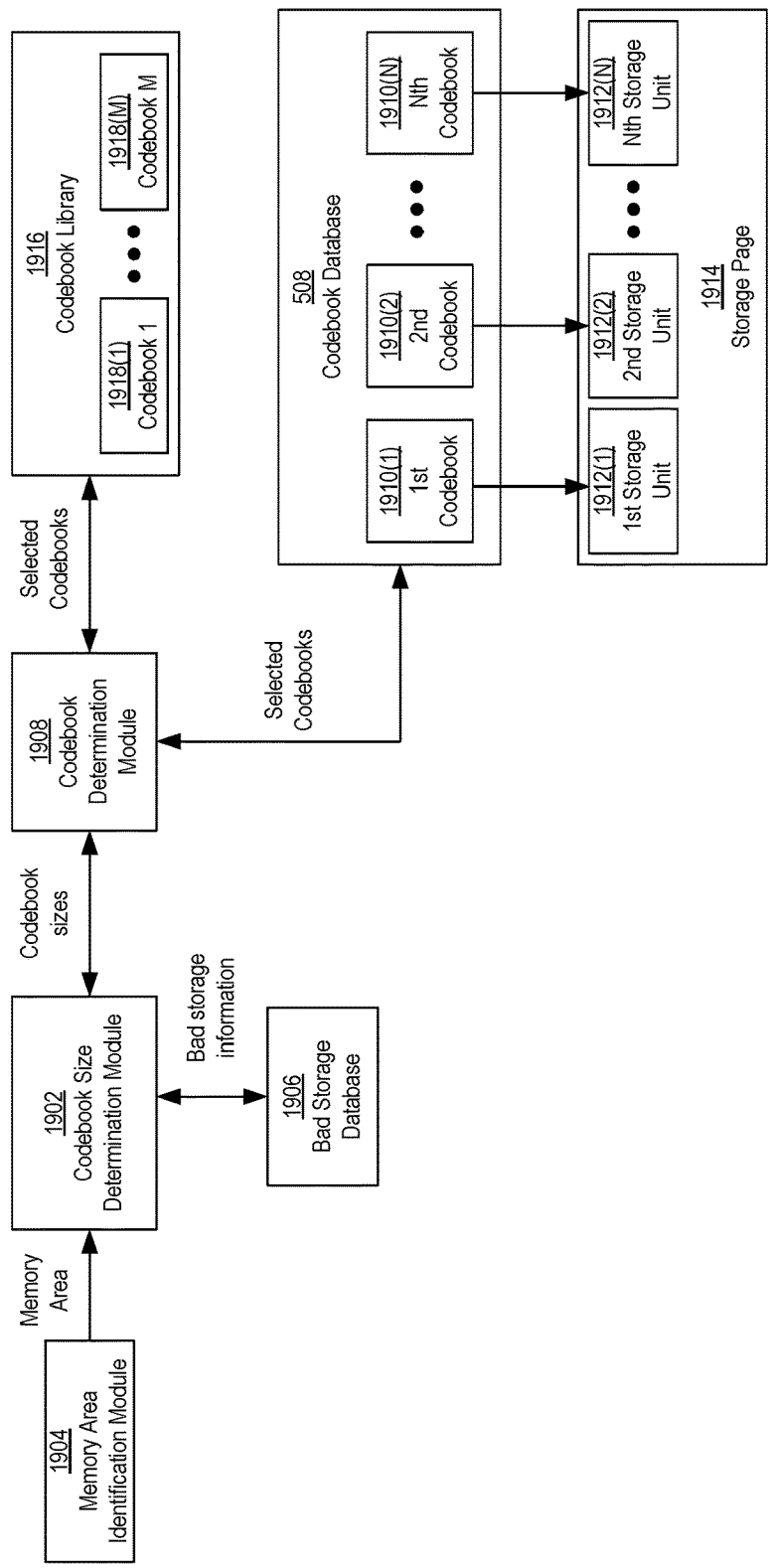
FIG. 19 is a block diagram of an example embodiment of components that may be involved in determining sizes of codebooks and determining codebooks based on the sizes.

FIG. 19 shows a block diagram of components of an example embodiment of the controller 102 that may be involved in determining sizes of codebooks used to generate codewords of the same data page. For some example configurations, the components may be components of the ECC engine 124, although in other example configurations, some or all of these components may be considered components separate from the ECC engine 124. The components involved may include a codebook size determination 1902, a memory area identification module 1904, a bad storage database 1906, which may identify bad storage locations for the various memory areas of the memory dies 104 as previously described, a codebook determination module 1908, and the codebook database 508, which may include an N-number of codebooks 1910 used to generate codewords stored in an N-number of storage units 1912 of a given storage page 1914 of a memory die 104. Also, in some example embodiments, the components may include a codebook library 1916 storing an M-number of codebooks 1918(1) to 1918(M).

In further detail, the N-number of storage units 1912 may include a first storage unit 1912(1), a second storage unit 1912(2), and extending to an Nth storage unit 1912(N). In general, there may be two or more storage units 1912 per storage page 1914 (i.e., N is two or more). The codebook database 508 may include a first codebook 1910(1) that is used to generate a first codeword stored in the first storage unit 1912(1), a second codebook 1910(2) that is used to generate a second codeword stored in the second storage unit 1912(2), and extending to an Nth codebook 1910(N) that is used to generate an Nth codeword stored in the Nth storage unit 1912(N).

The codebook size determination module 1902 may be configured to determine sizes (i.e., the number of columns and rows) for each of the codebooks 1912. The codebook size determination module 1902 may make the size determinations based on the bad storage locations and/or the numbers of bad storage locations for the given storage page 1914 and/or for each of the storage units 1912(1) to 1912 (N). The codebook size determination module 1902 may be configured to access the bad storage database 1906 to determine the bad storage locations and/or the numbers of bad storage locations. If the bad storage locations are unevenly distributed among the storage units 1912 of the given storage page 1914, then the codebook size determination module 1902 may determine that at least two of the sizes of the codebooks 1910(1) to 1910(N) are to be different from each other. In general, two codebooks may be differently-sized from each other by being configured to generate different numbers of parity bits and/or by having associated parity-check matrices with different numbers of columns, rows, or a combination thereof.

Despite having different sizes, the number of parity bits each of the codebooks 1910(1) to 1910(N) is configured to generate may be proportionate to the number of bad memory cells in each of the storage units 1912 of the given storage page 1914. In particular, the size of the codebooks 1910(1) to 1910(N) may be set so that the ratios of the number of parity bits to the number of bad memory cells for each of the storage units 1912(1) to 1912(N) of the given storage page 1914 are the same or as close as possible.

In some example configurations, the codebook size determination module 1902 may consider the number of expected failed or incorrect bit values (FBC) of a read codeword from a storage unit 1912 as a result of the bit error rate (BER) associated with the channel over which the data is communicated between the controller 102 (and/or RAM 116) and the memory die 104 that includes the given storage page 1914. The BER of the channel may be known, and the number of expected incorrect bit values may be the BER times the size of the storage unit 1914 (i.e., the number of bits the storage unit 1914 is configured to store). The codebook size determination module 1902 may then use the following two equations to identify the parity bit values $p_i$ for each ith storage unit 1912:

$$\frac{p_1}{(FBC+BBL_1)} = \frac{p_2}{(FBC+BBL_2)} = \ldots = \frac{p_N}{(FBC+BBL_N)}, \quad (14)$$

$$p_1 + p_2 + \ldots + p_N = p_{TOTAL}, \quad (15)$$

where FBC is number of expected failed or incorrect bit values for a storage unit 1912, $p_1$ is the number of parity bits the first codebook 1910(1) is to generate after codebook modification, $BBL_1$ is the number of bad bit lines associated with the first storage unit 1912(1), $p_2$ is the number of parity bits the second codebook 1910(2) is to generate after codebook modification, $BBL_2$ is the number of bad bit lines associated with the second storage unit 1912(2), $p_N$ is the number of parity bits the Nth codebook 1910(N) is to generate after codebook modification, $BBL_N$ is the number of bad bit lines associated with the Nth storage unit 1912(N), and $p_{TOTAL}$ is the total number of parity bits the data page (or the N-number of codewords) has. As previously described, the number of bad memory cells in a given storage unit 1804 may be equal to the number of bad bit lines extending through the given storage unit 1804. The codebook modification module 1502 may identify the numbers of parity bits $p_1, p_2, \ldots p_N$ using the constraints imposed by equations 14 and 15—i.e., so that equations 14 and 15 are both true.

Upon determining the sizes for each of the codebooks 1910(1) to 1910(N), the codebook size determination module 1902 may provide the sizes to the codebook determination module 1908, which in turn may be configured to determine each of the codebooks 1910(1) to 1910(N). In some example configurations, the codebook determination module 1908 may be configured to generate, such as from scratch, each of the codebooks 1910(1) to 1910(N) according to the size information received from the codebook size determination module 1902. In other example configurations, the codebook determination module 1908 may be configured to modify or permute existing versions of the codebooks 1910 to generate new versions of the codebooks 1910. For example, the N-number of codebooks 1910(1) to 1910(N) may have an initial configuration in which they are the same as each other, or at least have the same size as each other. For the initial configurations, there may be a total number of parity bits that the initial codebook(s) 1910 is/are configured to generate for the given storage page 1914. After modifying or permuting the initial codebook(s) 1910, at least two of the resulting new codebooks 1910(1) to 1910(N) may be differently sized from each other, but the total number of parity bits that the new codebooks 1910(1) to 1910(N) are configured to generate for the data page stored in the given storage page 1914 may be the same as the initial configuration. As part of the modification, the codebook determination module 1908 may be configured to add columns and rows to increase sizes of existing codebooks or subtract columns and rows to decrease sizes of existing codebooks in order to generate the new codebooks 1910(1) to 1910(N). In addition to the adding and/or subtracting of columns and rows, the codebook determination module 1908 may be configured to change values within the parity-check matrices and/or swap columns and/or rows in order to generate modified parity-check matrices according to the size information received from the codebook size determination module 1902.

For other example configurations, the codebook determination module 1908 may be configured to access the codebook library 1916 and select a set of the M-number of codebooks 1918 in the library 1916 to use for the N-number of codebooks 1910. For example, the M-number of codebooks 1918(1) to 1918(M) stored in the codebook library 1916 may include different sets of codebooks, with each set having differently sized codebooks from the other sets. Upon determining the numbers of parity bits $p_1$ to $p_N$, such as by receiving the size information from the codebook size determination module 1902, the codebook determination module 1908 may select the set of codebooks that are configured to generate or most closely generate the numbers of parity bits $p_1$ to $p_N$ that the codebook size determination module 1902 determined. Upon selection, the selected set of codebooks may be loaded into the codebook database 508 as the N-number of codebooks 1910(1) to 1910(N).

In another example configuration, the codebook size determination module 1902 may identify the sizes of sub-codebooks on a sub-codeword level. In further detail, for some example encoding and decoding schemes, an information bit sequence β may be divided or separated into a predetermined n-number of portions, where n is two or more. An example may be a 4 kilobyte (kB) information bit sequence that is divided into four 1 kB bit sequence portions.

Sub-code parity bits may be generated separately for each of the information bit sequence portions. Additionally, joint parity bits may be generated collectively for the bit sequence portions.

Figure 20A:
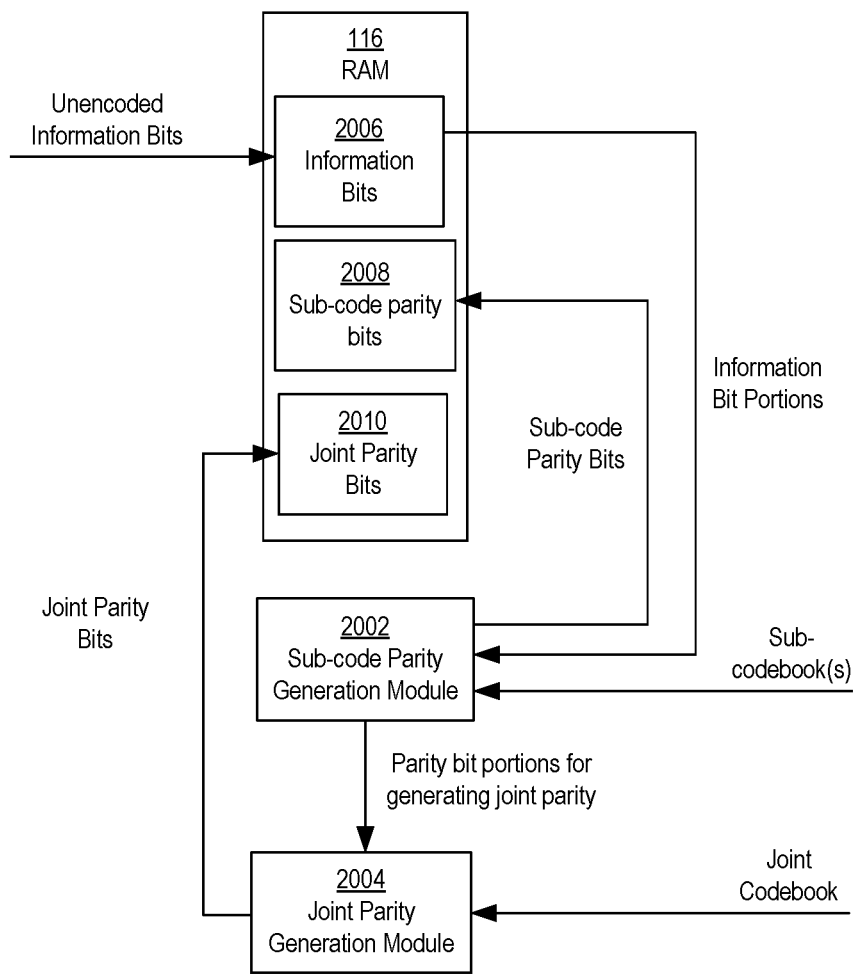
FIG. 20A is a block diagram of an example configuration of components of a parity bit generator module of FIG. 5 that may be configured to generate sub-code parity bits for information bit sequence portions of a codeword.

FIG. 20A shows a block diagram of an example configuration of components of the parity bit generator module 502 (FIG. 5) that may be configured to generate sub-code parity bits for information bit sequence portions of a codeword. The components may include a sub-code parity generation module 2002 and a joint parity generation module 2004. Also, the RAM 116 may be separated or organized into an information bit portion 2006 designated for storage of information bits of a codeword, a sub-code parity bit portion 2008 designated for storage of sub-code parity bits of the codeword, and a joint parity bit portion 2010 designated for storage of joint parity bits of the codeword.

The unencoded information bit sequence $\beta$ may be initially stored in the information bit portion 2006. The sub-code parity generation module 2002 may encode an n-number of portions of the information bit sequence $\beta$ using one or more sub-codebooks in order to generate an n-number of sub-code parity bit sequences $\delta$, each for one of the portions of the information bit sequence $\beta$. Each parity bit sequence $\delta$ may be further divided into a first sub-code parity bit portion $\delta'$ and a first joint parity bit portion $\delta''$. The first sub-code parity bit portion $\delta'$ may be transferred to the sub-code parity bit portion 2008 of the RAM 116. The combination of the first sub-code parity bit portion $\delta'$ and the associated portion of the information bit sequence $\beta$ for which the first sub-code parity bit portion $\delta'$ is generated may form a sub-codeword. Additionally, the first joint parity bit portion $\delta''$ may be sent to the joint parity generation module 2004 for further processing as described in further detail below.

To illustrate, the sub-code parity generation module 2002 may encode a first portion of the information bit sequence $\beta$ using a sub-codebook in order to generate a first parity bit sequence $\delta_1$. The first parity bit sequence $\delta_1$ may be divided into a first sub-code parity bit portion $\delta_1'$ and a first joint parity bit portion $\delta_1''$. The first sub-code parity bit portion $\delta_1'$ maybe transferred to the sub-code parity bits portion 2006 of the RAM 116, and the first portion of the information bit sequence $\beta$ combined with the first sub-code parity bit portion $\delta_1'$ may form a first sub-codeword corresponding to the information bit sequence $\beta$. Additionally, the first joint parity bit portion $\delta_2''$ may be sent to the joint parity generation module 2004. Further, the sub-code parity generation module 2002 may also encode a second portion of the information bit sequence $\beta$ using a sub-codebook in order to generate a second parity bit sequence $\delta_2$. The second parity bit sequence $\delta_2$ may be divided into a second sub-code parity bit portion $\delta_2'$ and a second joint parity bit portion $\delta_2''$. The second sub-code parity bit portion $\delta_2'$ may be transferred to the sub-code parity bits portion 2006 of the RAM 116. The second portion of the information bit sequence $\beta$ combined with the second sub-code parity bit portion $\delta_2'$ may form a second sub-codeword corresponding to the information bit sequence $\beta$. The second joint parity bit portion $\delta_2''$ may be sent to the joint parity generation module 2004. The encoding process may continue in this manner until all of the n-number of portions of the information bit sequence $\beta$ are encoded by the sub-code generation module 2002 and sub-code parity bit portions $\delta'$ are generated for each of the information bit portions and stored in the sub-code parity bit portion 2008 of the RAM 116.

The joint parity generation module 2004 may be configured to generate the joint parity bits for the codeword by performing a bitwise XOR operation on the joint parity bit portions $\delta''$. The result of the XOR operation(s), referred to as a combined joint parity bit portion $\delta'''$, may be the joint parity for the codeword and stored in the joint parity bits portion 2010 of the RAM 116. A complete codeword stored in a segment may be a combination of the sub-codewords and the combined joint parity bit portion $\delta'''$.

For decoding a codeword generated with the encoding process performed with the components of FIG. 20A, the ECC engine 124 (FIG. 2A) may decode the sub-codewords individually without using the combined joint parity bits $\delta'''$. However, if during the decoding, the ECC engine 124 determines that one or more of the bit error rates associated with the sub-codewords is too high, then the ECC engine 124 may decode the sub-codewords by combining the sub-codewords and also using the combined joint parity bits $\delta'''$. Decoding using the sub-code parity $\delta'$ and without the combined joint parity $\delta'''$ may be referred to as the normal or default mode, and decoding using the sub-code parity $\delta'$ and the combined joint parity bits $\delta'''$ may be referred to as a heroics mode.

Figure 20B:
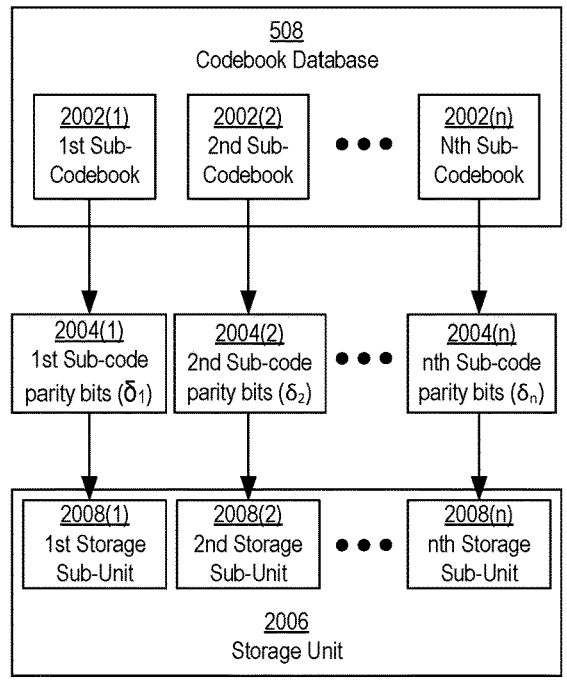
FIG. 20B is a schematic diagram of a plurality of sub-codebooks used to generate sub-codewords of a codeword.

Referring to FIG. 20B, the sub-code parity generation module 2002 may be configured to generate the n-number of sub-code parity bit sequences using an n-number of sub-codebooks 2002 loaded into the codebook database 508, including a first sub-codebook 2002(1) to generate the first sub-code parity bits $\delta_1$ 2004(1) for a first portion of the information bit sequence $\beta$, a second sub-codebook 2002(2) to generate the second sub-code parity bits $\delta_2$ 2004(2), and extending to an nth sub-codebook 2002(n) to generate the nth sub-code parity bits $\delta_n$ 2004(n).

Figure 20C:
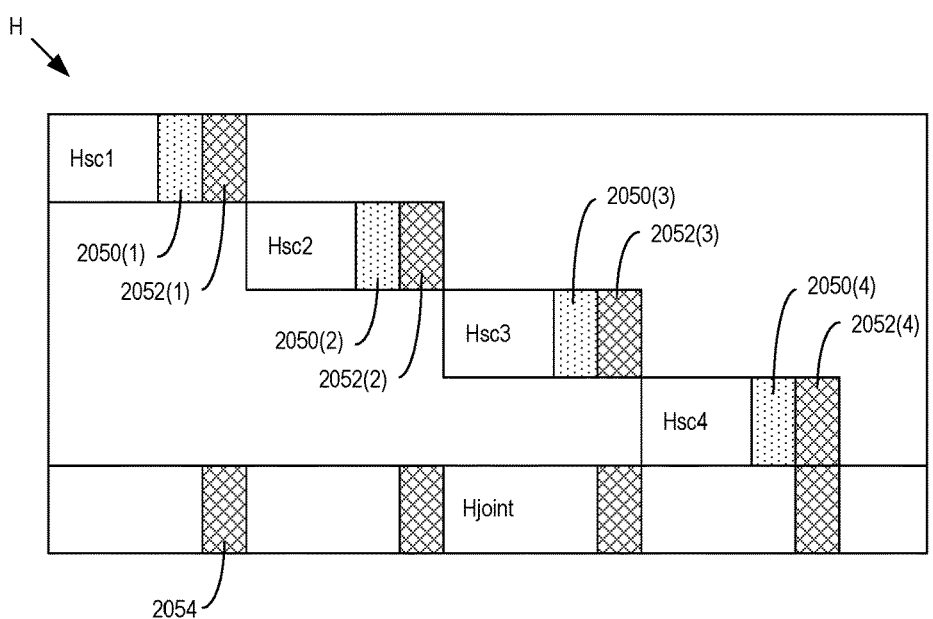
FIG. 20C is a schematic diagram of parity-check sub-matrices and a joint sub-matrix being integrated as part of a larger parity-check matrix.

Referring to FIG. 20C, sub-parity-check matrices $H_{sc1}$ to $H_{scn}$ associated with the sub-codebooks 2002(1) to 2002(n) may be and/or correspond to submatrix portions of a larger parity-check matrix H associated with the entire codeword. FIG. 20C shows a schematic diagram of an example configuration of a larger parity-check matrix H. The n-number of number of parity check matrices $H_{sc1}$ to $H_{scn}$ may correspond and/or be equal to the n-number of portions of the information bit sequence $\beta$ and/or the number of sub-codewords that are generated. The example parity-check matrix H shown in FIG. 20C includes four sub-matrices $H_{sc1}$, $H_{sc2}$, $H_{sc3}$, $H_{sc4}$ (i.e., n=4), although as mentioned, numbers other than four may be possible. Each sub-matrix $H_{sc}$ may include one or more columns 2050 corresponding to the sub-code parity and one or more columns 2052 corresponding to parity used to generate the joint parity bits. Also the larger parity-check matrix H may include a joint sub-matrix $H_{joint}$ corresponding to the joint parity bits. The joint sub-matrix $H_{joint}$ may include columns in alignment with and/or part of the same column as the columns 2052 of the sub-matrices $H_{sc}$. These columns 2054 may include elements having bit values of ones or a combination of zeros and ones. The elements of the joint sub-matrix $H_{joint}$ outside of the columns 2054 may all have bit values of zeros. In some example configurations, the joint sub-matrix $H_{joint}$ may be input and/or used by the joint parity generation module 2004 for generation of the joint parity bits.

Figure 21:
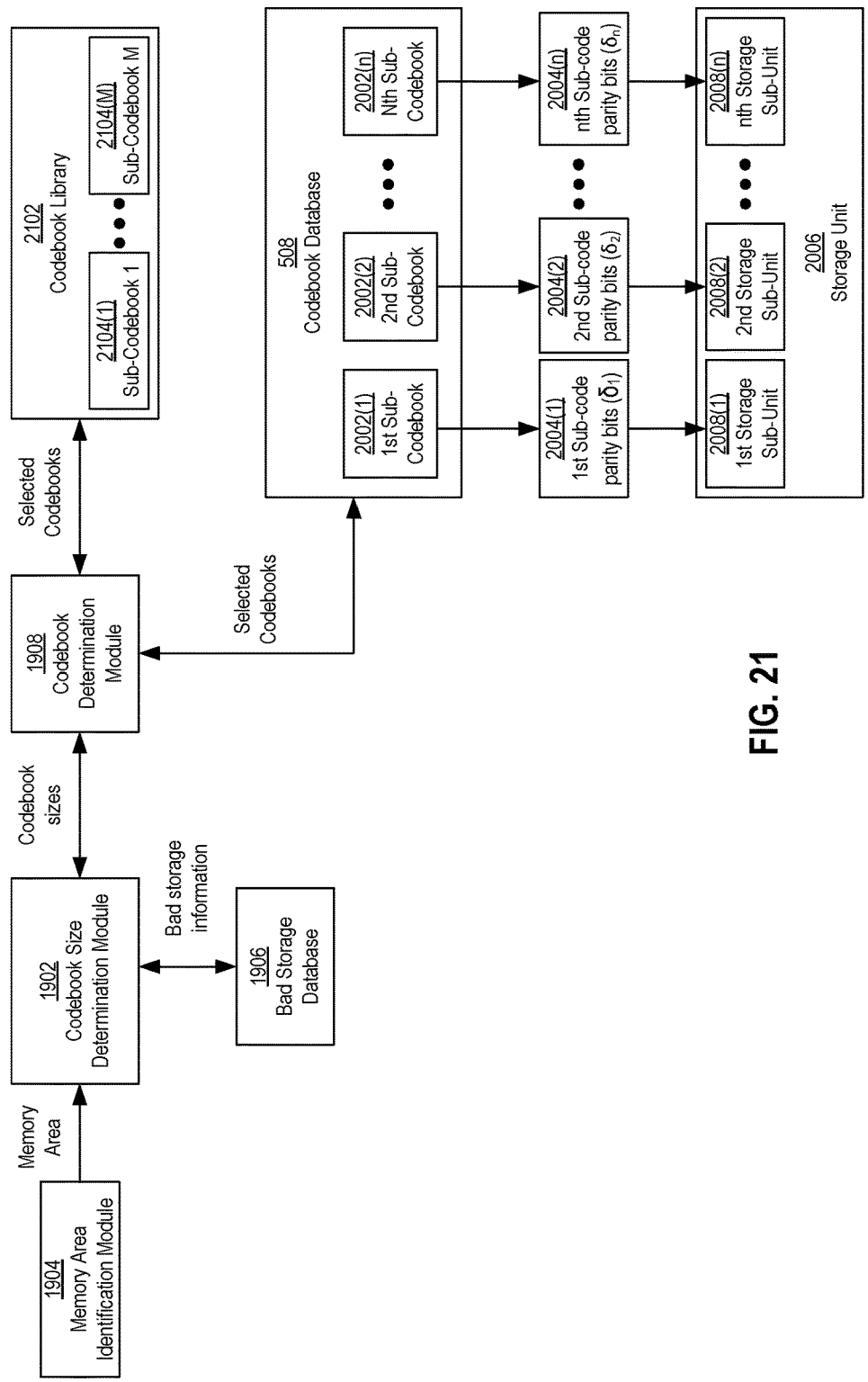
FIG. 21 is a block diagram of an example embodiment of components that may be involved in determining sizes of sub-codebooks and determining sub-codebooks based on the sizes.

Referring to FIG. 21, the codebook size modification module 1902 may be configured to identify sizes for the sub-codebooks 2002(1) to 2002(n) in a way that is similar to the way it identified the sizes of the codebooks 1910(1) to 1910(N), as described with reference to FIG. 19. Upon accessing the bad storage database 1906, the codebook size determination module 1902 may determine that the bad storage locations are unevenly distributed among the storage sub-units 2008(1) to 2008(n) of the given storage unit 2006.

In a particular example configuration, the codebook size determination module 1902 may be configured to set the sub-code parity bits each sub-codebook 2002 is configured to generate so that the ratios of the number of sub-code parity bits to the number of bad memory cells for each of the storage sub-units 2008(1) to 2084(n) of the given storage unit 2006 are the same or as close as possible. Additionally, the codebook size identification module 1902 may be configured to use equations (14) and (15) above to determine how to set the sizes of the sub-codebooks 2002(1) to 2002(n), except that in this case, $p_i$ represents the number of sub-code parity bits generated for an ith sub-codeword, $p_{TOTAL}$ represents the total number of sub-code parity bits generated for the codeword, FBC represents the number of expected number of failed or incorrect bits values for a given sub-unit 2008, and $BBL_i$ represents the number of bad bit lines in the ith storage sub-unit 2008(i).

In addition, upon determining the sizes for each of the sub-codebooks 2002(1) to 2002(N), the codebook size determination module 1902 may provide the sizes to the codebook determination module 1908, which in turn may be configured to determine each of the sub-codebooks 2002(1) to 2002(N). In some example configurations, the codebook determination module 1908 may be configured to generate, such as from scratch, each of the sub-codebooks 2002(1) to 2002(n) according to the size information received from the codebook size determination module 1902. In other example configurations, the codebook determination module 1908 may be configured to modify or permute initial or existing versions of the sub-codebooks 2002 to generate new versions of the sub-codebooks 2002, such as by adding or subtracting rows and columns to associated sub-code matrices $H_{sc}$ according to the size information. For these example configurations, the total number of sub-code parity bits that are generated by the sub-codebooks 2002(1) to 2002(n) after modification may remain the same compared to the initial versions. In other example configurations, the codebook determination module 1908 may be configured to access a codebook library 2102 and select a set sub-codebooks from an M-number of sub-codebooks 2104(1) to 2104(M) in the library 1916 that corresponds to the size information received from the codebook size determination module 1902. Upon making the selection, the codebook determination module 1908 may load the selected set into the codebook database 508 for use as the N-number of sub-codebooks 2002(1) to 2002(n).

In other example configuration of codebook modification, the codebook size determination module 1902 may be configured to identify sizes of codebooks and/or sub-codebooks based on mutual information (MI) associated with the codewords. In general, the memory system 100 may include a channel over which a codeword is transmitted from the RAM 116 to the memory dies 104 for programming into a given storage unit, and then over which the programmed codeword is transmitted from the given storage unit of the memory dies 104 back into the RAM 116 as part of a read operation. The version of the codeword prior to being communicated over the channel and programmed into the memory dies 104 unit may be referred to as the input codeword, and the version of the codeword after it is read back out of the memory dies 104 may be referred to as the output codeword. The channel is generally noisy, meaning that the output codeword will have errors, i.e., the logic levels of the bit sequence of the output codeword will not match the logic levels of the bit sequence of the input codeword. One characteristic of the channel may be its channel capacity, which may be a tight upper bound on the bit rate at which the codeword can be reliably transmitted over the channel. Mutual information of the channel may determine the channel's channel capacity. In particular, the channel's channel capacity may be maximum mutual information with respect to an input distribution of the input codeword. In actual implementation, the memory system 100 may communicate the codeword over the channel at a bit rate that is lower than the mutual information. A rate gap (or simply gap), may be a known value that defines an upper bound for the bit rate. That is, the memory system 100 may be configured to communicate the codeword over the channel at a bit rate that is lower than the mutual information minus the gap, as represented by the following inequality:

$$R < MI - G, \tag{16}$$

where R represents the bit rate at which the codeword is transmitted over the channel, MI represents the mutual information of the channel, and G represents the gap.

For a given codeword, the channel that communicated the codeword and the storage unit storing the codeword may be referred to as being associated with and/or corresponding to each other. The mutual information of a given channel and/or the associated storage unit may be based on an associated error count, which may be the sum of the number of expected failed or incorrect bit values (FBC) of the codeword transmitted on the given channel and the number of bad bit lines (BBL) of the associated storage unit storing the codeword (the number of bad bit lines may also be referred to as the number of erasures). In particular, the mutual information of a given channel may be calculated using and/or based on the following equations:

$$MI(X,Y) = H(X,Y) - H(X) - H(Y), \tag{17}$$

where X is the set of bit values of the bits of a codeword as the bit values were programmed into a storage unit of the memory dies 104, Y is the set of bits values of the bits of the codeword as the bit values were identified (e.g., by the ECC engine 124) upon being read from the storage unit over the given channel, and H is the entropy defined as:

$$H(X,Y) = -\Sigma_{x \in X, y \in Y} P(x,y) \log_2 P(x,y), \tag{18}$$

$$H(X,Y) = -\Sigma_{x \in X} P(x) \log_2 P(x) \tag{19}$$

$$H(X,Y) = -\Sigma_{y \in Y} P(y) \log_2 P(y) \tag{20}$$

where x denotes a bit value of the set of initially programmed bits values X and y denotes a corresponding bit value of the set of read bit values Y. For the given channel, the conditional probability of receiving a bit value y given a corresponding bit value x, denoted as P (y|x), may be calculated based on a model. One example model may be a binary symmetric model. Another model example may add noise, such as a Gaussian distributed noise, to each voltage level associated with each bit, which may yield various conditional probability P(y|x) values for each of the bit values in the sets X and Y. Other models may be possible. The number of expected failed or incorrect bit values (FBC) and the number of bad bits in the read codeword (i.e, the number of erasures or bad bit lines extending through the storage unit) may be inputs to and/or define the model used to define the conditional probability P(y|x) values. The programmed bit value distribution P (x) may be known. Accordingly, upon determining the conditional probability P(y|x) values, the joint distribution P(x, y) and the marginal distribution P (y) may be determined according to the following equations:

$$P(x,y) = P(x)P(y|x), \tag{21}$$

$$P(y)=\Sigma_{x\in x}P(x,y). \quad (22)$$

Upon determining the programmed bit value distribution P(x), the joint distribution P(x,y), and the marginal distribution P(y), the mutual information may be calculated using equations (17)-(20).

The bit rate at which a codeword is transmitted over the channel may also be a function of the number of parity bits of the codeword. In particular, the bit rate may be determined by the following equation:

$$R = \frac{I}{p+I}, \quad (23)$$

where R represents the bit rate of the codeword, p represents the number of parity bits of the codeword, and I represents the number of information bits of the codeword. Combining equations (16) and (23), an upper bound for the number of parity bits p of the codeword can be determined as a function of the number of information bits I, the mutual information, and the gap, as indicated by the following inequality:

$$p > \frac{I(MI - G - 1)}{G - MI}. \quad (24)$$

Referring back to FIG. 19, the codebook sized determination module 1902 may be configured to identify the sizes for the codebooks 1910(1) to 1910(N) based on associated mutual information. A given ith codebook 1910(i) may be associated with mutual information of a given channel if the channel is used to communicate a codeword that was generated using the ith codebook 1910(i). For example, the first codebook 1910(1) is used to generate parity bits for a codeword stored in the first storage unit 1910(1) of the storage page 1802, and so the mutual information of the channel used to communicate a codeword stored in the first storage unit 1910(1) may be considered to be associated with the first codebook 1806(1).

To determine the sizes for the codebooks 1910(1) to 1910(N), the codebook size determination module 1902 may determine the mutual information associated with each of the codebooks 1910(1) to 1910(N). To do so, the codebook modification module 102 may access the bad storage database 1906 to identify the bad storage locations for the given storage page 1914 and/or for each of the storage units 1912(1) to 1912(N). If the bad storage locations are unevenly distributed over the storage units 1912(1) to 1912(N), then the codebook size determination module 1902 may determine that at least two of the codebooks 1910(1) to 1910(N) will be differently sized from each other based on the associated mutual information. In particular, the codebook modification module 1502 may be configured to determine error counts for each of the storage units 1912(1) to 1912(N). As previously described, for a given ith storage unit 1912(i), the associated error count may be the sum of the expected failed or incorrect bit values (FBC) of a codeword read from the given storage unit 1912(i) and the number of bad bit lines (BBL$_i$) associated with the given storage unit 1912(i). The codebook size determination module 1902 may be configured to determine the number of associated bad bit lines based on the bad storage location information obtained from the bad storage database 1906. The codebook size determination module 1902 may then be configured to determine a mutual information value associated with each of the codebooks 1910(1) to 1910(N) based on the associated error counts, such as by using one or more of equations (17)-(20) above. Then, using equation (22), the codebook size determination module 1902 may be configured to determine amounts of parity bits to be generated by each of the codebooks 1910(1) to 1910(N), with the additional constraint that the total number of parity bits generated by the codebooks 1910(1) to 1910(N) may not exceed the initial number of parity bits $p_{TOTAL}$ of a data page stored in the storage page 1914, as represented by the following inequality:

$$p_1+p_2+\ldots+p_N \leq p_{TOTAL} \quad (25)$$

Upon determining the sizes for each of the codebooks 1910(1) to 1910(N), the codebook size determination module 1902 may send the size information to the codebook determination module 1908. In response, the codebook determination module 1908 may determine the codebooks 1910(1) to 1910(N) in the same way as previously described.

In another example configuration, the codebook size determination module 1902 may be configured to identify sizes for sub-codebooks based on mutual information on a sub-code level. Referring back to FIG. 20B, for a given storage unit 2006, if the bad storage locations are unevenly distributed across the storage sub-units 2008(1) to 2008(n), then the codebook size determination module 1502 may identify the sizes of two or more sub-matrices $H_{sc}$ to be different from each other based on mutual information associated with each of the sub-codebooks 2002(1) to 2002(n). The codebook size determination module 1902 may be configured to determine the numbers of sub-code parity bits for each of the sub-codewords using equations (16)-(25), except that p may represent the number of sub-code parity bits of a sub-codeword, I may represent the number of information bits of a sub-codeword, and $p_{TOTAL}$ may represent the number of parity bits of a codeword.

Additionally, the codebook size determination module 1902 may be configured to identify sizes for an N-number of codebooks 1910(1) to 1910(N) and/or an n-number of sub-codebooks 2002(1) to 2002(n) for one or more of the plurality of memory areas of the memory dies 104. Referring to either FIG. 19 or 21, the codebook size determination module 1902 may communicate with the memory area identification module 1904 to identify a memory area for which to determine sizes of codebooks and/or sub-codebooks. In some example configurations, during a production phase, the codebook size determination module 1902 may communicate with the memory area identification module 1904 to cycle through the various memory areas of the memory dies 104 to determine sizes for codebooks and/or sub-codebooks for the respective memory areas based on the bad storage location information particular to each of the memory areas. In addition or alternatively, during operation of the memory system 100, the codebook size determination module 1902 may determine whether new sizes for codebooks and/or sub-codebooks for a particular memory area in response to degradation of decoding metrics when decoding data from the memory area, such as based on an increased amount of decoding time or number of decoding iterations to decode the data.

In addition, as previously described, the codebook size determination module 1902, the memory area identification module 1904, the bad storage database 1906, and the codebook determination module 1908 may be components of the memory system 100, such as components of the ECC engine 124 or another components of the controller 102. In other example embodiments, the codebook size determination module 1902, the memory area identification module 1904, the bad storage database 1906, and the codebook determination module 1908 may be components of an external computing device or system, such as a testing device or system, that is external to the memory system 100. In some of these embodiments, the external computing device may have access to and/or have stored therein the codebook library 1916. Based on the bad storage locations of the memory areas, the codebook size determination module 1902 may be configured to identify sizes for the codebooks and/or sub-codebooks of the various memory areas, and the codebook determination module 1908 may be configured to determine the codebooks and/or sub-codebooks based on the size information received from the codebook size determination module 1092. The external computing device may then load the codebooks and/or sub-codebooks into the codebook database 508. Thereafter, such as during normal operation of the memory system 100, the ECC engine 124 may use the loaded codebooks and/or sub-codebooks with the varying sizes to encode and decode data for the various memory areas of the memory dies 104.

In other example embodiments, some of the components shown in FIGS. 19 and 21 may be components of the memory system 100 and the other of the components may be components of a controller of the external computing device or system. Which components are part of the memory system 100 and which are part of the external computing device or system may vary. For these embodiments, the components of the memory system 100 and the components of the external computing device or system may communicate with each other in order to ultimately have the determined codebooks loaded into the codebook database 508 of the memory system 100. Various ways of integrating the components shown in FIGS. 19 and 21 into the memory system 100, an external computing device or system, or a combination thereof, may be possible.

Figure 22:
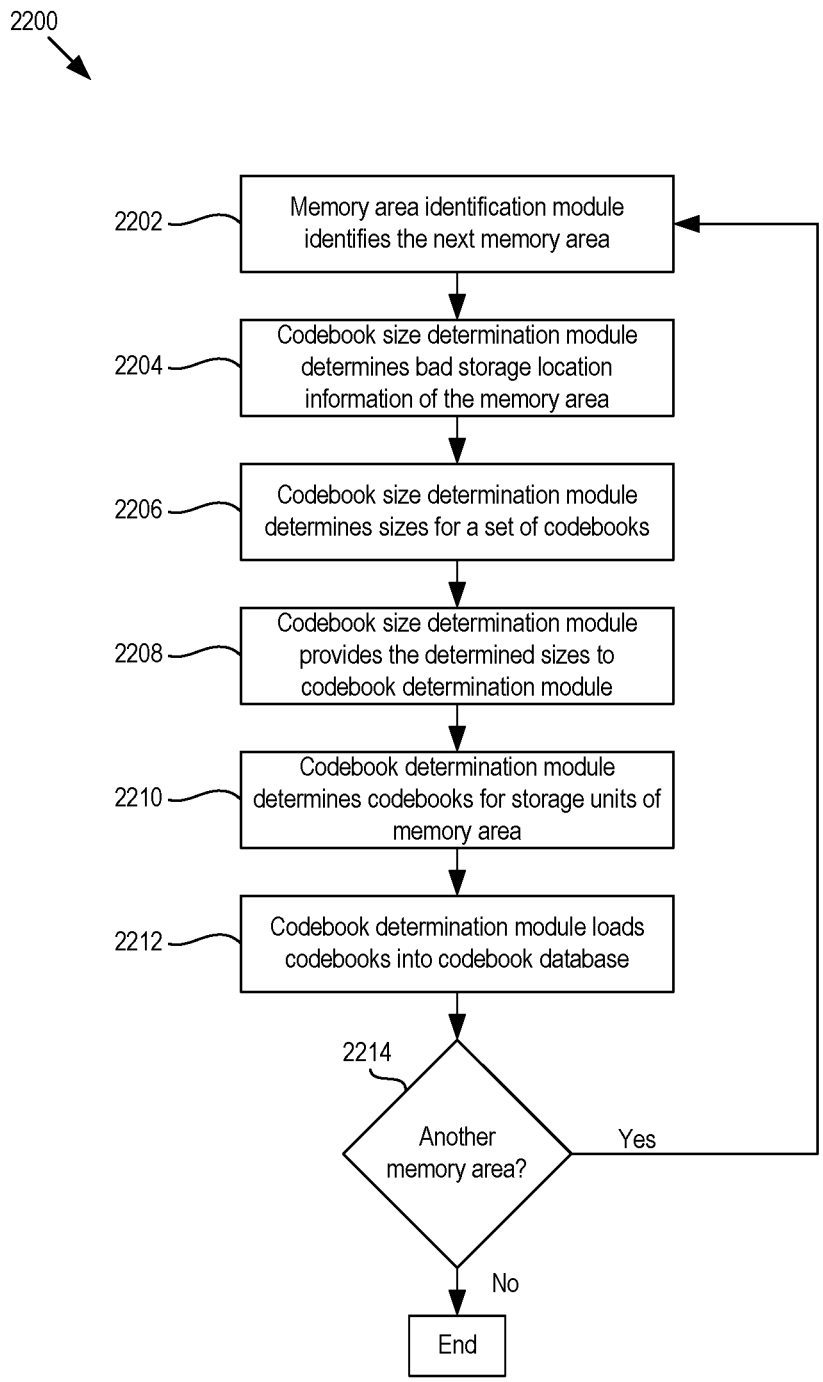
FIG. 22 is a flow chart of an example method of a codebook determination process that may determine codebooks based on size determinations for the codebooks for a plurality of memory areas.

FIG. 22 shows a flow chart of an example method 2200 of a codebook determination process that may determine codebooks based on size determinations for the codebooks for a plurality of memory areas. In some example methods, a particular memory area may be a plane or a particular storage page, and codebooks and associated sizes of codebooks are determined for storage pages in that plane or particular storage page.

At block 2202, the memory area identification module 1904 may identify a next memory area of the plurality of memory dies 104 for which to determine codebooks used to encode and decode data stored in the memory area. If the method 2200 is in its initial iteration, the next memory area may be an initial memory area that the memory area identification module 1904 is configured to identify. At block 2204, the codebook size determination module 1902 may determine the bad storage locations and/or the numbers of bad storage locations of the memory area, such as by accessing the bad storage database 1906.

At block 2206, the codebook size determination module 1902 may determine sizes for a set of codebooks used and/or numbers of parity bits generated by the set of codebooks to encode and decode data stored in the memory area identified at block 2202. If the bad storage locations are unevenly distributed across the memory area, then at least two of the codebooks may be configured to generate different numbers of parity bits and/or associated parity-check matrices may be differently sized. The codebook size determination module 1902 may determine the sizes based on ratios of parity bits to bad bits in codewords, such that the ratio of the number of parity bits to the number of bad bits for a given codeword stored in a storage unit of the memory area is the same or as close as possible for a plurality of codewords stored in the same storage page of the memory area, as previously described. In addition or alternatively, the codebook size determination module 1902 may determine the sizes based on mutual information associated with each of the codewords stored in the same storage page of the memory area. The codebook size determination module 1902 may then use the associated mutual information to determine sizes and/or a number of parity bits each codebook is to generate, such as by using equations (16)-(25), as previously described.

At block 2208, the codebook size determination module 1902 may provide the size information determined at block 2206 to the codebook determination module 1908. In response, at block 2210, the codebook determination module 1908 may determine codebooks for the storage units of the memory area. In some example methods, the codebook determination module 1908 may determine the codebooks by generating the codebooks according to the size information. In other example methods, the codebook determination module 1908 may determine the codebooks by selecting the codebooks from the codebook library 1916 using the size information receive from the codebook size determination module 1902.

At block 2212, the codebook determination module 1908 may load the codebooks into the codebook database 508. In some example methods, the codebook determination module 1908 may not load the determined codebooks into the codebook database 508 until after the codebook determination module 1908 has determined codebooks for all of the memory areas. At block 2214, the memory area identification module 1904 may determine whether there is another memory area for which to determine codebooks. If so, then the method may proceed back to block 2202, where a next memory area is identified. If not, then the method may end.

Figure 23:
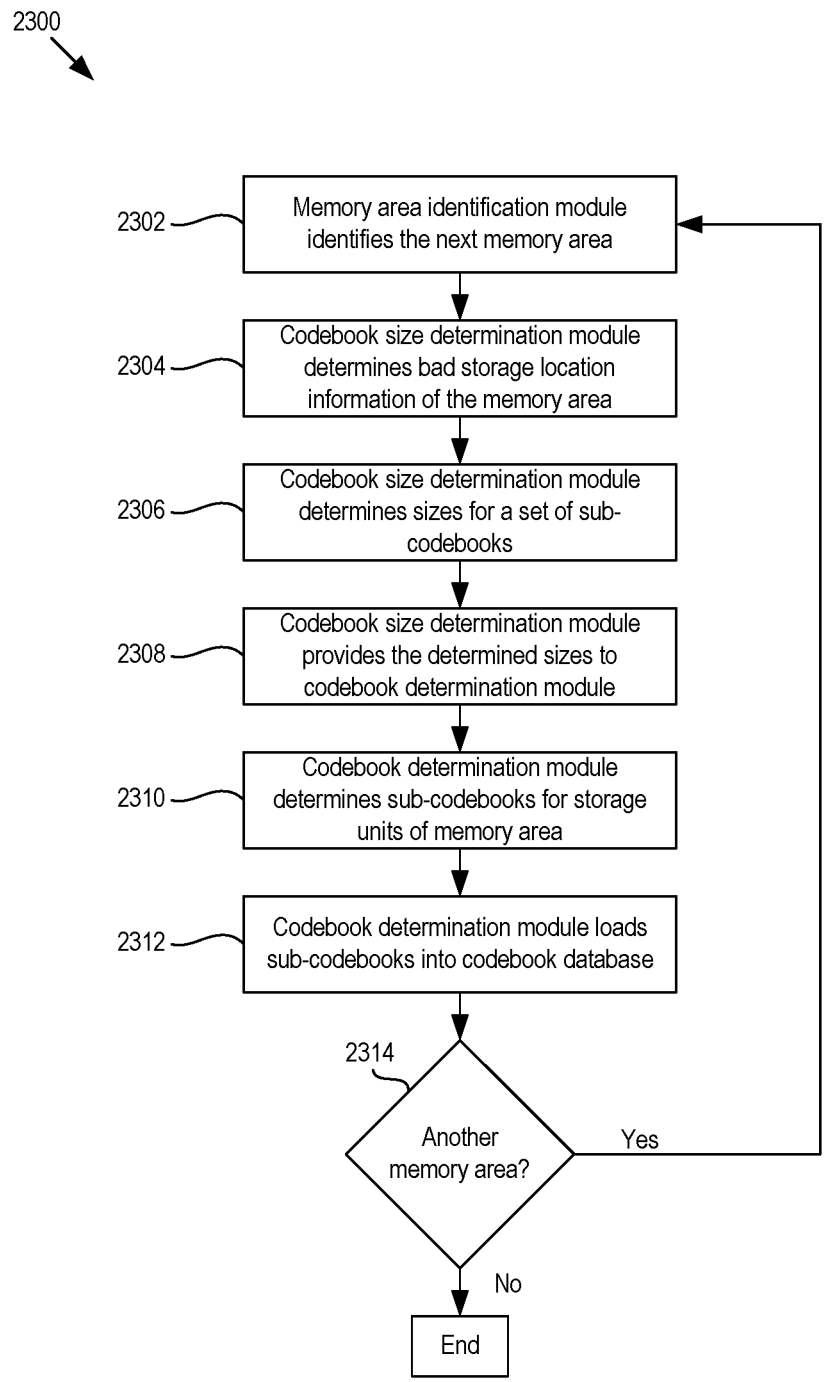
FIG. 23 is a flow chart of an example method of a sub-codebook determination process that may determine sub-codebooks based on size determinations for the sub-codebooks for a plurality of memory areas.

FIG. 23 shows a flow chart of an example method 2300 of a sub-codebook determination process that may determine sub-codebooks based on size determinations for the sub-codebooks for a plurality of memory areas. In some example methods, a particular memory area may be a sub-plane or a particular storage unit, and sub-codebooks and associated sizes of sub-codebooks are determined for storage units in that sub-plane or particular storage unit.

At block 2302, the memory area identification module 1904 may identify a next memory area of the plurality of memory dies 104 for which to determine sub-codebooks used to encode and decode data stored in the memory area. If the method 2300 is in its initial iteration, the next memory area may be an initial memory area that the memory area identification module 1904 is configured to identify. At block 2304, the codebook size determination module 1902 may determine the bad storage locations and/or the numbers of bad storage locations of the memory area, such as by accessing the bad storage database 1906.

At block 2306, the codebook size determination module 1902 may determine sizes for a set of sub-codebooks used and/or numbers of parity bits generated by the set of sub-codebooks to encode and decode data stored in the memory area identified at block 2202. If the bad storage locations are unevenly distributed across the memory area, then at least two of the sub-codebooks may be configured to generate different numbers of parity bits and/or associated subcode parity-check matrices may be differently sized. The codebook size determination module 1902 may determine the sizes based on ratios of parity bits to bad bits in sub-codewords, such that the ratio of the number of parity bits to the number of bad bits for a given sub-codeword stored in a storage sub-unit of the memory area is the same or as close as possible for a plurality of sub-codewords stored in the same storage unit of the memory area, as previously described. In addition or alternatively, the codebook size determination module 1902 may determine the sizes based on mutual information associated with each of the sub-codewords stored in the same storage unit of the memory area. The codebook size determination module 1902 may then use the associated mutual information to determine sizes and/or a number of parity bits each sub-codebook is to generate, such as by using equations (16)-(25), as previously described.

At block 2308, the codebook size determination module 1902 may provide the size information determined at block 2306 to the codebook determination module 1908. In response, at block 2310, the codebook determination module 1908 may determine sub-codebooks for the storage sub-units of the memory area. In some example methods, the codebook determination module 1908 may determine the sub-codebooks by generating the sub-codebooks according to the size information. In other example methods, the codebook determination module 1908 may determine the sub-codebooks by selecting the sub-codebooks from the codebook library 1916 using the size information receive from the codebook size determination module 1902.

At block 2312, the codebook determination module 1908 may load the sub-codebooks into the codebook database 508. In some example methods, the codebook determination module 1908 may not load the determined sub-codebooks into the codebook database 508 until after the codebook determination module 1908 has determined sub-codebooks for all of the memory areas. At block 2314, the memory area identification module 1904 may determine whether there is another memory area for which to determine sub-codebooks. If so, then the method may proceed back to block 2302, where a next memory area is identified. If not, then the method may end.

In other example embodiments, the memory system 100 may utilize a combination of codebook modification and size modification to determine codebooks for a given memory area. For example, the codebook determination module 1908 may determine a set of codebooks to encode and decode codewords stored in storage page, or a set of sub-codebooks to encode and decode sub-codewords stored in a storage unit, based on size information received from the codebook size determination module 1902. Thereafter, the codebook modification module 1502 may perform a codebook modification process to modify one or more of the codebooks or sub-codebooks in the set, such as based on the numbers of bad variables connected to check nodes and/or the numbers of variables participating in minimal cycles, as described with reference to FIGS. 15-17B. In other example embodiments, the codebook size determination module 1902 and codebook determination module 1904 may be configured to analyze the bad storage locations across a given storage page to determine a set of codebooks for the given storage page, and also bad storage locations across the individual data units of the given storage page to determine to sub-codebooks or sub-matrices within each of the codebooks in the sets.

In other example embodiments, instead of evaluating a plurality of codebooks from a library based on decoding metrics (as described with reference to FIGS. 8-10), using a scoring algorithm (as described with reference to FIGS. 11-14), modifying one or more codebooks and/or sub-codebooks (as described with reference to FIGS. 15-18), or determining sets of codebooks and/or sub-codebooks based on codebook size information (as described with reference to FIGS. 19-23), the memory system 100 may leverage information about the bad storage locations of a memory area to improve decoding performance by using the bad storage location information to modify a bit sequence of a codeword after encoding but before the codeword is stored in the memory area.

Figure 24:
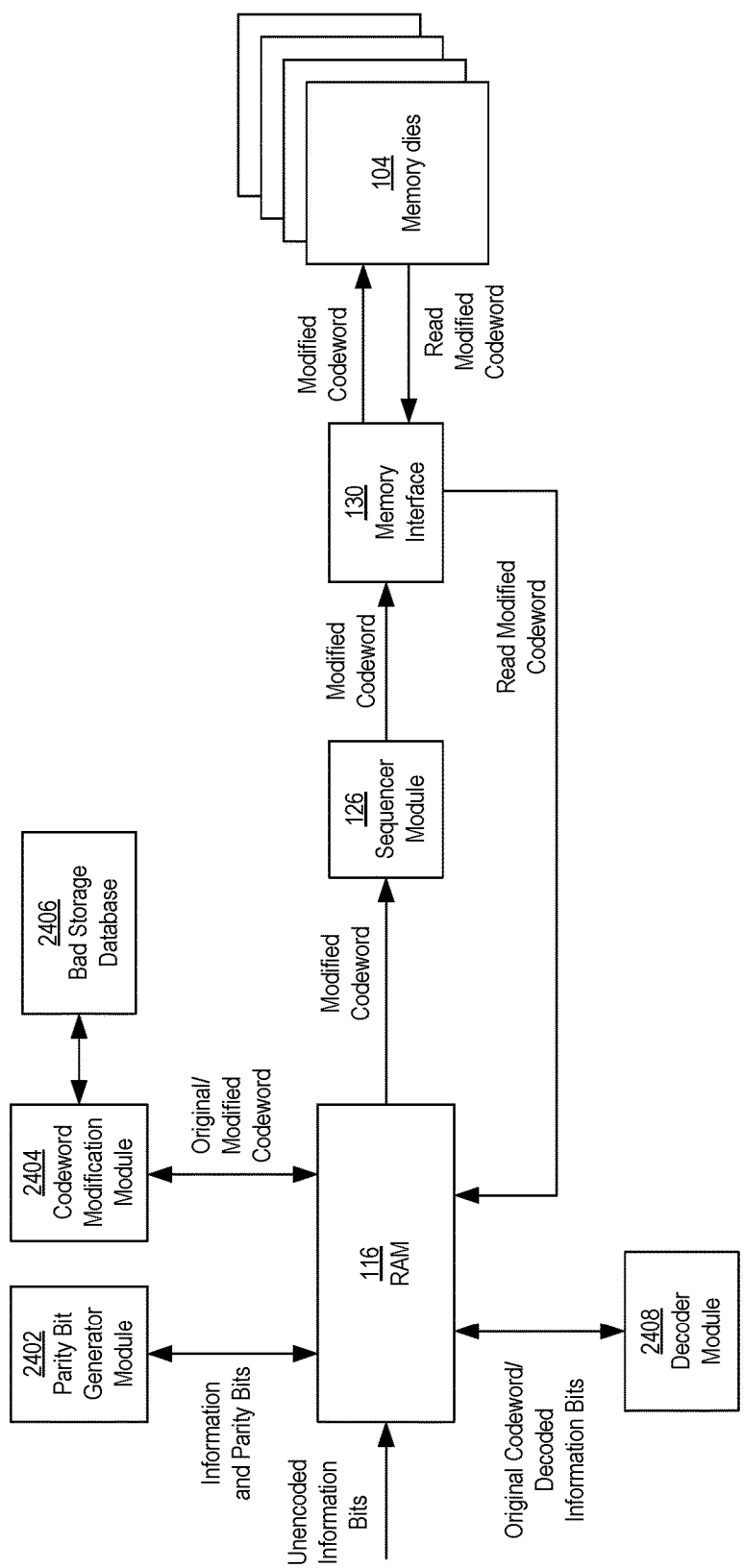
FIG. 24 is a block diagram of an example embodiment of components that may be involved in codeword modification based on bad storage location information of a memory area.

FIG. 24 shows a block diagram of components of an example embodiment of the controller 102 that may be involved in codeword modification based on bad storage location information of a memory area. For some example configurations, the components other than the RAM 116 may be components of the ECC engine 124, although in other example configurations, some or all of these components may be considered components separate from the ECC engine 124. In addition to the RAM 116, the components involved in the codeword modification process may include a parity bit generator module 2402, a codeword modification module 2404, a bad storage database 2406, and a decoder module 2410.

As previously described with reference to FIG. 5, when a host wants data stored in the memory dies 104, the data may be first stored in the RAM 116 as unencoded information bits. The parity bit generator module 2402 may generate parity bits for unencoded information bits, and the information bits combined with the parity bits may form an original codeword, which may be stored in the RAM 116. Upon the codeword being formed, the codeword modification module 2404 may be configured to access the RAM 116 and change the bit order or bit sequence of the original codeword in order to generate a modified codeword. The modification may be based on the bad storage location information of the memory area in which the codeword is to be stored. In order to modify the original codeword, the codeword modification module 2404 may be configured to identify the bad storage location information, such as by accessing the bad storage database 2406. Further details how the encoder-side codeword modification module 2404 may modify the original codeword based on the bad storage location information is described in further detail below.

After the codeword modification module 2404 generates the modified codeword, the modified codeword may be sent to the memory dies 104 via the sequencer module 126 and the memory interface 130, where the modified codeword is programmed into the memory area. When the modified codeword is read from the memory area, such as in response to a host read request, the modified codeword may be transferred into the RAM 116. The codeword modification module 2404 may then be configured to unmodify or reverse modify the modified codeword so that the codeword is in its original form prior to modification. Thereafter, the decoder module 2408 may decode the original codeword, and the decoded information bits may be stored in the RAM 116 for transfer to the host to complete the read request.

In general, the codeword modification module 2404 may be configured to modify a codeword by changing the order of the bit sequence, which in turn, affects which bits of the codeword are stored in which memory cells of the storage unit that is to store the codeword. The codeword modification module 2404 may use the bad storage location information to determine which bits to change.

In one example configuration of codeword modification, the codeword modification module 2404 may modify the bit sequence of the codeword based on numbers of bad variables connected to check nodes. As previously described with reference to FIGS. 15, 16A and 16B, the codebook modification module 1502 may identify which variable nodes are bad variable nodes and modify the codebook based on identifying candidate check nodes that are connected to a relatively high number of bad variable nodes. In the example described with reference to FIGS. 16A and 16B, the codebook modification module 1502 identified the second check node c(2) as a candidate check node since it was connected to three bad variables nodes, v(2), v(7), and v(12). As described, one way the codebook modification module 1502 could modify the codebook is by changing one edge connected to the second variable v(2) from being connected to the second check node c(2) to being connected to the first check node c(1), and also changing another edge connected to the fifth variable v(5) from being connected to the first check node c(1) to being connected to the second check node c(2), which is shown in FIG. 16B.

The codeword modification module 2404 may be configured to identify candidate check nodes the same way that the codebook modification module 1502 identified candidate check nodes. However, instead of modifying the codebook by changing the edges, the codeword may be generated using the existing codebook, and after the codeword is generated, the codeword modification module 2404 may swap the second bit associated with the second variable node v(2) with the fifth bit associated with the fifth variable node v(5). Swapping the second and fifth bits effectively makes the fifth variable node v(5) a bad variable node and the second variable node v(2) a good variable node, and in turn effectively reduces the number of bad variable nodes connected to the second variable node c(2). Thus, the problem of decoding performance being degraded by having check nodes connected to too many bad variable nodes may be alleviated by performing bit swapping instead of codebook modification.

In another example configuration of codeword modification, the codeword modification module 2404 may modify the bit sequence of the codeword based on numbers of bad variables participating in minimal cycles. As previously described with reference to FIGS. 15, 17A and 17B, the codebook modification module 1502 may identify which variable nodes are bad variable nodes and modify the codebook based on identifying candidate minimal cycles that have a relatively large number of bad variable nodes participating in them. In the example described with reference to FIGS. 17A and 17B, the codebook modification module 1502 identified a minimal cycle that includes bad variable nodes v(1) and v(3). The codebook modification module 1502 modified the codebook by breaking up the candidate minimal cycle. In particular, the codebook modification module 1502 changed an edge connected to the first variable node v(1) from being connected to the first check node c(1) to being connected to the third check node c(3), an edge connected to the third variable node v(3) from being connected to the first check node c(1) to being connected to the fourth check node c(4), an edge connected to the fourth variable node v(4) from being connected to the fourth check node c(4) to being connected to the first check node c(1), and an edge connected to the ninth variable node v(9) from being connected to the third check node c(3) to being connected to the first check node c(1), as was previously described with reference to FIG. 17B.

The codeword modification module 2404 may be configured to identify candidate minimal cycles and bad variable nodes participating in the candidate minimal cycles the same way that the codebook modification module 1502 identified them. However, instead of modifying the codebook by changing the edges, the codeword may be generated using the existing codebook, and after the codeword is generated, the codeword modification module 2404 may swap the first and third bits associated with the first and third variable nodes v(1), v(3) with the fourth and ninth bits associated with the fourth and ninth variable nodes v(4), v(9). Swapping the first and third bits with the fourth and ninth bits effectively makes the fourth and ninth variable nodes v(4), v(9) bad variable nodes and the first and third variable nodes v(1), v(3) good variable nodes. The result of the swapping may effectively reduce the proportion of bad variable nodes participating in minimal cycles. Thus, the problem of decoding performance being degraded by having too many bad variable nodes participating in minimal cycles may be alleviated by performing bit swapping instead of codebook modification.

In another example configuration of codeword modification, the codeword modification module 2404 may modify the bit sequence of the codeword based on the distribution of bad storage locations over a storage unit. As previously described with reference to FIGS. 20A-20C, sub-codewords may be generated using one or more sub-codebooks. However, instead of determining sizes for sub-codebooks and determining the sub-codebooks based on the sizes as described with reference to FIGS. 20A-20C and 21, the codeword modification module 2404 may be configured to swap bits across sub-codewords such that the same number of bad bits, or as close to the same number of bad bits as possible, will be included in each read sub-codeword that is decoded by the ECC engine 124.

To illustrate, suppose a codeword includes four sub-codewords, including a first sub-codeword that is to be stored in a first storage sub-unit of a storage unit, a second sub-codeword that is to be stored in a second storage sub-unit of the storage unit, a third sub-codeword that is to be stored in a third storage sub-unit of the storage unit, and a fourth sub-codeword that is to be stored in a fourth storage sub-unit of the storage unit. In addition, suppose that each sub-codeword has the same size. Further, suppose that the bad storage database 2406 indicates that the first storage sub-unit includes one bad memory cell, the second storage sub-unit includes five bad memory cells, the third storage sub-unit includes three bad memory cells, and the fourth storage sub-unit includes three bad memory cells. After generating the four sub-codewords, the codeword modification module 2404 may be configured modify the bit order of the codeword such that two good bits (i.e., bits to be stored in good memory cells) from the first sub-codeword are swapped with two bad bits (i.e., bits to be stored in bad memory cells) from the second sub-codeword, which effectively turns the two good bits into bad bits, and the two bad bits into good bits. As a result, each sub-codeword of the modified codeword includes three bad bits. Subsequently, when the modified codeword is read from the memory dies 104, the pairs of bits are re-swapped so that the codeword is in its original bit sequence. But when the decoder module 2408 decodes the sub-codeword, there will still be three bad bits in each sub-codeword that the decoder module 2408 decodes. Swapping bits among sub-codewords prior to programming the codeword such that the number of bad bits in each read sub-codeword are the same may improve decoding performance (e.g., correction capability) of the decoder module 2408, compared to situations where some sub-codewords have larger amounts of bad bits than others.

Although the codeword modification module 2404 is described with reference to FIG. 24 as being a component of the controller 102, in other example configurations, the codeword modification module 2404 may be located on the memory dies. For these other example configurations, the codeword in its original form may be sent to the memory dies 104 via the sequencer module 126 and the memory interface 130. Once the codeword is sent to the dies, the codeword modification module 2204 may modify the codeword, and program the modified codeword into the memory area. Additionally, when a read request is issued to read the codeword, the modified codeword may be re-configured into its original form by the codeword modification module 2404 before being sent off-chip to the controller 102. Other configurations may be possible. For example, codeword modification may be performed on the memory dies 104, but then the reconfiguring of the modified codeword into its original form may be performed in the controller 102, or vice versa. Various configurations may be possible.

Figure 25:
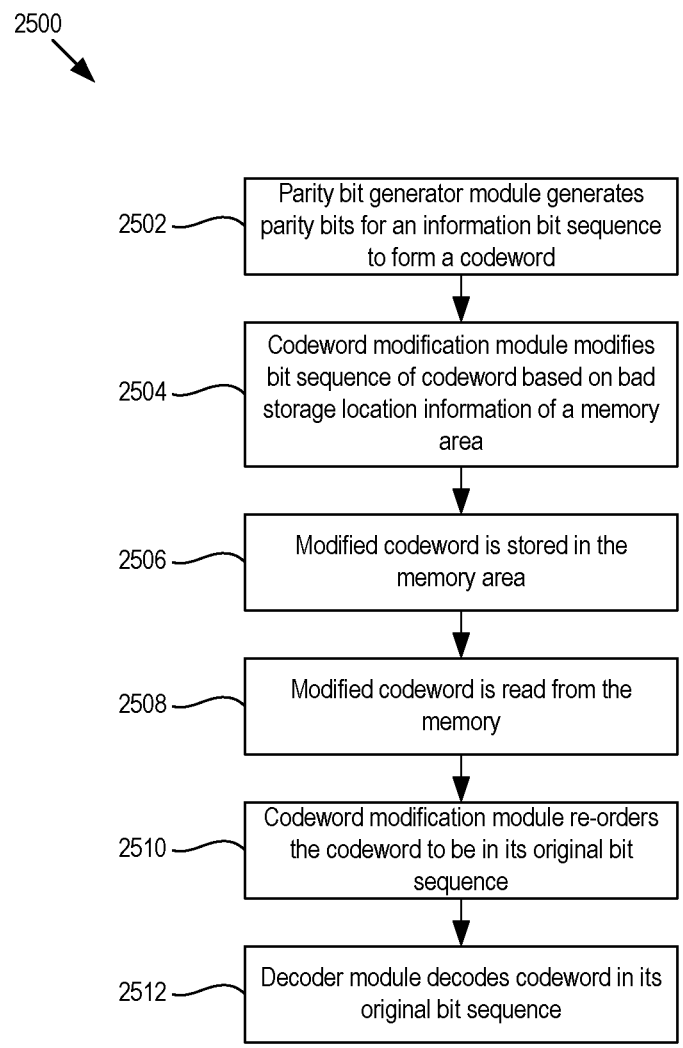
FIG. 25 is a flow chart of an example method of performing codeword modification based on bad storage location information.

FIG. 25 is a flow chart of an example method 2500 of performing codeword modification based on bad storage location information. At block 2502, the parity bit generator module 2402 may generate parity bits for an information bit sequence using a codebook to form a codeword. At block 2504, the codeword modification module 2404 may modify or re-order the bit sequence of the codeword based on bad storage location information of a memory area in which the codeword is to be stored. For example, the codeword modification module 2404 may swap bits based on numbers of bad variables connected to check nodes of the codebook used to generate the parity bits, based on numbers of bad variables participating in minimal cycles of the codebook used to generate the parity bits, or based on numbers or a distribution of bad storage locations across storage sub-units, as previously described.

In some example methods, the codeword modification module 2404 may be configured to identify the bad storage locations on the fly, such as by accessing the bad storage database 2406, as part of the encoding process. In other example methods, the codeword modification module 2404 may have identified the bad storage locations ahead of time and/or be pre-configured with a bit-order modification configuration that includes information indicating which bits to swap for a given memory area. For example, during a programming operation, the codeword modification module 2404 may be configured to identify the memory area in which the codeword is to be stored. Based on identifying the memory area, the codeword modification module may know which bits to swap without necessarily having to access the bad storage database 2406. In some example configurations, the pre-configuration may occur during a manufacturing phase of the memory system 100, during which the bad storage locations for each of the memory areas of the memory dies 104 may be identified. In turn, for one or more particular codebooks to be used to perform the encoding and decoding, bit swapping schemes (or bit-order modification configurations) may be identified for each of the memory areas. The codeword modification module 2404 may be configured with the bit swapping schemes. Then, during normal operation, the codeword modification module 2404 may be configured to identify which bits to swap based on the bit swapping schemes.

At block 2506, the modified codeword may be stored in the memory area. At block 2508, the modified codeword may be read from the memory area, such as in response to a host read request. At block 2510, the codeword modification module 2404 may re-order the modified codeword to be in its original bit sequence. At block 2512, the decoder module 2408 may decode the re-ordered codeword.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A bit-order modification method comprising:
    encoding, with at least one controller, a plurality of information bits using a codebook to generate an original codeword, wherein the plurality of information bits are to be programmed into a memory area of memory of a storage device, the memory area having an associated set of bad storage locations;
    modifying, with the at least one controller, the original codeword to generate a modified codeword by switching a bad bit of the original codeword with a good bit of the original codeword; and
    programming, with the at least one controller, the modified codeword into the memory area.

2. The bit order modification method of claim 1, wherein the bad bit of the original codeword corresponds to a check node that is one of a predetermined number of check nodes of the codebook connected to the most bad variable nodes of the codebook.

3. The bit order modification method of claim 1, wherein the bad bit of the original codeword corresponds to a check node of the codebook that is connected to a number of bad variable nodes exceeding a threshold or within a predetermined range.

4. The bit-order modification method of claim 1, wherein the bad bit of the original codeword corresponds to a variable node participating in a minimal cycle of the codebook that is one of a predetermined number of minimal cycles having the most participating bad variable nodes.

5. The bit-order modification method of claim 1, wherein the bad bit of the original codeword corresponds to a variable node participating in a minimal cycle of the codebook that is one of a predetermined number of minimal cycles having either the smallest difference between cycle length and number of participating bad variable nodes or the largest ratio of number of participating bad variable nodes to cycle length.

6. The bit order modification method of claim 1, wherein the bad bit of the original codeword corresponds to a variable node participating in a minimal cycle of the codebook that is one of a predetermined number of minimal cycles having either the smallest difference between number of participating bad variable nodes and total number of participating variable nodes or largest ratio of number of participating bad variable nodes to total number of participating variable nodes.

7. The bit order modification method of claim 1, wherein modifying the original codeword comprises switching good bits and bad bits across sub-codeword portions of the original codeword to generate the modified codeword, wherein the modified codeword comprises an equalized distribution of bad bits across sub-codeword portions of the modified codeword in response to the switching of good bits and bad bits.

8. The bit-order modification method of claim 1, wherein the plurality of different memory areas comprises different dies, different planes, different blocks, different pages, or different segments of the memory.

9. A bit re-ordering configuration method comprising:
    identifying, with at least one controller, bad storage location information of a memory area of a plurality of different memory areas of a memory of a storage device;

identifying, with the at least one controller, a codebook that the storage device is configured to use to encode a plurality of information bits to generate an original codeword;

generating, with the at least one controller, a bit-order modification configuration based on the bad storage location information of the memory area and the codebook; and configuring a bit order modification module of the storage device with the bit-order modification configuration, wherein the bit order modification module, upon being configured with the bit-order modification configuration, is configured to modify the original codeword to generate a modified codeword to be stored in the memory area according to the bit-order modification configuration.

10. The bit re-ordering configuration method of claim 9, further comprising:

identifying, with the at least one controller, a check node of the codebook based on numbers of bad variable nodes connected to check nodes of the codebook; and identifying, with the at least one controller, at least one bad bit of the original codeword to be stored in the memory area to switch with at least one good bit of the original codeword for the bit-order modification configuration based on the identified check node.

11. The bit re-ordering configuration method of claim 10, wherein selecting the check node is based on identifying, with the at least one controller, that the number of bad variable nodes connected to the check node exceeds a threshold number.

12. The bit re-ordering configuration method of claim 10, wherein selecting the check node is based on identifying, with the at least one controller, that the check node is one of a predetermined number of check nodes connected to the most bad variable nodes.

13. The bit re-ordering configuration method of claim 9, further comprising:

identifying, with the at least one controller, a bad variable node of the codebook based on numbers of bad variable nodes participating in minimal cycles of the codebook; and identifying, with the at least one controller, a bad bit of the original codeword to switch with a good bit of the original codeword, wherein the bad bit corresponds to the bad variable node.

14. The bit re-ordering configuration method of claim 13, further comprising:

identifying, with the at least one controller, a minimal cycle in which the bad variable node is participating, the identifying being based on a criterion associated with at least one of: a number of bad variable nodes participating in the minimal cycle, a length of the minimal cycle, or a total number of variable nodes participating in the minimal cycle.

15. The bit re-ordering configuration method of claim 9, wherein generating the bit-order modification configuration comprises identifying bad bits to switch with good bits across sub-codeword portions of the original codeword, wherein a result of the switching of the bad bits with the good bits provides an equalized distribution of bad bits across the sub-codeword portions.

16. The bit re-ordering configuration method of claim 9, wherein the plurality of different memory areas comprises different dies, different planes, different blocks, different pages, or different segments of the memory.

17. A storage device comprising:

a memory comprising a plurality of different memory areas; and a controller configured to:

generate a first original codeword using a codebook, the first original codeword comprising a first plurality of information bits to be stored in a first memory area of the plurality of different memory areas;

change a bit order of the first original codeword to generate a first modified codeword, wherein the bit order of the first original codeword is changed according to a first bit modification configuration corresponding to a first plurality of bad storage locations of the first memory area;

generate a second original codeword using the codebook, the second original codeword comprising a second plurality of information bits to be stored in a second memory area of the plurality of different memory areas;

change a bit order of the second original codeword to generate a second modified codeword, wherein the bit order of the second codeword is changed according to a second bit modification configuration corresponding to a second plurality of bad storage locations of the second memory area, and wherein the second bit modification configuration is different than the first bit modification configuration; and program the first modified codeword in the first memory area and the second modified codeword in the second memory area.

18. The storage device of claim 17, wherein the controller is configured to maintain a respective bit modification configuration for each memory area of the plurality of different memory areas of the memory.

19. The storage device of claim 17, wherein the plurality of different memory areas comprises different dies, different planes, different blocks, different pages, or different segments of the memory.

20. A storage device comprising:

a memory comprising a plurality of different memory areas;

means for generating a first original codeword using a codebook, the first original codeword comprising a first plurality of information bits to be stored in a first memory area of the plurality of different memory areas;

means for changing a bit order of the first original codeword to generate a first modified codeword, wherein the bit order of the first original codeword is changed according to a first bit modification configuration corresponding to a first plurality of bad storage locations of the first memory area;

means for generating a second original codeword using the codebook, the second original codeword comprising a second plurality of information bits to be stored in a second memory area of the plurality of different memory areas;

means for changing a bit order of the second original codeword to generate a second modified codeword, wherein the bit order of the second original codeword is changed according to a second bit modification configuration corresponding to a second plurality of bad storage locations of the second memory area, and wherein the second bit modification configuration is different than the first bit modification configuration; and means for programming the first modified codeword in the first memory area and the second modified codeword in the second memory area.

\* \* \* \* \*